US012665562B2

(12) United States Patent
Chandrahalim et al.

(10) Patent No.: US 12,665,562 B2
(45) Date of Patent: Jun. 23, 2026

(54) ION IRRADIATION OF MICROELECTROMECHANICAL RESONATORS

(71) Applicant: The Government of the United States, as represented by the Secretary of the Air Force, Wright-Patterson AFB, OH (US)

(72) Inventors: Hengky Chandrahalim, Beavercreek, OH (US); David Lynes, Wright-Patterson AFB, OH (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 54 days.

(21) Appl. No.: 18/584,112

(22) Filed: Feb. 22, 2024

(65) Prior Publication Data

US 2024/0297630 A1     Sep. 5, 2024

Related U.S. Application Data

(60) Provisional application No. 63/486,312, filed on Feb. 22, 2023.

(51) Int. Cl.
| | |
|---|---|
| *H03H 3/007* | (2006.01) |
| *H03H 3/02* | (2006.01) |
| *H03H 9/48* | (2006.01) |

(52) U.S. Cl.
CPC ............ *H03H 3/0072* (2013.01); *H03H 9/48* (2013.01); *H03H 2003/027* (2013.01)

(58) Field of Classification Search
CPC ... H03H 3/0072; H03H 9/48; H03H 2003/027
USPC ......................................................... 333/186
See application file for complete search history.

(56) References Cited

U.S. PATENT DOCUMENTS

| | | |
|---|---|---|
| 8,390,398 B2 | 3/2013 | Chandrahalim |
| 2009/0322448 A1* | 12/2009 | Bhave ..................... H01P 1/203 |
| | | 333/186 |

OTHER PUBLICATIONS

H. Chandrahalim et al., "High-k dielectrically transduced MEMS thickness shear mode resonators and tunable channel-select RF filters," Sensors and Actuators A, vol. 136 (2007) 527-539.
H. Chandrahalim et al., "A $Pb(Zr_{0.55}Ti_{0.45})O_3$-Transduced Fully Differential Mechanically Coupled Frequency Agile Filter", IEEE Electron Device Letters, vol. 30/12 (2009) 1296-1298.

(Continued)

*Primary Examiner* — Jorge L Salazar, Jr.

(74) *Attorney, Agent, or Firm* — AFMCLO/JAZ; Eugene P. Sunday

(57) ABSTRACT

A method of enhancing an electromechanical coupling coefficient of a microelectromechanical ("MEMS") device. The method includes applying, to a fully fabricated MEMS device, heavy particle ion radiation to the MEMS device at a fluence of at least $1\times10^{14}$ cm$^{-2}$. According to other embodiments of the present invention are directed to a bandpass filter comprising a plurality of MEMS devices fabricated in accordance with the methods provided. The MEMS of the plurality are electronically or mechanically coupled.

11 Claims, 49 Drawing Sheets

(56) References Cited

OTHER PUBLICATIONS

A. Bashir et al., "High performance zinc oxide transistors and circuits fabricated by spray pyrolysis in ambient atmosphere," Adv. Mater., vol. 21 (2009) 2226-2231.

V. Belwanshi et al., "Gamma radiation induced effects on the performance of piezoresistive pressure sensors fabricated using different technologies," IEEE Trans. Nuc. Sci., vol. 66/9 (2019) 2055-2062.

S. Bhattacharya et al., "A fully differential SOI-MEMS Thermal pizoresistive ring oscillator in liquid environment intended for mass sensing," IEEE Sens. J., vol. 19/17 (2019) 7261-7268.

X. Bian et al., "UV sensing using film bulk acoustic rsonators based on Au/n-ZnO/piezoelectric-ZnO/Al structure," Sci. Rep., vol. 5 (2015) 912, 5 pages total.

H. Chandrahalim et al., "Performanc comparison of Pb(Zr0.52Ti0.48)O3-only and Pb(Zr0.52Ti048)O3-on silicon resonators," Appl. Phys. Lett., vol. 93 (2008) 233504, 4 pages total.

H. Chandrahalim et al., "PZT transduced high-overtone width-extensional resonators above 1 GHz," IEEE Int'l Ultrason Symp Proc. (2009) 2145-2148.

H. Chen et al., "Probing heavy ion radiation effects in silicon carbide (SiC) via 3D integrated multimode vibrating diagrams," Appl. Phys. Lett. vol. 114 (2019) 101901, 6 pages total.

G. Chen et al., "Aluminum nitride combined overtone resonators for the 5G high frequency bands," J. Microelectromech. Syst., vol. 19/2 (2020) 148-159.

C-C. Chu et al., "Thermal-piezoresistive SOI-MEMS oscillators based on a fully differential mechanically coupled resonator array for mass sensing applications," J. Microelectromech. Syst., vol. 17/1 (2018) 59-72.

R. Cross et al., "Investigating the stability of zinc oxide thin film transistors," Appl. Phys. Lett., vol. 38 (2006) 263513, 4 pages total.

A. Crunteanu et al., "Gamma radiation effects on FR MEMS capacitive switches," Microelect. Rel., vol. 46 (2006) 1741-1746.

J. Custer et al., "Denisty of amorphous Si," Appl. Phys. Lett., vol. 64 (1994) 437-439.

A. Gao et al., "AIN MEMS filters with extremely high bandwidth widening capability," Microsyst. Nanoeng., vol. 6/74 (2020) 12 pages total.

P. Gkotsis et al., "Neutron and gamma radiation effects on MEMS structures," Procedia Eng., vol. 25 (2011) 172-175.

L. Hackett et al., "Towards single-chip radiofrequency signal processing via acoustic electron-phonon interactions," vol. 12/1 2769, 11 pages total.

A. Hammoud et al., "Electron radiation effects on the electrical and mechanical properties of polypropylene," IEEE Trans on Nucl. Sci., vol. NS-34/6 (1987) 1822-1826.

M. Hodjat-Shamami et al., "Eigenmode operation of piezoelectric resonant gyroscopes," Microsyst. Nanoeng., vol. 6/108 (2020) 11 pages total.

M. Hopcroft et al., "What is the Young's Modulus of Silicon?" J. Microelectromech. Syst., vol. 19/2 (2010) 229-238.

H. Kim et al., "AIN single crystal accelerometer for nuclear power plants," IEEE Trans. Ind. Elect., vol. 68/6 (2021) 5346-5354.

G. H. Kinchin et al., "The displacement of atoms in solids by radiation," Rep Prog. Phys, vol. 18/1 (1955) 52 pages total.

A. R. Knudson et al., IEEE Trans Nuc. Sci., vol. 43/6 (1996) 3122-3126.

J. Lee et al., "Effects of gamma-ray radiation on two-dimensional molybdenum disulfide (MoS2) nanomechanical resonators," Appl. Phys. Lett., vol. 108 (2016) 023106, 6 pages total.

J-T Lin et al., "Impact of x-ray radiation on GaN/AIN MEMS structure and GaN HEMT gauge factor response," IEEE 33rd Int'l Conf. MEMS (2020) 4 pages total.

S. Logan, "The origin and status of the Arrhenius Equation," J. Chem. Ed., vol. 59/4 (1982) 279-281.

D. D. Lynes et al., "Effects of gamma ray radiation on the performance of microelectromechanical resonators," Adv. Eng. Mater., vol. 25 (2023) 2201837, 10 pages total.

D. D. Lynes et al., "Influence of a tailored oxide interface on the quality factor of microelectromechanical resonators," Adv. Mater. Interfaces, vol. 10 (2023) 2202446, 11 pages total.

F. Maita et al., "Ultraflexible tactile piezoelectric sensor based on low-temperature polycrystalline silicon thin-film transistor technology," IEEE Sens. J., vol. 15/7 (2015) 3819-3826.

H. Mansoorzare et al., "A piezo-capacitive high-frequency resonant accelerator," IEEE Int'l Ultrason Symp (2020) 4 pages total . . . .

K. Obitani et al., "Pizoelectric disk gyroscope fabricated with single-crystal lithium niobate," IEEE Microelectromech. Syst., vol. 30/3 (2021) 384-391.

D. Park et al., "Self-powered real-time arterial pulse monitoring using ultrathin epidermal piezoelectric sensors," Adv. Mater., vol. 29 (2017) 1702308, 9 pages total.

J. Park et al., "Chiral trabeated metabeam for low-frequency multimode wave mitigation via dual-bandgap mechanism," Comm Phys., vol. 5/194 (2022) 12 pages total.

D. Parks et al., "Radiation tolerance of piezoelectric bulk single-crystal aluminum nitride," IEEE Trans Ultrason, Ferroelec, Freq Control, vol. 61/7 (2014) 1216-1222.

S. Patton et al., "Effect of space radiation on the leakage current of MEMS insulators," IEEE Trans Nucl Sci., vol. 60/4 (2013) 3074-3083.

G. Piazza et al., "Piezoelectric aluminum nitride vibrating contour-mode MEMS resonators," J. Microelectromech Syst., vol. 15/6 (2006) 1406-1418.

G. Piazza et al., "Single-chip multiple-frequency ALN MEMS filters based on contour-mode piezoelectric resonators," J. Microelectromech Sys., vol. 16/2 (2007) 319-328.

G. Pillai et al., "Piezoelectric MEMS resonators: a review," IEEE Sensors J., vol. 21/11 (2021) 12589-12605.

R. Pinto et al., "CMOS-Integrated aluminum nitride MEMS: a review," J. Microelectromech Syst., vol. 31/4 (2022) 500-523.

M. Rinaldi et al., "Super-high-frequency two-port AIN contour-mode resonators for RF applications," IEEE Trans Ultrason, Ferroelect, Freq Control, vol. 57/1 (2010) 38-45.

J. Rodriguez et al., "Direct detection of Akhiezer damping in a silison MEMS resonator," Sci Rep., vol. 9/92244 (2019) 11 pages total.

X. Rui et al., "Design an dexperimental study of a piezoelectric energy harvester in automotive spokes," J Phys. D: Appl. Phys., vol. 52 355501 (2019) 12 pages total.

Y. Seo et al., "Piezoelectric pressure sensors for hypersonic flow measurements," J Microelectromech Syst., vol. 28/2 (2019) 271-278.

S. Shahraini et al., "Thickness-lame thin-film piezoelectric-on-silicon resonators," J. Microelectromech Syst., vol. 29/3 (2020) 296-305.

H. Shea, "Radiation sensitivity of microelectromechanical system devices," J. Micro/Nanlith MEMS MOEMS, vol. 8/3 (2009) 031303, 11 pages total.

G. Smith et al., "PZT-based piezoelectric MEMS technology," J. Am Ceram. Soc., vol. 95/6 (2012) 1777-1792.

H. Song et al., "Piezoelectric energy harvesting design principles for materials and structures: material figure-of-merit and self-resonance tuning," Adv. Mater., vol. 32 (2020) 2002208, 34 pages total.

W. Sui et al., "Effects of ion-induced displacement damage on GaN/AIN MEMS resonators," IEEE Trans on Nucl Sci, vol. 69/1 (2002) 216-224.

NASA, Solar Cell Radiation Handbook, JPL Pub 82-69 (1982) 412 pages total.

L. Wang et al, "Radiation effects on mechanical characteristics of MEMS," IEEE Proc 16 IPFA (2009) 4 pages total.

J. Wang et al, "A film bulk acoustic resonator based on ferroelectric aluminum scandium nitride films," J. Microelectromech Syst., vol. 29/5 (2020) 741-747.

Y. Wang et al., "A piezoelectric sensor network with shared signal transmission wires for structural health monitoring of aircraft smart skin," Mech Syst Sig Proc., vol. 141 (2020) 1063730, 9 pages total.

K. Yasumura et al., "Quality factors in micron- and submicron-thick cantilevers," J. Microelectromech Syst., vol. 9/1 (2000) 117-125.

(56) References Cited

OTHER PUBLICATIONS

Z. Yi et al., "Piezoelectric dynamics of arterial pulse for wearable continuous blood pressure monitoring," Adv. Mater., vol. 34 (2022) 2110291, 11 pages total.

T. Zhang et al., "Piezoeelctric ultrasound energy-harvesting device for deep brain stimulation and analgesia applications," Sci Adv., vol. 8 eabk0159 (2022) 11 pages total.

Q. Zhao et al., "Fast moving piezoelectric micro-robotic fish with double caudal fins," Rob Auto Syst, vol. 140 (2021) 103733, 9 pages total.

H. Chandrahalim et al., "Method of Reducing Acoustic Energy Losses in Standing Wave Microelectromechanical Resonators Using Thin Dielectric Films," U.S. Appl. No. 18/503,804, filed Nov. 7, 2023.

H. Chandrahalim et al., "Method for Altering the Performance of Microelectromechanical Resonators," U.S. Appl. No. 18/503,819, filed Nov. 7, 2023.

H. Chandrahalim et al., "Digitally-tunable MEMS filter using mechanically-coupled resonator array," IEEE Int'l Conf on Microelectromech Syst. (2008) 4 pages total.

H. Chandrahalim et al., "PZT transduction of high-overtone contour-mode resonators," IEEE Trans Ultrason Ferrorelct Freq Control, vol. 57/9 (2010) 2035-2041.

* cited by examiner

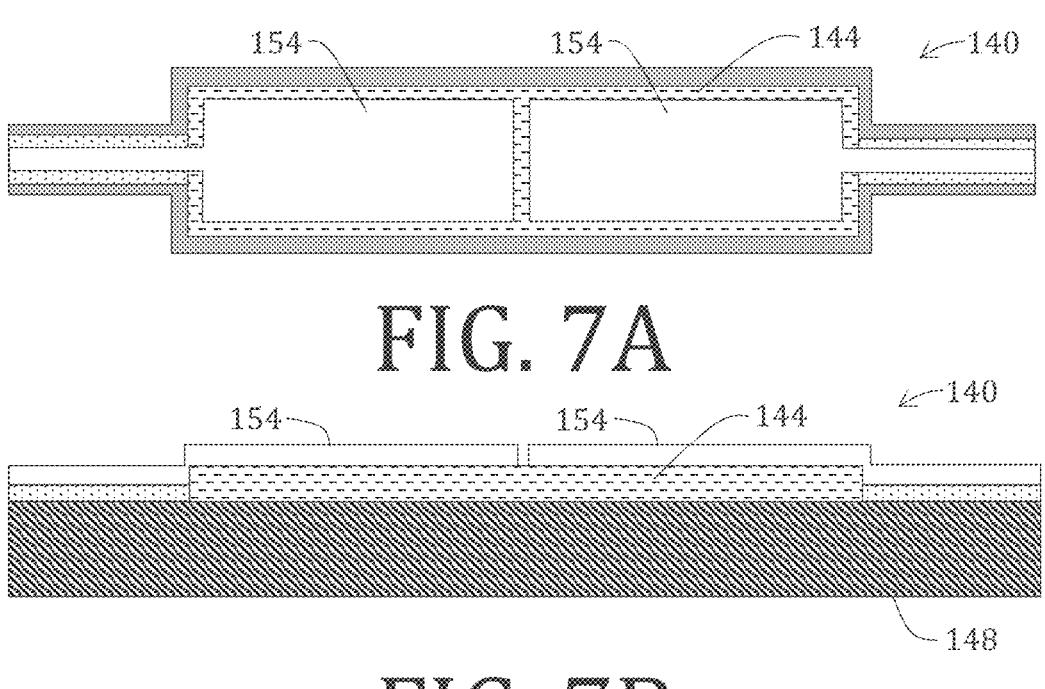
FIG. 7A
FIG. 7B
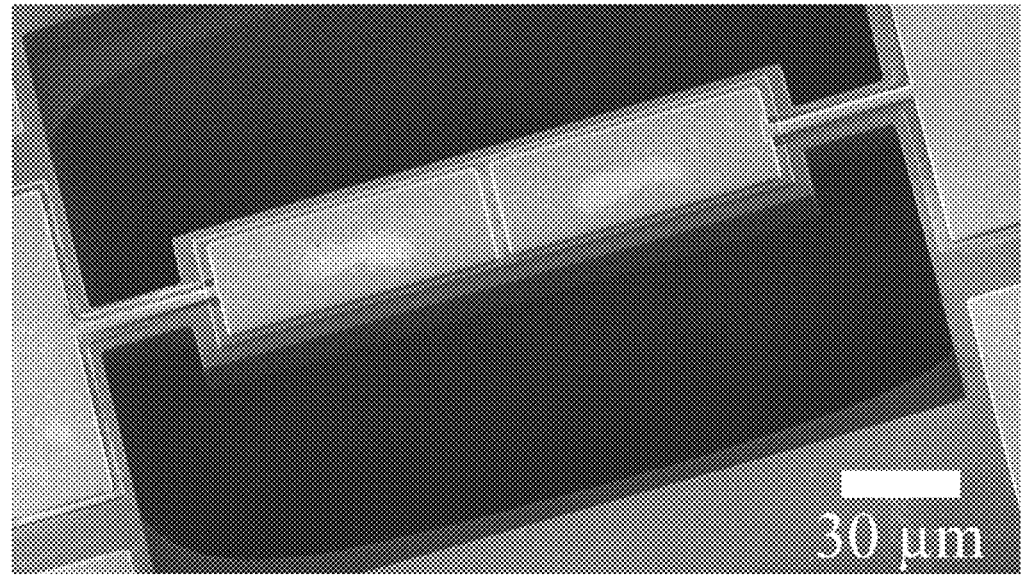
FIG. 7C

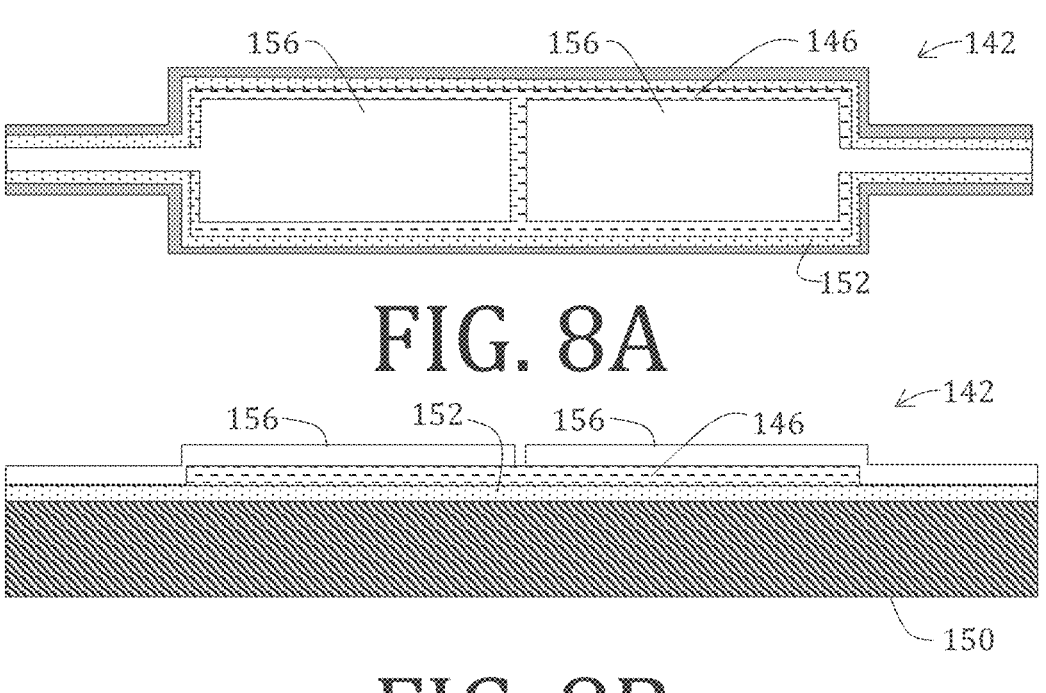
FIG. 8A
FIG. 8B
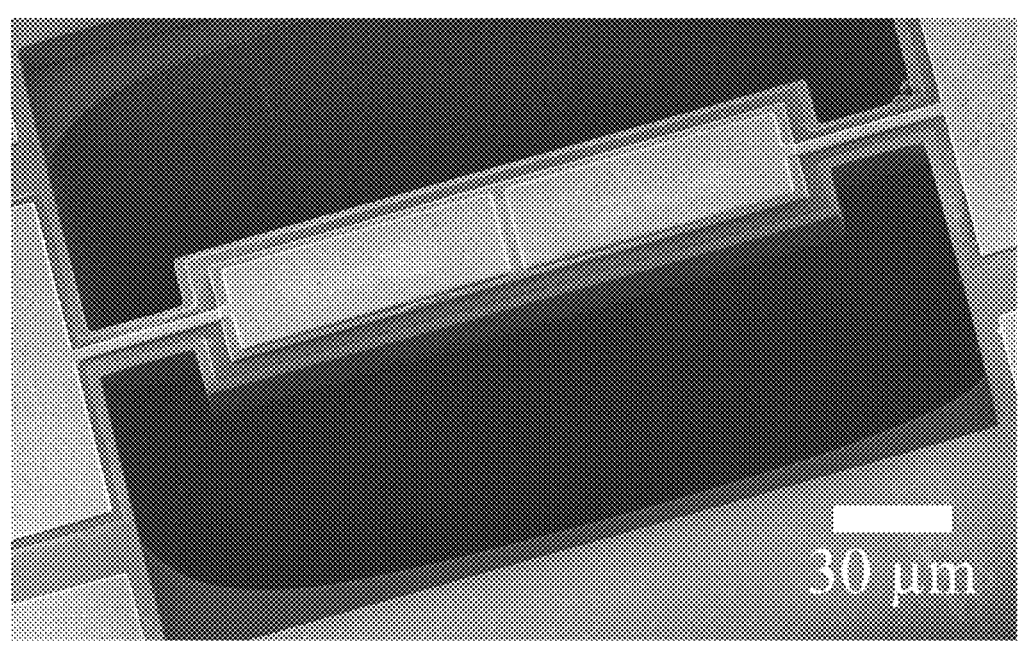
FIG. 8C

Irradiated n-Si

FIG. 25A
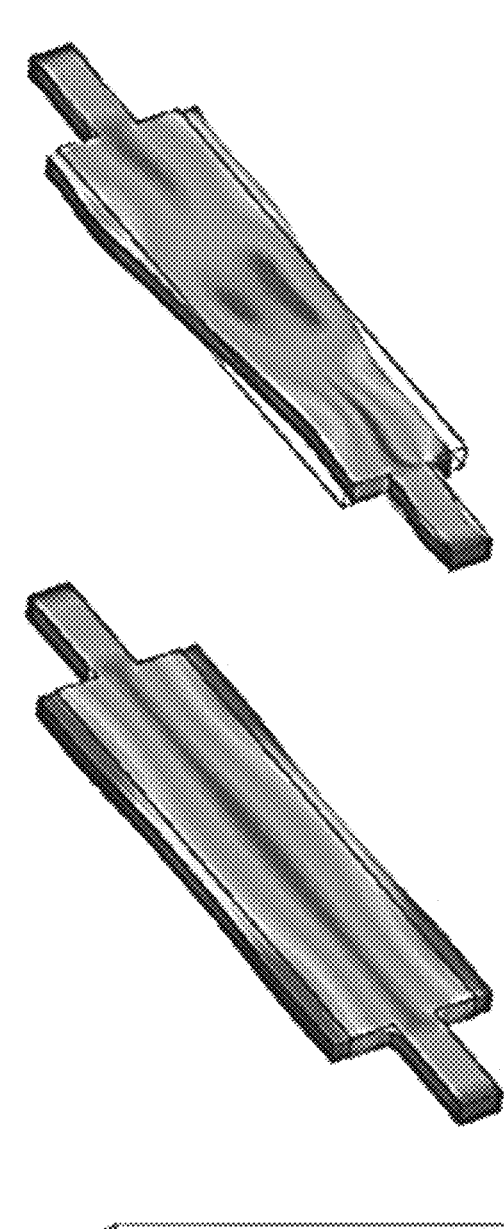
FIG. 25B
FIG. 25C
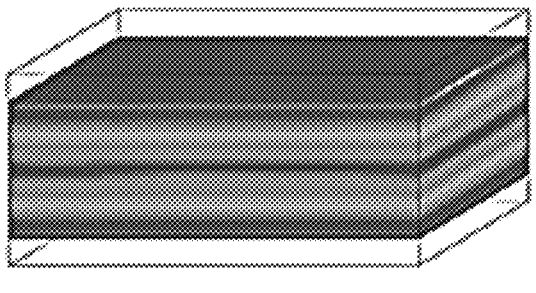

ION IRRADIATION OF MICROELECTROMECHANICAL RESONATORS

Pursuant to 37 C.F.R. § 1.78(a)(4), this application claims the benefit of and priority to prior filed Provisional Application Ser. No. 63/486,312, filed Feb. 22, 2023, which is expressly incorporated herein by reference in its entirety.

RIGHTS OF THE GOVERNMENT

The invention described herein may be manufactured and used by or for the Government of the United States for all governmental purposes without the payment of any royalty.

FIELD OF THE INVENTION

The present invention relates generally to Microelectromechanical system (MEMS) resonators and the irradiation interactions therewith.

BACKGROUND OF THE INVENTION

Over the past 60 years, considerable research has gone into the effects of radiation on MOS (metal-oxide-semiconductor) devices; well-established theory and experimental data exist that describe MOS device behavior in a radiation environment. However, due to the immaturity of the MEMS (microelectromechanical systems) field and the vast range of materials, technologies, and applications, no universally accepted test procedure or characterization standard exists for the effects of radiation on MEMS. MEMS acoustic resonators have many uses, from radio frequency ("RF") resonators, filters, and electronic oscillators to inertial sensing and environmental monitoring. The large variety of device designs facilitates using MEMS resonators in applications such as energy harvesting, signal processing, health, robotics, defense, and aerospace. In general, MEMS sensors and filters have very low mass, power consumption, and smaller footprint than their bulk circuit component equivalents.

Early radiation effects research efforts on MEMS focused on commercial-off-the-shelf ("COTS") accelerometers. Some conventional work has measured the performance of piezoelectric sensors in neutron and gamma environments, the effects of space radiation on MEMS insulators, gamma radiation effects on piezoresistive pressure sensors, accelerometer performance in nuclear reactors, and changes in the mechanical characteristics. Aluminum nitride, AlN, is especially attractive as a transduction material for MEMS resonators. AlN can be integrated into the complementary metal-oxide-semiconductor ("CMOS") fabrication process, maintaining the majority of its bulk physical, thermal, and electrical properties even as a thin film. AlN largely retains its bulk physical, thermal, and electric properties as a thin film. Furthermore, AlN may be doped with other elements, such as scandium, to increase electromechanical coupling or to add ferroelectric behavior while maintaining a high quality, Q, factor. The low temperature requirement (less than 400° C.) for the sputtering deposition of AlN makes it an ideal choice for CMOS-integrated transducers. Another advantage of AlN is that it does not contaminate the cleanroom environment or equipment (unlike lead zirconate titanate, also known as PZT, due to its lead content) and it does not require a post-deposition poling step. AlN has been utilized in energy harvesters, actuators, RF filters, duplexers, and accelerometers as a piezoelectric transducer. AlN has also been successfully implemented as part of the gate dielectric in thin film transistors ("TFT"). The influence of X-ray radiation on the gauge factors of statically suspended GaN/AlN beams has also been reported. The integration of CMOS and MEMS devices on a single chip reduces die size, power consumption, and manufacturing costs.

Largely due to their small size and low power consumption, these devices are seen as well suited for aerospace and power applications. Piezoelectric accelerometers used in inertial sensors for air and spacecraft navigation systems are subject to extreme vibration and loading. Resonant devices in spacecraft communication systems are subject to large temperature fluctuations (−230° C. to +180° C.) and a wide range of radiations (electron, proton, neutron, and electromagnetic). Piezoelectric sensors used for temperature and vibration monitoring in nuclear reactors are exposed to extreme gamma and neutron radiation. Significant research has gone into demonstrating these devices maintain functionality these in harsh thermal, pressure, and radiation environments.

In many applications, it is most important that the piezoelectrically transduced resonant devices have extremely high Q. A narrower bandwidth at resonance enables a higher sensitivity and resolution for precision sensing tasks. High Q resonant devices have a lower loss for signal processing and energy harvesting. Lower loss results in a strong signal in RF processing and higher output in energy harvesting applications. In general, the lower Q the resonator has, the higher the system noise and interference. Q enhancement has focused on reducing both intrinsic losses from material and resonator dimensions and extrinsic losses such as support and air/fluid losses. Enhancement methods include the use of phononic crystals, dispersion-engineered resonators, support transducer topologies, micromachined reflectors, and doping.

Aerospace and power systems' sensors, signal processors, and energy harvesters require high sensitivity, high resolution, and low loss. As these devices are exposed to harsh vibration, thermal, and radiation environments, their properties can be altered or degraded. Establishing device resiliency and performance in a radiation environment is a critical tool for engineers in the system design process. Heavy-charged particle radiation can be defined as irradiation with any particle heavier than a proton. In the natural space environment, high energy heavy ions manifest as cosmic rays or may originate from solar flares. Alpha particles and other heavy secondary particles also result from nuclear reactions caused by astrophysical processes. Analogous heavy charged particle radiation might be generated in a laboratory environment. For radiation testing, heavy ion irradiation can be used to extrapolate the damage caused by protons or neutrons found in space or nuclear reactors to high damage levels (ranging from 0.1 dpa to 100 dpa) with a much lower particle fluence.

Heavy ion irradiation deposits its energy into materials via non-ionizing energy loss ("NIEL") and ionization. NIEL is the transfer of momentum from the radiated particle to the atomic nuclei of the material, which can result in atoms being moved from their resting position in the lattice, leaving vacancies and creating interstitial defects. These defects can modify the mechanical and electrical properties of the material. Displacement damage has been shown to alter the diffusion lengths and minority-carrier lifetimes in crystalline silicon. Furthermore, the amorphization of crystalline silicon decreases its mass density and elastic modulus. Ionization results in the generation of electron-hole pairs ("EHP"). Depending upon the material, this can increase material conductivity or trap charges causing localized electric fields. Previous work has shown that AlN on silicon (AlN-on-Si) and AlN on silicon dioxide on silicon (AlN—$SiO_2$—Si)-based BAW (bulk acoustic wave) resonators are strongly resistant to the effects of EHP generation compared to electrostatic or capacitive MEMS, where charge accumulation effects dominate.

There remains a need to better understand and to utilize the effects of EHP in MEMS and like devices.

SUMMARY OF THE INVENTION

The present invention overcomes the foregoing problems and other shortcomings, drawbacks, and challenges of understanding changes in MEMS behavior after irradiation. This includes methods of utilizing irradiation to enhance one ore more properties of the resonator.

While the invention will be described in connection with certain embodiments, it will be understood that the invention is not limited to these embodiments. To the contrary, this invention includes all alternatives, modifications, and equivalents as may be included within the spirit and scope of the present invention.

According to one embodiment of the present invention includes a method of enhancing an electromechanical coupling coefficient of a microelectromechanical ("MEMS") device. The method includes applying, to a fully fabricated MEMS device, heavy particle ion radiation to the MEMS device at a fluence of at least $1 \times 10^{14}$ $cm^{-2}$.

Yet another embodiment of the present invention is directed to a bandpass filter comprising a plurality of MEMS devices fabricated and the subject to heavy particle ion radiation to the MEMS device at a fluence of at least $1 \times 10^{14}$ $cm^{-2}$. The MEMS of the plurality are electronically or mechanically coupled.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

FIGS. 7A and 8A are top views of resonators according to two embodiments of the present invention.

FIGS. 7B and 8B are cross sectional view of FIGS. 7A and 8A, respectively.

FIGS. 7C and 8C are colorized scanning electron microscope ("SEM") images of the resonators of FIGS. 7A and 8A, respectively.

FIGS. 13A-3D graphically illustrate the measured fractional shifts for the fundamental frequency, the motional resistance, the quality factor, and the electromechanical coupling coefficient, respectively, for the resonators of FIGS. 7A and 8A irradiated with 2 MeV $Si^+$ ions.

FIGS. 25A and 26A illustrate, qualitatively, exemplary motion for the second contour mode ("CM") for the resonators of FIGS. 7A and 8A, respectively.

FIGS. 25B and 26B illustrate, qualitatively, exemplary motion for the first width extensional mode ("WEM") for the resonators of FIGS. 7A and 8A, respectively.

FIGS. 25C and 26C illustrate, qualitatively, exemplary motion for the thickness mode ("TM") for the resonators of FIGS. 7A and 8A, respectively.

Figure 7D:
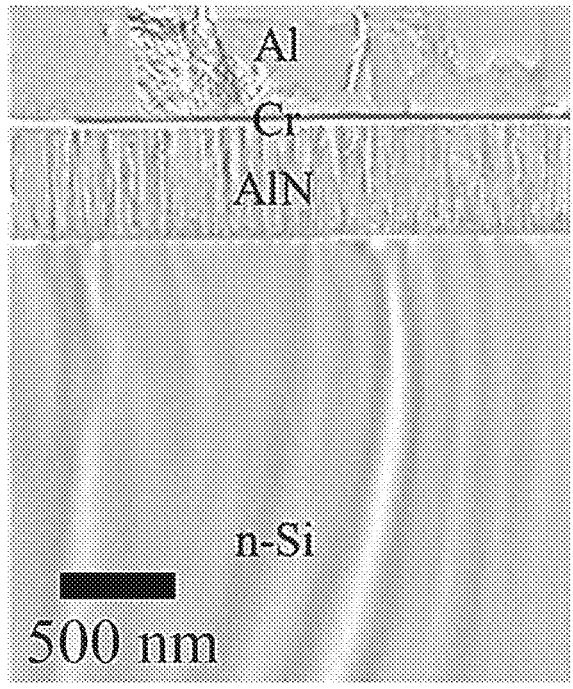
FIGS. 7D and 8D are cross sectional SEM images of the resonators of FIGS. 5A and 6A, respectively.

respectively, for the first WEM vibration of the resonators of FIG. 7A (data represented with "x") and 8A (data represented with "•").

FIGS. 34A-34D graphically illustrate the TCF, Rm, Q, and $$k_{eff}^2,$$

respectively, for the second CM vibration of the resonators of FIG. 7A (data represented with "x") and 8A (data represented with "•").

Figure 8D:
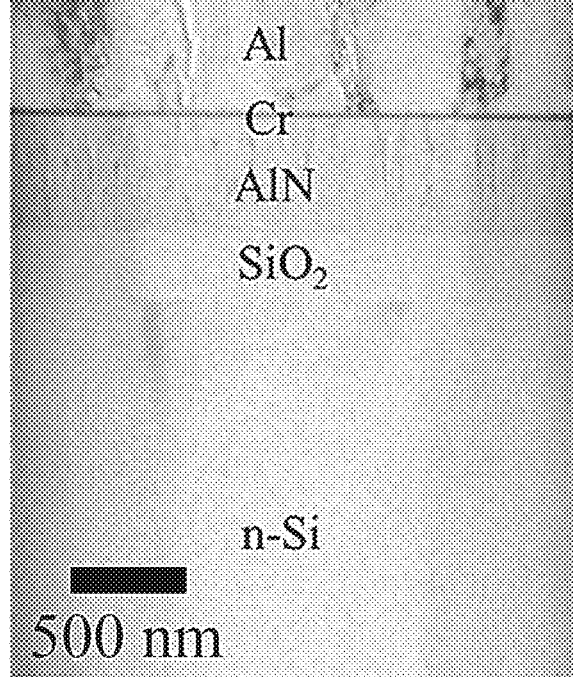
Figure 35A:
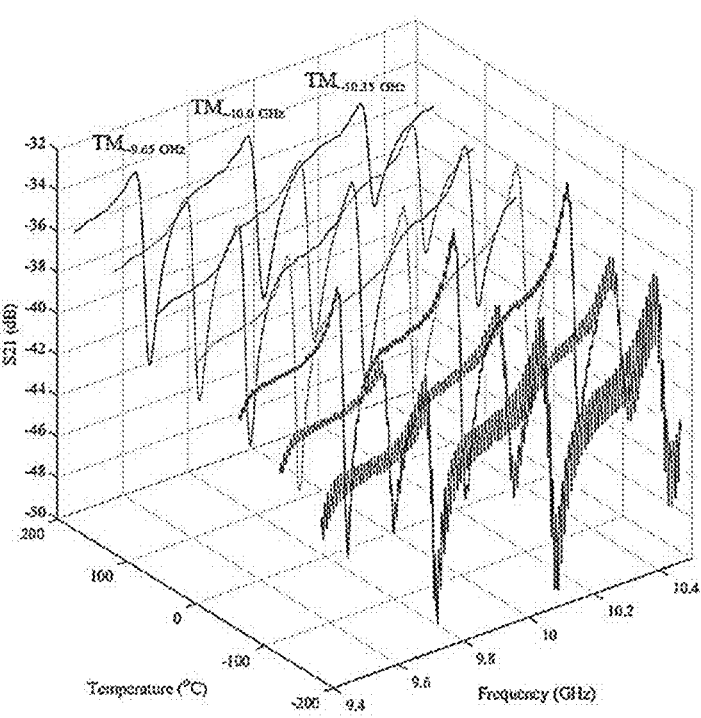
Figure 35B:
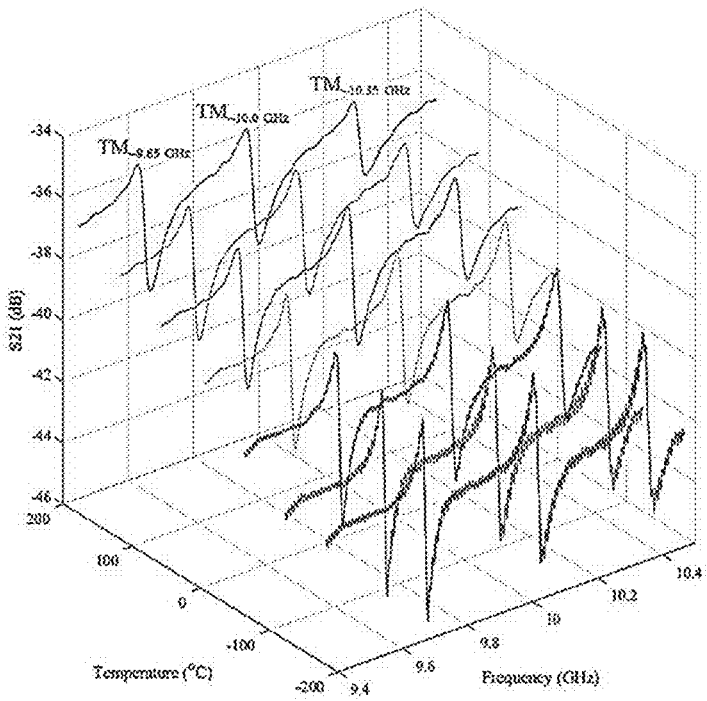
Figure 36A:
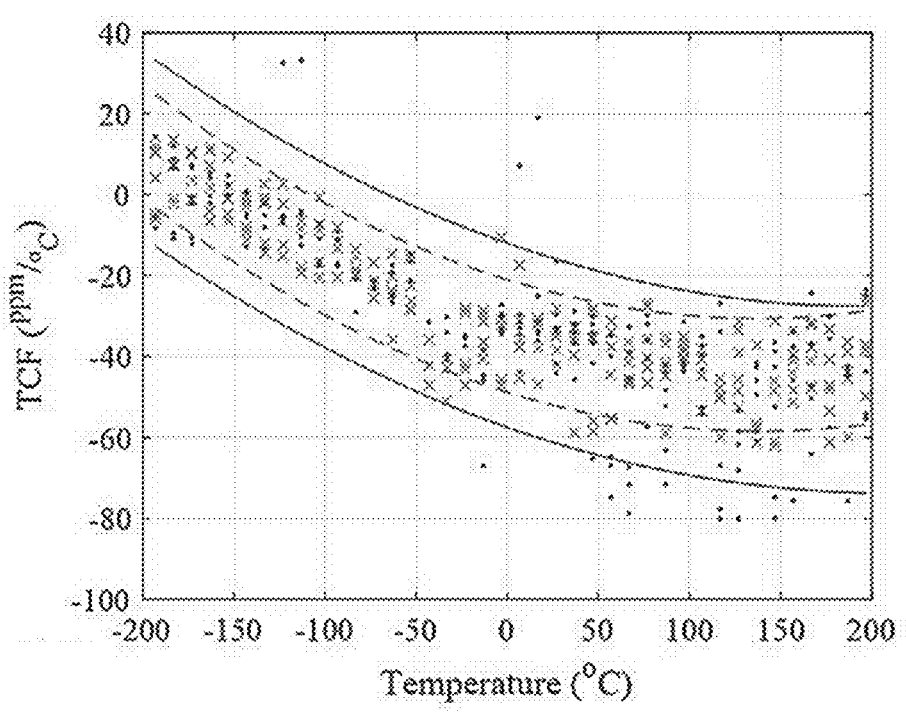
Figure 36B:
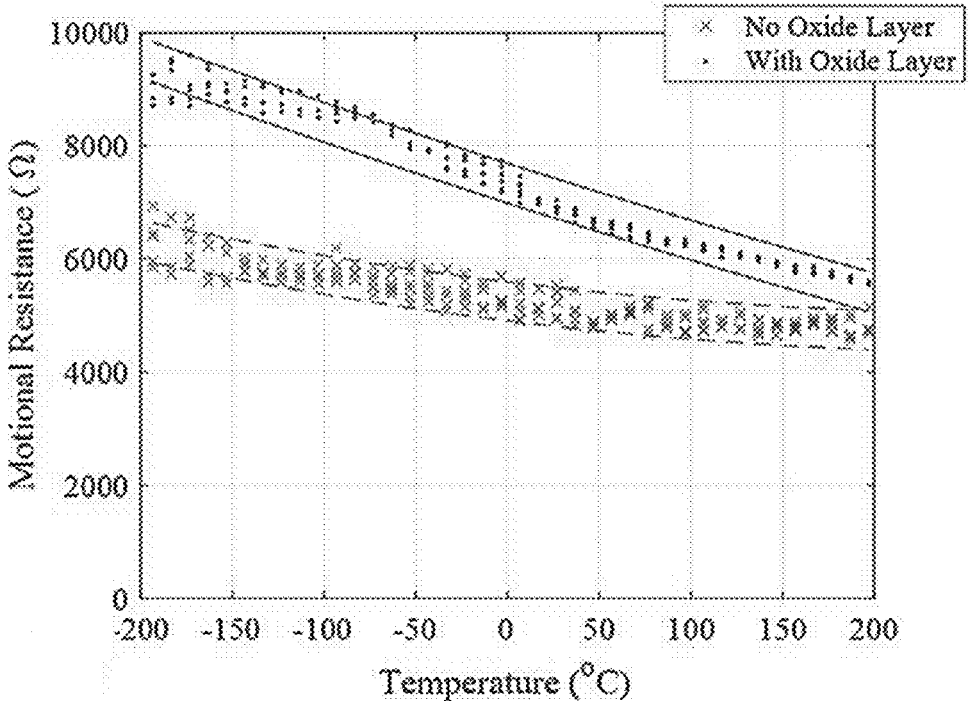
Figure 36C:
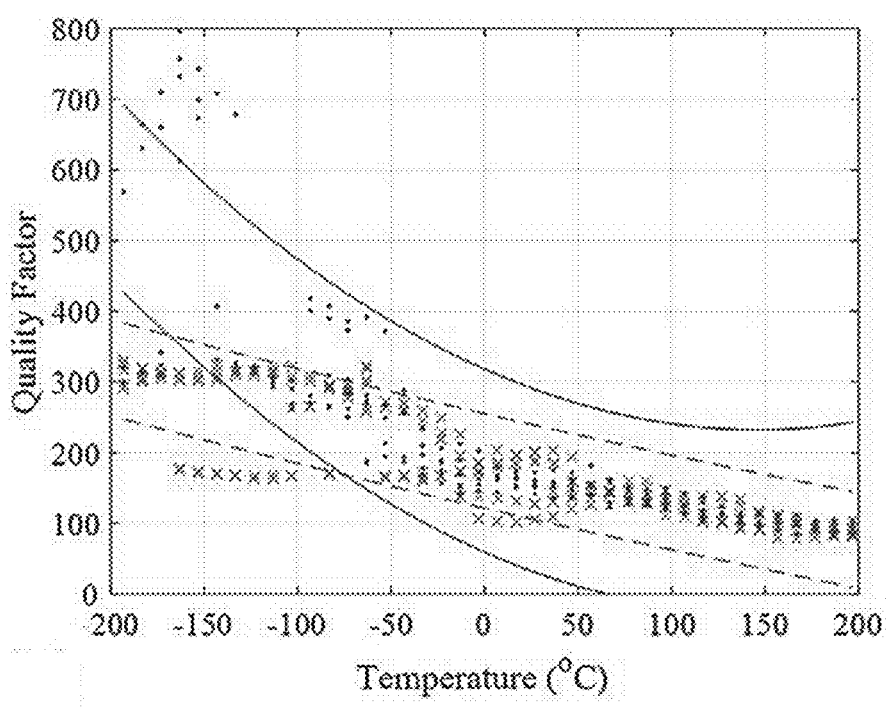
Figure 36D:
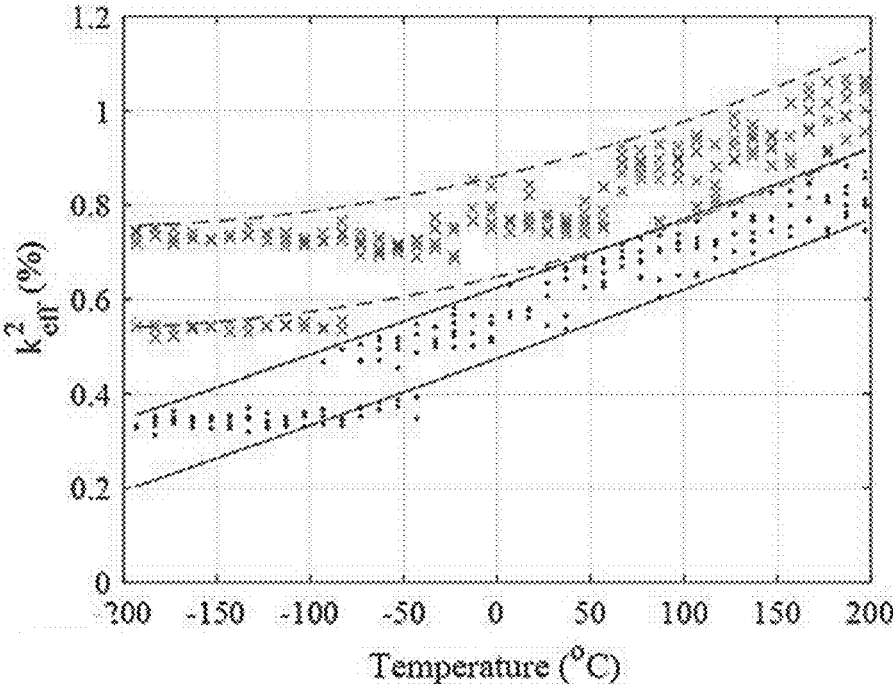
Figure 37A:
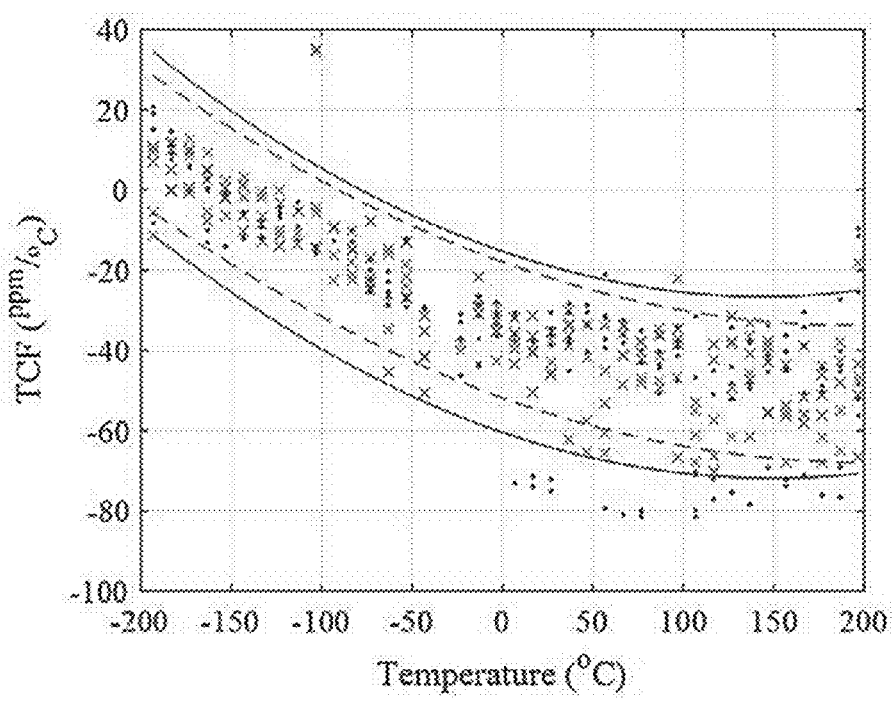
Figure 37B:
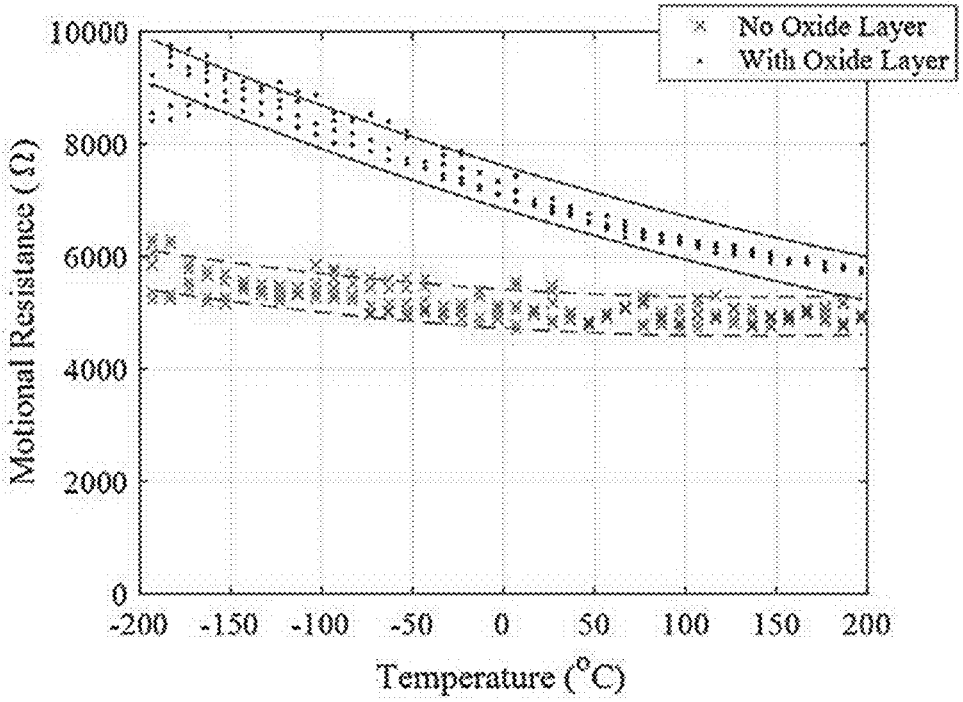
Figure 37C:
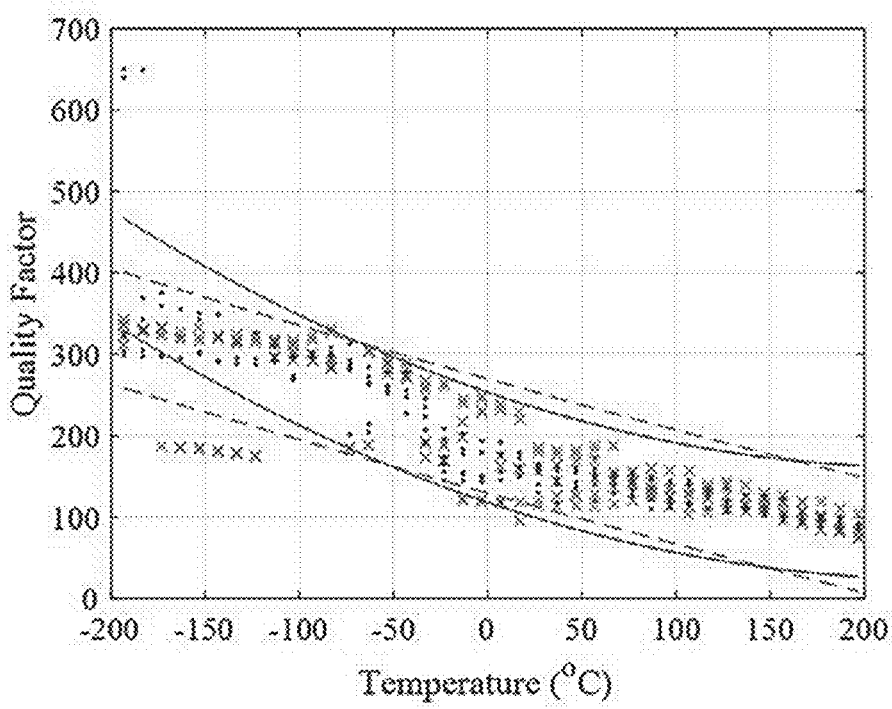
Figure 37D:
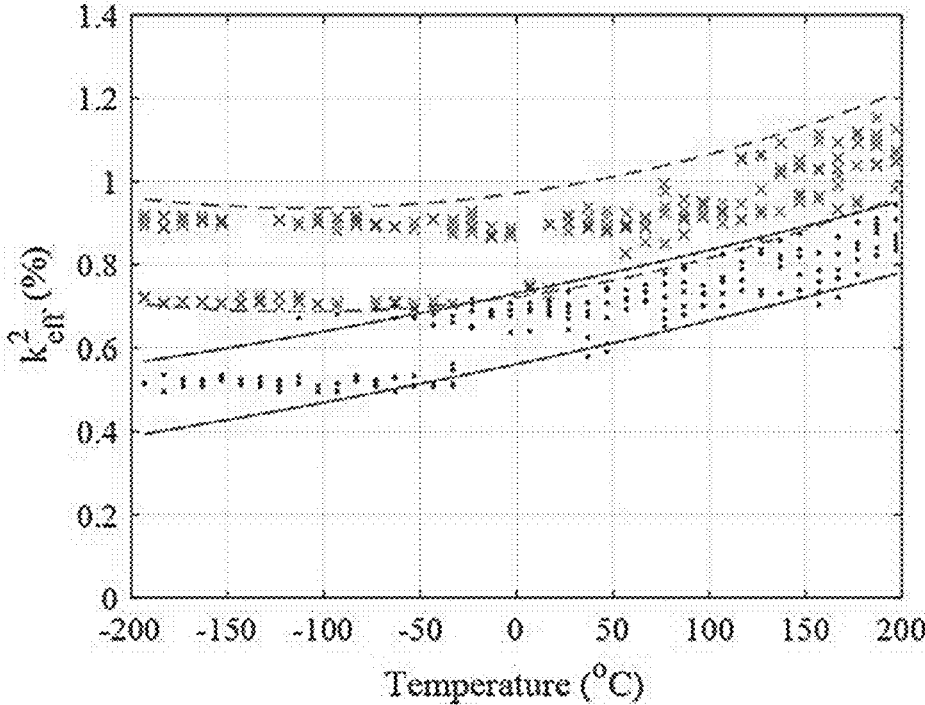
Figure 38A:
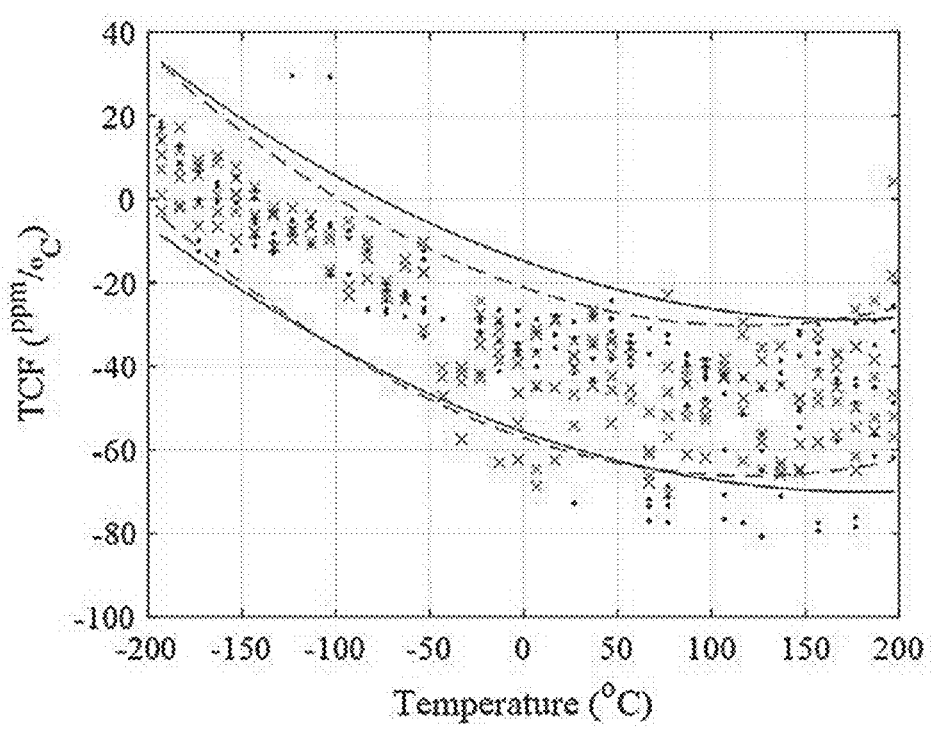
Figure 38B:
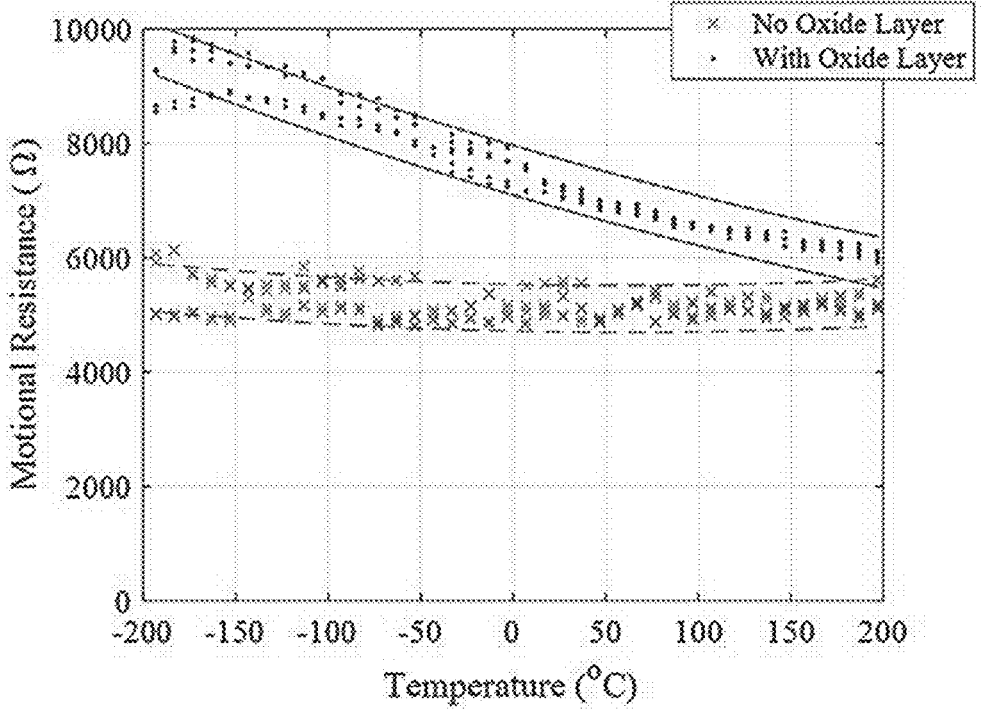
Figure 38C:
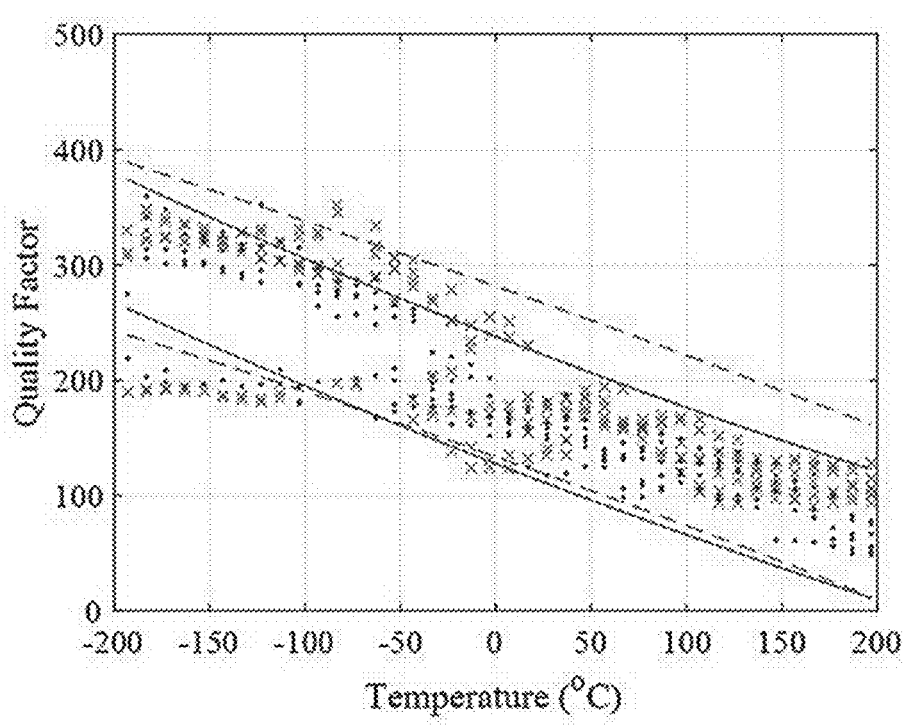
Figure 38D:
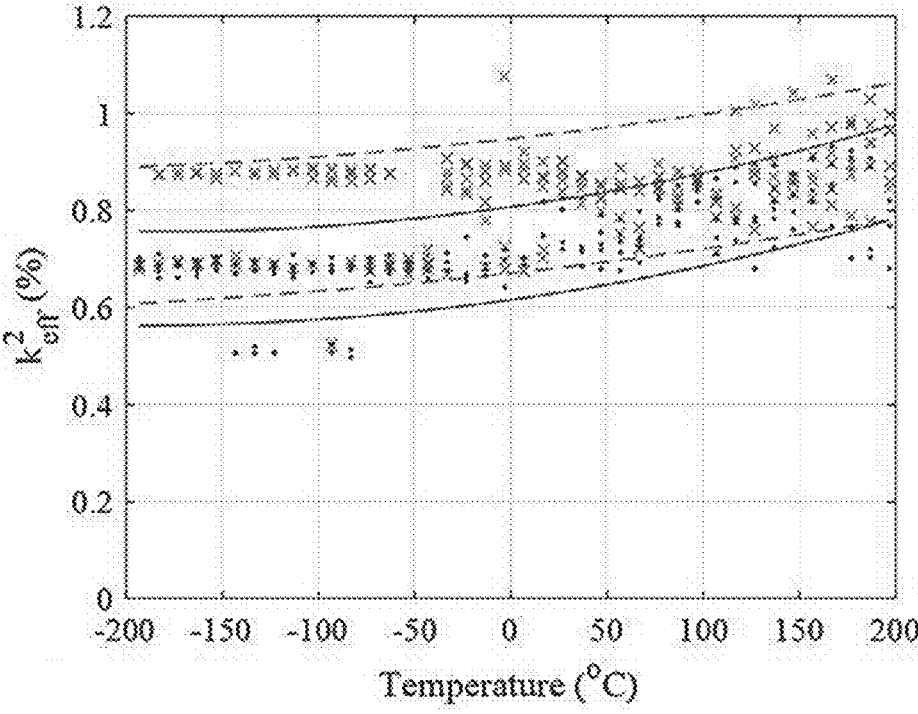

FIGS. 35A and 35B graphically illustrate measured SHR frequency responses for the resonators of FIGS. 7A and 8A, respectively.

FIGS. 36A-36D graphically illustrate the TCF, Rm, Q, and $$k_{eff}^2,$$

respectively, for the high overtone TM vibration at 9.65 GHz of the resonators of FIG. 7A (data represented with "x") and 8A (data represented with "•").

FIGS. 37A-37D graphically illustrate the TCF, Rm, Q, and $$k_{eff}^2,$$

respectively, for the high overtone TM vibration at 10.0 GHz of the resonators of FIG. 7A (data represented with "x") and 8A (data represented with "•").

FIGS. 38A-38D graphically illustrate the TCF, Rm, Q, and $$k_{eff}^2,$$

respectively, for the high overtone TM vibration at 10.35 GHz of the resonators of FIG. 7A (data represented with "x") and 8A (data represented with "•").

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

Figure 1:
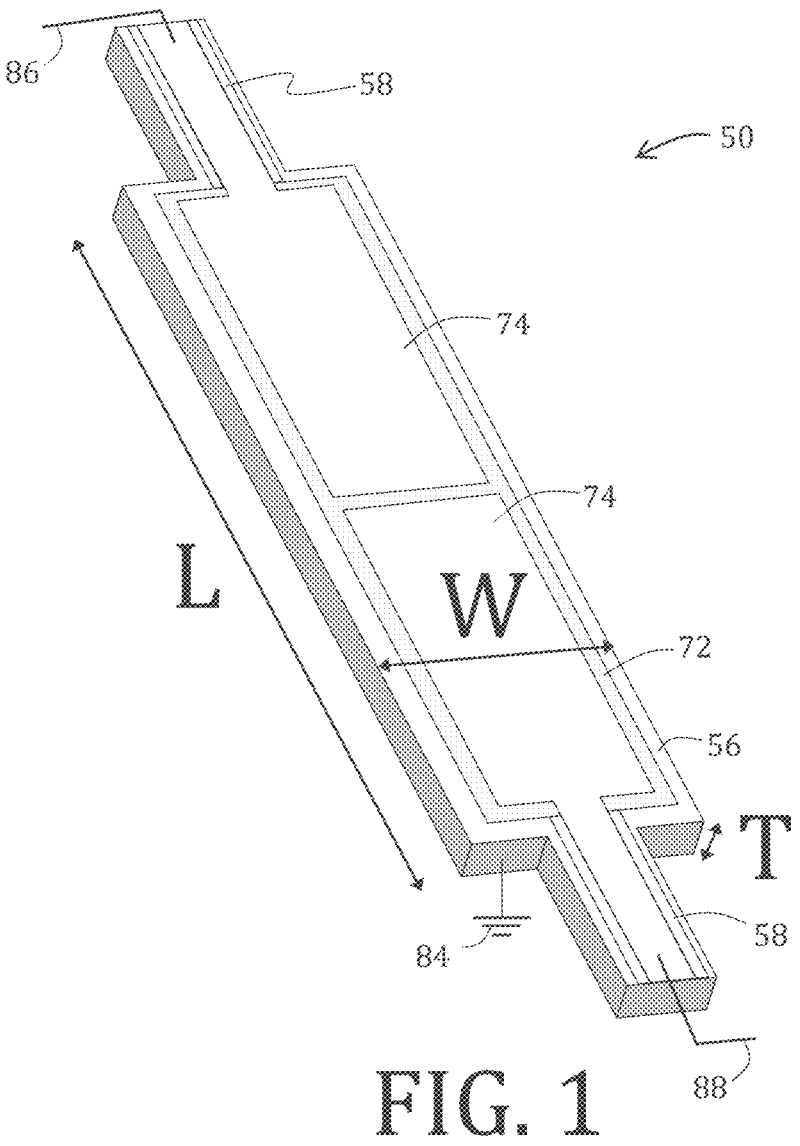
FIG. 1 is a perspective view of a Bulk Acoustic Wave ("BAW") resonator suitable for use with embodiments of the present invention.

Turning now to the figures, and in particular to FIG. 1, a Bulk Acoustic Wave ("BAW") resonator suitable for use with embodiments of the present invention is shown. BAW resonators exploit acoustic waves that propagate throughout the entire solid body, hence the term "bulk." More specifically, the resonator of FIG. 1 is a Width Extensional Mode ("WEM") resonator 50, which is a subset of BAW resonators.

One suitable resonator 50 is described in U.S. application Ser. No. 18/503,819 filed Nov. 7, 2023, the contents of which is incorporated herein by reference in its entirety. Briefly, and with reference to FIGS. 1, and 2A-2C, the resonator 50 may be fabricated using a PiezoMUMPs fabrication process by MEMSCAP Inc. and have dimensions that do not exceed a 400 μm×200 μm footprint, including the contact electrode. Other, alternative fabrication processes may include virtually any non-commercial fabrication process that is conducted in a cleanroom and that is configured to deposit, pattern, and release a stack of metal-piezoelectric film-silicon. The resonator body includes a substrate 52 having a first dielectric layer 54 and an n-type layer 56, respectively, thereon. The first dielectric layer 54 may comprise dielectric material such as silicon dioxide, silicon nitride, titanium dioxide, aluminum dioxide, and hafnium dioxide, and may be used to mitigate the acoustic impedance mismatch between top metal electrodes and the resonator body. The n-type layer may be an n-type silicon, p-type Si, n-type/p-type silicon carbide, n-type/p-type silicon germanium, n-type/p-type diamond, or the like.

Figure 2A:
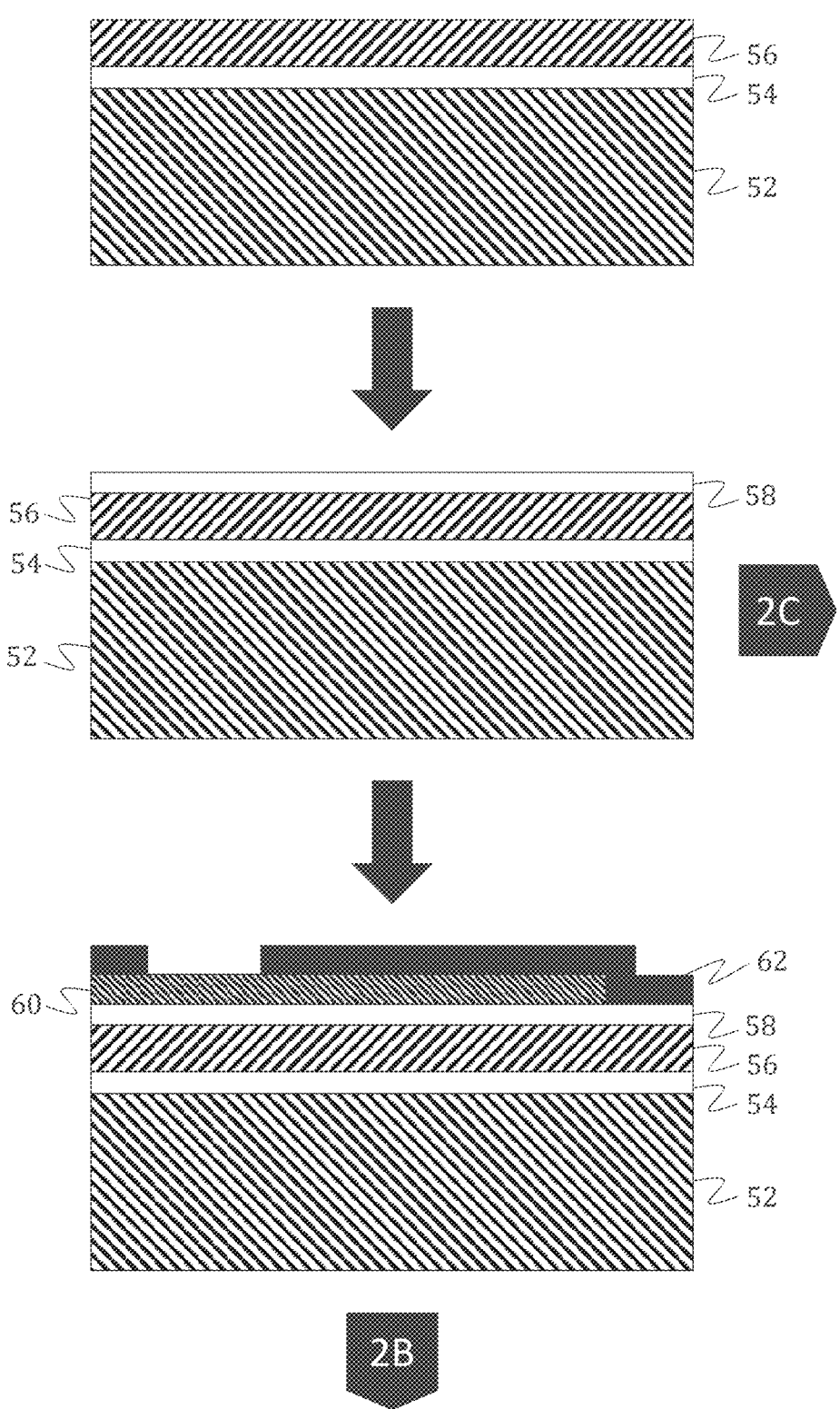
FIGS. 2A-2C are schematic illustrations, in cross section, of methods for fabrication BAW resonators suitable for embodiments of the present invention.
Figure 2B:
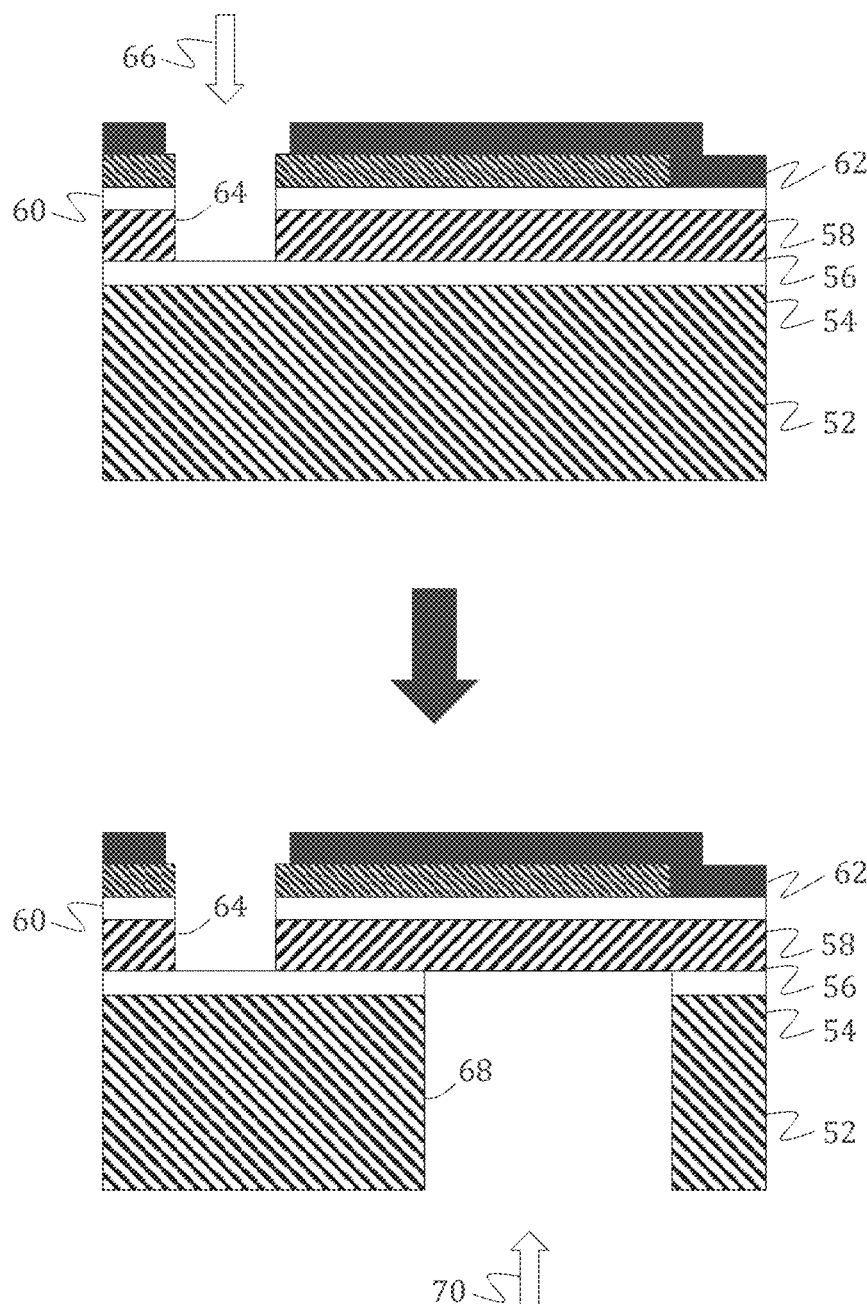

A second dielectric layer 58 may then be deposited over the n-type layer 56. Thereafter, the process may, optionally, proceed as shown in FIGS. 2A and 2B, to include the deposition of an electromechanical transduction layer 60 comprising aluminum nitride (AlN) or other piezoelectric materials such as Zinc Oxide (ZnO), Lead Zirconate Titanate (PZT), Aluminum Scandium Nitride (AlScN), Gallium Nitride (GaN), Barium Titanate (BaTiO₃), Lithium Niobate (LiNbO₃) and Lithium Tantalate (LiTaO₃) and the like. Subsequently a patterned electrode conductive layer 62 may be deposited onto the electromechanical transduction layer 60 and may comprise a conductive metal, such as aluminum (Al), Copper (Cu), Tungsten (W), Gold (Au), Silver (Ag), Palladium (Pd), Titanium (Ti), Titanium Nitride (TIN), Cobalt (Co), Nickel (Ni), Platinum (Pt), and Molybdenum (Mo), and the like or combinations thereof.

A first channel 64 may then be reactive ion etched in the direction of arrow 66 through the electromechanical transduction layer 60 and, the second dielectric layer 58, and the n-type layer 56. Subsequently, a second channel 68 may be reactive ion etched in the direction of arrow 70 the backside into the substrate 52 to the first dielectric layer 54.

Alternatively, and returning to FIG. 2A, and after second dielectric layer 58 is deposited over the n-type layer 56, a portion of the second dielectric layer 58 may be etched prior to deposition of an electromechanical transduction layer 72 and a conductive metal 74 such that the electromechanical transduction layer 72 is in direct contact with the n-type layer 56. First and second channels 76, 78 in directions of arrows 80, 82, respectively, may then be etched as described previously.

Referring now again to FIG. 1, the n-type layer 56 the completed resonator 50 may be grounded 84 while a signal port 86 and a sense port 88 are configured to be electronically coupled such that an electrical signal may be input through the signal port 86 and the resulting mechanical vibrations may be detected as an electrical output signal via the sense port 88. That is, the WEM of resonator 50 may be a longitudinal wave that travels the width of the resonator 50, causing it to expand and contract. The WEM can be described by the 1D wave equation with Neumann boundary conditions such that its fundamental resonant frequency is given by:

$$f_r = \frac{1}{2W}\sqrt{\frac{E_{eff}}{\rho_{eff}}} \qquad \text{Equation 1}$$

where W is the width, $E_{eff}$ is the effective Young's modulus (also called the elastic modulus), and $\rho_{eff}$ is the effective density of the stack forming the resonator 50. For the case of a two-port piezoelectric-on-Si resonator, the bulk component RLC circuit equivalents of motional resistance ($R_m$), capacitance ($C_m$), and inductance ($L_m$) are given by:

$$R_m = \frac{\pi}{4}\frac{T}{L}\frac{\sqrt{E_{eff}\rho_{eff}}}{QE_{piezo}^2 d_{31}^2} \qquad \text{Equation 2}$$

$$C_m = \frac{4}{\pi^2}\frac{LW}{T}\frac{E_{piezo}^2}{E_{eff}}d_{31}^2$$

-continued $$L_m = \frac{\rho_{eff}}{E_{piezo}^2}\frac{TW}{L}\frac{1}{4d_{31}^2}$$

where $E_{piezo}$ is the Young's modulus of the piezoelectric film, Q is the quality factor, and $d_{31}$ is the piezoelectric coefficient that actuates the WEM vibration. Finally, from the series electrical resonant circuit, the following the relationships may be derived:

$$(QR_m)^2 = \frac{L_m}{C_m} \qquad \text{Equation 3}$$

$$\frac{1}{(2\pi f_x)^2} = L_m C_m$$

Figure 3:
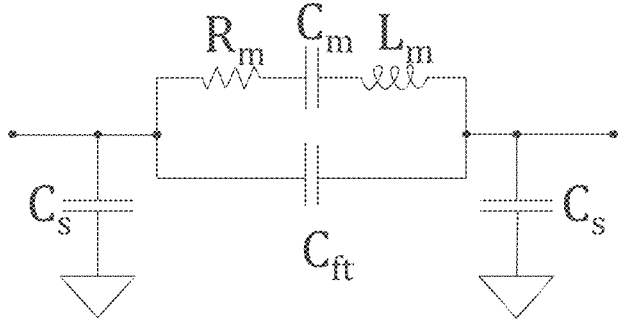
FIG. 3 is a schematic of the Modified Butterworth Van Dyke ("MBVD") electrical equivalent circuit model that represents the resonators suitable for embodiments of the present invention.

The Modified Butterworth Van Dyke ("MBVD") electrical equivalent circuit model that is commonly used to represent the behavior of the resonator 50 is shown in FIG. 3.

It has been shown that the elastic modulus of amorphous Si is roughly 50% of crystalline Si. Other work has shown that the difference in mass density between amorphous and crystalline Si is only about 2%. If maximum ion fluence of increases the bulk atomic density by about 10 ppm (0.001%), then the change in material mass density and resonator dimensions are assumed to be negligible compared to the change to the bulk material properties of elastic moduli and piezoelectric constants. This conclusion aligns consistently with prior studies examining the effects of ion radiation on MEMS resonators. Thus, by Equations 1-3, the relationship between the product $E_{piezo}d_{31}$, $L_m$, and $C_m$ can be expressed as:

$$\frac{E_{piezo}d_{31}}{E_{piezo_0}d_{31_0}} = \sqrt{\frac{f_r}{f_{r_0}}\frac{R_{m_0}}{R_m}\frac{Q_0}{Q}} = \sqrt{\frac{L_{m_0}}{L_m}} = \frac{f_r}{f_{r_0}}\sqrt{\frac{C_m}{C_{m_0}}} \qquad \text{Equation 4}$$

where the subscript 0 indicates the pre-irradiation value.

A first-order differential equation may be used to approximate defect concentration within a material undergoing irradiation. The time rate of change in defect concentration (D) is given as the number of defects caused per incident radiation particle in a pure material (κ) minus the defect ratio ($D(t)/D_{sat}$). This value is multiplied by the flux of the radiation particles (φ). $D_{sat}$ represents the number of defects when the material is saturated. In other words, $D_{sat}$ is the maximum number of defects possible for a given radiation and target material. As defect concentration increases, the incident particle or its knock-on atoms are more likely to hit an already displaced atom and not cause a new defect:

$$\frac{dD(t)}{dt} = \kappa\left(1 - \frac{D(t)}{D_{sat}}\right)\varphi \qquad \text{Equation 5}$$

which, assuming some initial defect contraction, $D_0$, has the solution:

$$D(t) = (D_0 - D_{sat})e^{\frac{-\kappa\varphi}{D_{sat}}t} + D_{sat} \qquad \text{Equation 6}$$

Because $D_0$ and $D_{sat}$ are challenging to measure directly, the ratio may be used:

$$\frac{D(\Phi)}{D_0} = (1-\alpha)e^{\frac{-\Phi}{\tau}} + \alpha \qquad \text{Equation 7}$$

where $\alpha = D_{sat}/D_0$, $\tau = D_{sat}/\kappa$ represents the decay constant and $\Phi = \varphi t$ is the fluence of the radiation particles. Because previous work has demonstrated that dislocation damage is the dominant effect of radiation on piezo-on-Si devices, it is reasonable to extrapolate Equation 7 to describe the change in any bulk mechanical property as a function of radiation dose or fluence by replacing D with the property such as $E_{eff}$ or $d_{31}$. Then, $\alpha$ and $\tau$ become damage coefficients specific to that property and type of radiation in the target material.

Figure 4:
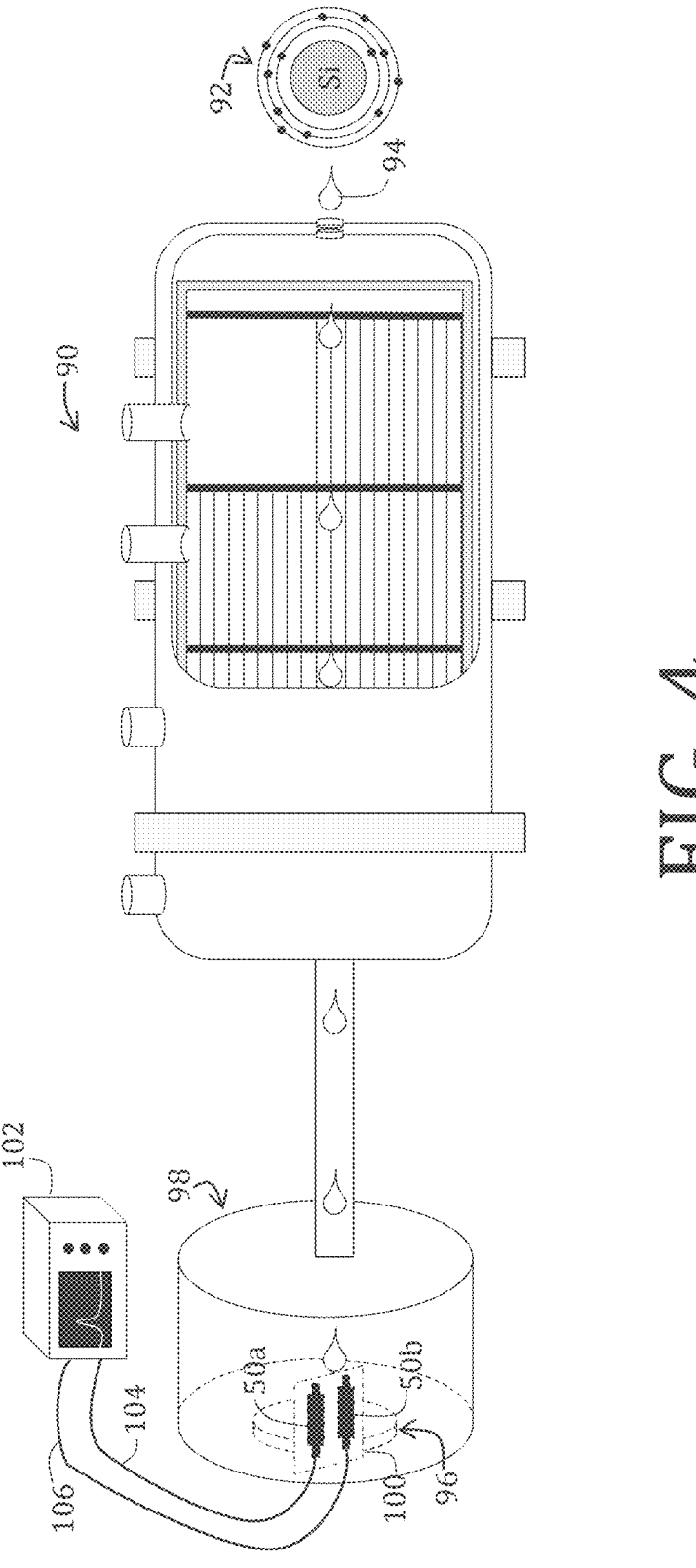
FIG. 4 is a schematic illustration of a High Voltage Engineering ("HVE") Tandem Accelerator suitable for heavy charge particle radiation of resonators according to one embodiment of the present invention.

Post-fabrication damage to the resonator 50 may be accomplished using a High Voltage Engineering (HVE) Tandem Accelerator system 90, such as is shown in FIG. 4 which is representative of the system at Sandia National Laboratory. A radiation particle source 92 (illustrated as $Si^+$ but could also be $Ar^+$, $He^+$, $C^+$, and $Ne^+$) generates radiation particles 94, which are directed into the Tandem Accelerator system 90, wherein the radiation particles 94 are accelerated to 2 MeV and ultimately directed to a target 96 within a vacuum chamber 98. The target 96, as specially illustrated in FIG. 4, includes two resonators 50a, 50b mounted on a printed circuit board (PCB) 100. Each resonator 50a, 50b are operably coupled to a network analyzer 102 positioned external to the vacuum chamber 98 by way of RF connections 104, 106.

Resonant frequency, $f_r$, and anti-resonant frequency, $f_a$, may be measured directly from the input admittance, Y11. The single electrode one port electromechanical coupling coefficient $$\left(k_{eff}^2\right)$$

may be defined as:

$$k_{eff}^2 = \frac{f_a^2 - f_r^2}{f_r^2} \qquad \text{Equation 8}$$

The motional resistance, $R_m$, of the two-port resonator may be measured using:

$$R_m = 2Z_0\left(10^{\frac{IL}{20}} - 1\right) \qquad \text{Equation 9}$$

where IL is the insertion loss in dB at resonance of the forward transmission parameter, S21 and $Z_0$ is the termination impedance of the measurement setup. The unloaded quality factor, Q, may be extracted using:

$$Q = \frac{Q_L}{\left(1 - 10^{\frac{-IL}{20}}\right)} \qquad \text{Equation 10}$$

where $Q_L = f_r/BW_{-3}$ is the loaded quality factor and $BW_{-3}$ is the −3 dB bandwidth of the resonance peak.

The overall Q of a system is found by summing the dissipated energies. This is more commonly written as the sum of quality factors associated with each source of loss (Qi):

$$Q = \sum_i \frac{1}{Q_i} \qquad \text{Equation 11}$$

Figure 2C:
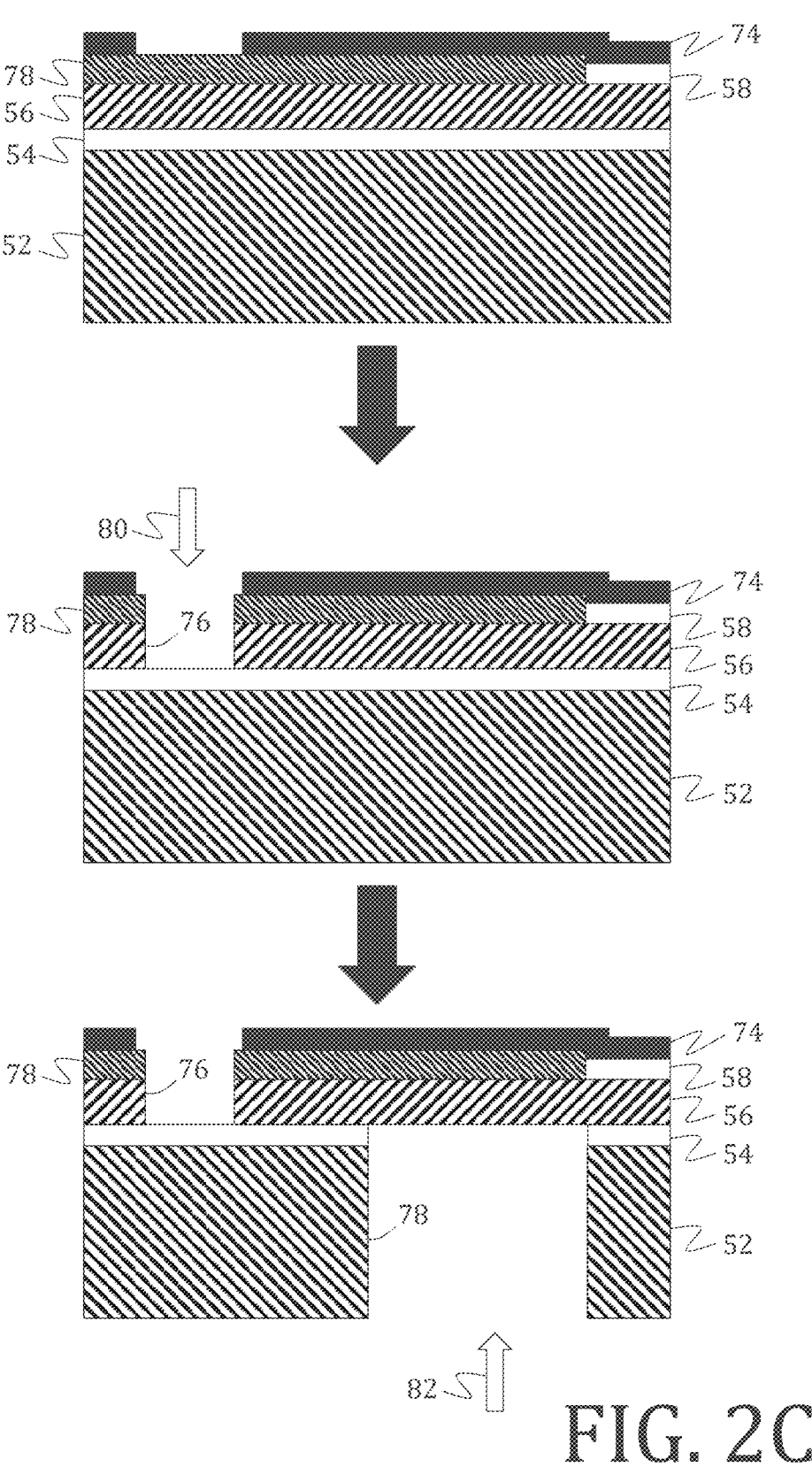

Sources of loss are divided into intrinsic and extrinsic sources. Intrinsic losses are solely dependent upon the materials and dimensions of the resonator and include dielectric, piezoelectric, phonon-phonon interaction, and phononelectron interaction losses. Extrinsic losses are those losses not fundamentally bound to material properties and include anchor, fluid, surface, and ohmic losses. With the exception second dielectric layer, the resonators of FIGS. 2A-2C are identical in geometry, anchor design, and environment. Therefore, the primary cause of Q enhancement as an improvement in acoustic impedance mismatch between the transduction and dielectric layers.

The characteristic specific acoustic impedance, $Z_0$, is given by the product of acoustic velocity, c, and mass density. Using the densities, acoustic velocities, and characteristic specific acoustic impedances may be determined. As presented below in the examples, without the second dielectric layer there is a large acoustic impedance mismatch between the dielectric layer and the silicon. At VHF range, Q improves when the second dielectric oxide layer is added.

Akhiezer-type phonon-phonon interaction losses become dominant in the SHF range. Akhiezer loss describes the interaction between thermal phonons and vibrational phonons when phonon scattering time is much shorter than one period of vibration (i.e., $\tau_s \ll \tau_v$). Irreversible loss occurs as phonons interact with each other. $Q_{AKE}$ associated with this loss is found using the formula:

$$Q_{AKe} = \frac{\rho c^4}{2\pi f \gamma_{avg}^2 kT} \qquad \text{Equation 12}$$

where $\rho$ is the material density, c is the acoustic velocity, f is the frequency of vibration, $\gamma_{avg}$ is the average Grünesen's parameter, T is the temperature, and k is the thermal conductivity. As frequency increases, $Q_{AKE}$ decreases proportionally, and the loss improvement given by the oxide layer is overcome by Akhiezer phononphonon interaction losses. While not wishing to be bound by theory, this may explain the dissipation of the Q enhancement for the high-overtone TM vibrations as T and f increase identified in the examples below.

Other loss sources such as thermoelastic damping (TED), squeeze film damping, surface losses, and air damping are less significant. TED describes the process of phonon diffusion from sections of higher temperature to lower temperature spots. TED in bulk-mode resonators is considered negligible in the frequency range for which they are utilized. Squeeze film damping is negligible because there are no small air gaps around the resonator. Surface losses can be considered negligible because the surfaces do not change between the VHF and SHF regions. Finally, air damping can be ignored because the devices were measured in a vacuum for both VHF and SHF cases.

Figure 5:
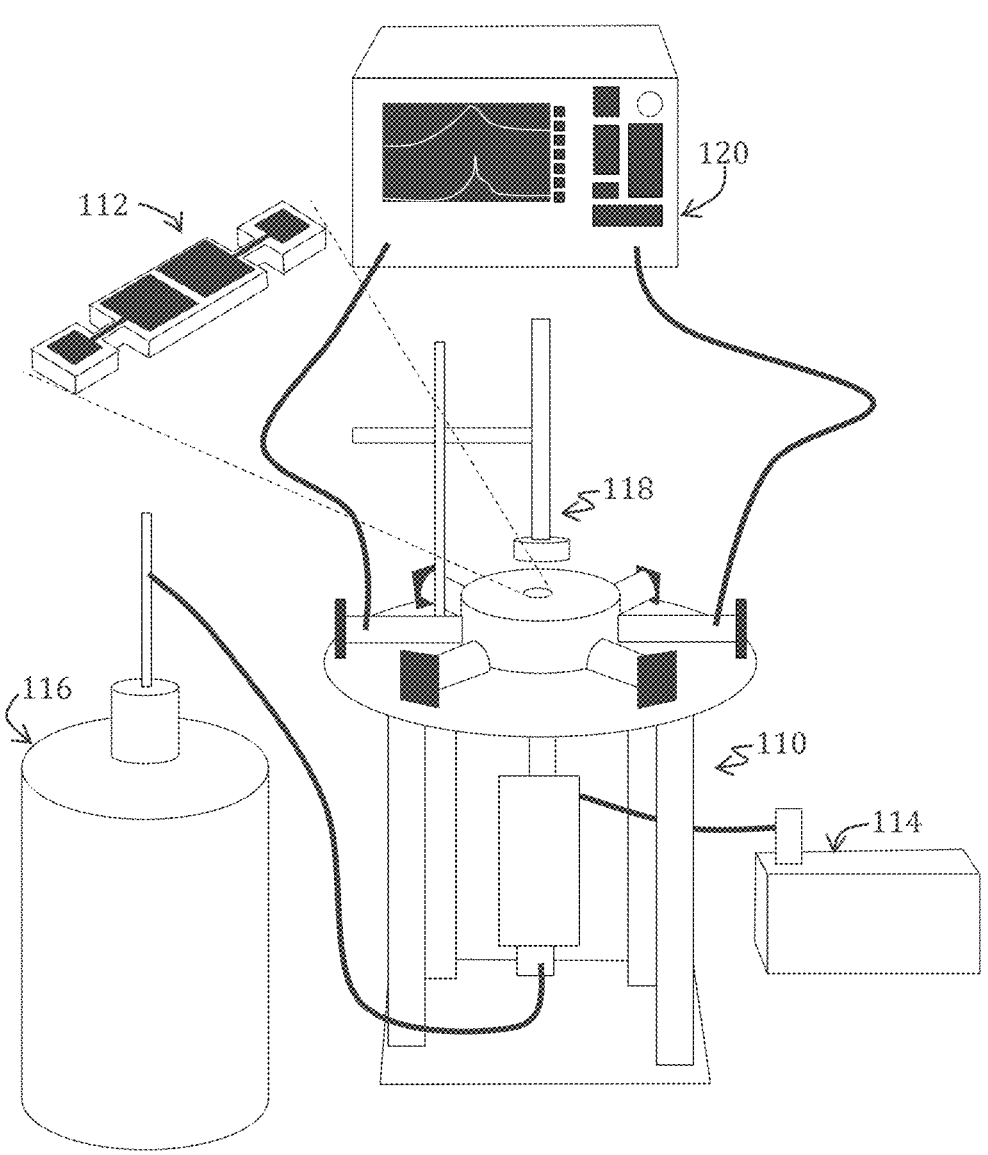
FIG. 5 is a schematic illustration of a system for evaluating two-port scattering parameters (S-parameters) of the resonators operating in the different modes under vacuum.

Referring now to FIG. 5, a system suitable for evaluating two-port scattering parameters (S-parameters) of resonators operating in the different modes under vacuum is shown. While the system may vary, the illustrated example includes a vacuum probe station 110 configured to receive a resonator 112. The vacuum probe station 110 may be operably coupled to a vacuum pump 114 for drawing a vacuum on a space in which the resonator 112 resides and a coolant tank 116 (such as liquid nitrogen) for cooling the resonator 112 to a test temperature. An imaging system 118 may be positioned above the resonator 112 within the vacuum probe station 110 for image acquisition during testing. A microwave network analyzer 120 may also be operably coupled to the resonator 112. Use of the system may be accomplished according to methodologies understood by those of ordinary skill in the art and as described in the examples below.

Figure 6:
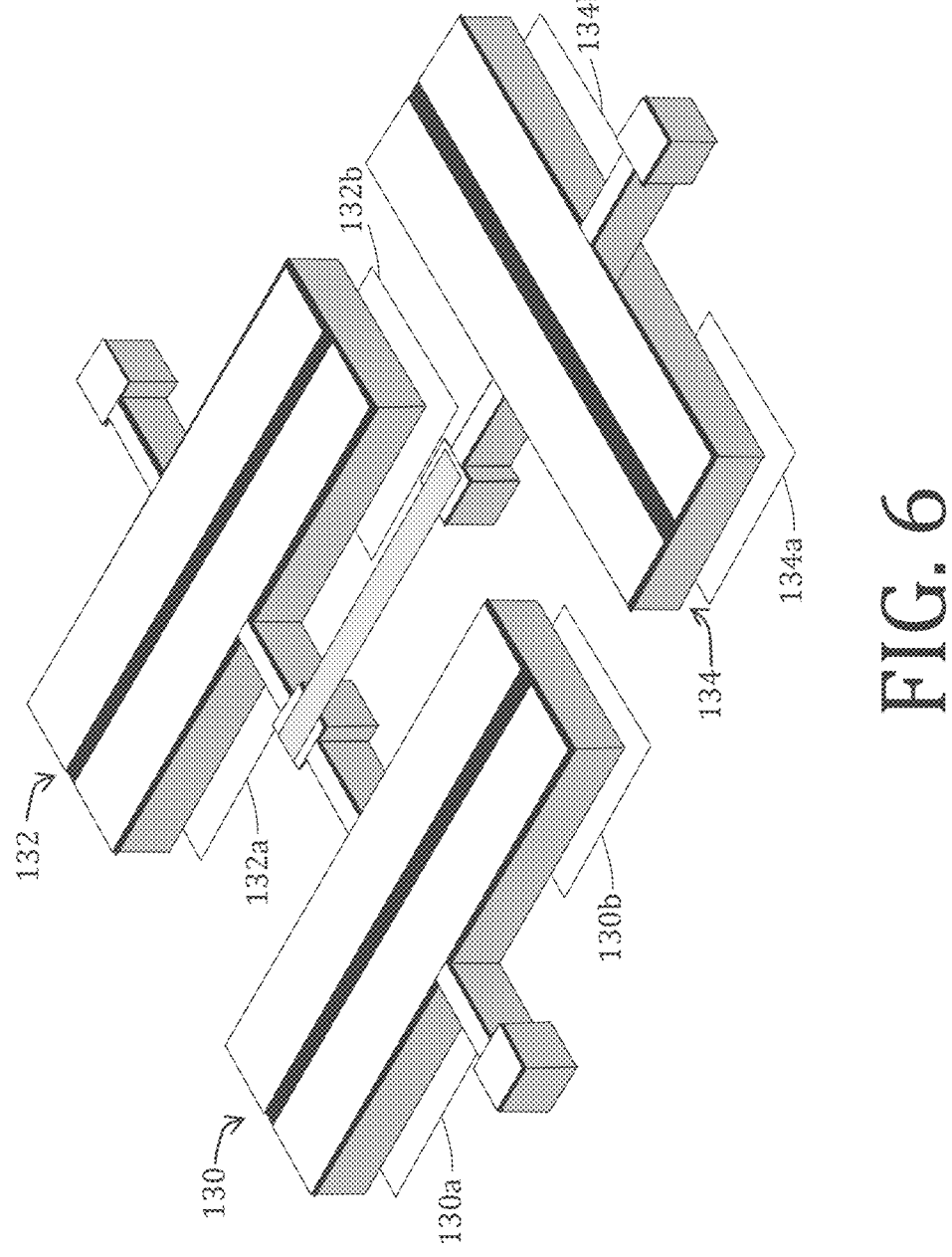
FIG. 6 schematically illustrates a plurality of resonators, prepared in accordance with embodiments of the present invention, arranged as a tunable bandpass ladder filter.

While resonator prepared in accordance with embodiment herein have been described thus far as a solitary device, it is possible to arrange a plurality of resonators and form additional devices and circuits. One such example, a band-pass filter, is illustrated in FIG. 6, suitable for filtering particular frequencies within a range while attenuating frequencies outside the particular range. As shown, first and second resonators 130, 132 are positioned, in series, while a third resonator 134 is positioned so as to operate as a shunt resonator. Two substrate bias electrodes 130a, 130b, 132a, 132b, 134a, 134b are paired with each resonator 130, 132, 134. It would be understood by the skilled artisan having the benefit of the disclosure herein that one or more of the resonators 130, 132, 134 may be pre- or post-irradiation; however, irradiation according to the various embodiments described herein provide augmentation of the bandwidth of resonator filters.

The following examples illustrate particular properties and advantages of some of the embodiments of the present invention. Furthermore, these are examples of reduction to practice of the present invention and confirmation that the principles described in the present invention are therefore valid but should not be construed as in any way limiting the scope of the invention.

Example 1

Two-port AlN transduced rectangular flat plate MEMS resonators 140, 142 were used due to their straightforward analytical descriptions of behavior and are illustrated in FIGS. 7A, 7B, 8A, and 8B, respectively. Each resonator 140, 142 is one of two designs: (1) AlN layers 144, 146 on top of n-type silicon 148, 150 and (2) a $SiO_2$ thin film 152 sandwiched between the AlN layers 146 and Si substrate 150. From bottom to top, the resonators 140, 142 consisted of a 10 μm thick phosphorous doped Si (n-Si) substrate 148, 150, a 0.2 μm $SiO_2$ thin film 122 for the second design, a 0.5 μm AlN layer 144, 146, a 0.02 μm chromium (Cr) layer, and a 1.0 μm Al layer 154, 156 to act as the top conductor. The Cr layer is not shown in the drawings due to its thin layer and as its primary purpose is to promote adhesion for the Al layer 154, 156; moreover, the electrical and mechanical properties of the Cr—Al stack are largely dominated by the Al layer. Each resonator 140, 142 was fabricated using the Piezo-MUMPs process by MEMSCAP Inc. Nominal resonator 140, 142 dimensions are presented in Table 1 (dimensions provided as L×W×T in μm). Colorized scanning electron microscope (SEM) images of the resonators 140, 142 are provided in FIGS. 5C and 6C, respectively, while cross-sectional scanning electron micrographs of the two resonators are shown in FIGS. 5D and 6D, respectively.

TABLE 1

| Parameter | Al/Cr | AlN | $SiO_2$ | n-Si |
|---|---|---|---|---|
| No $SiO_2$ Layer | 97 × 37 × 1.02 | 206 × 46 × 0.5 | Not applicable | 216 × 56 × 10 |
| With $SiO_2$ Layer | 97 × 37 × 1.02 | 206 × 46 × 0.5 | 216 × 56 × 0.2 | 222 × 62 × 10 |

Figure 9A:
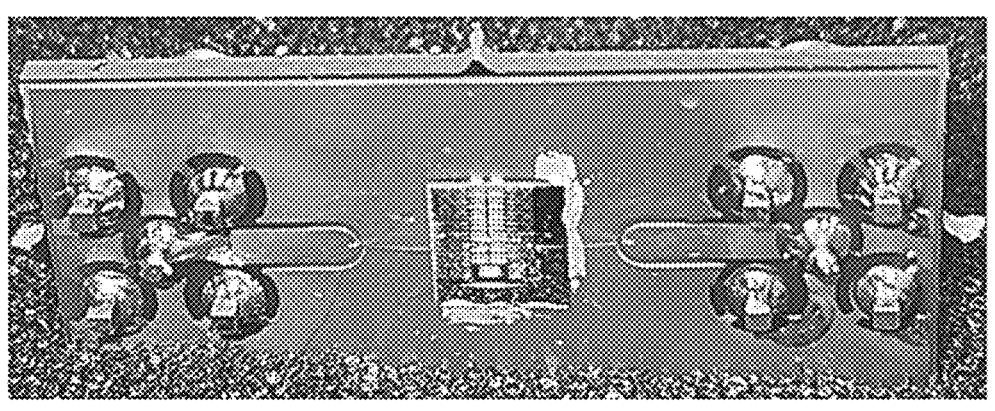
FIGS. 9A-9C are photographs of a resonator mounted on a PCB and prepared for irradiation.
Figure 9B:
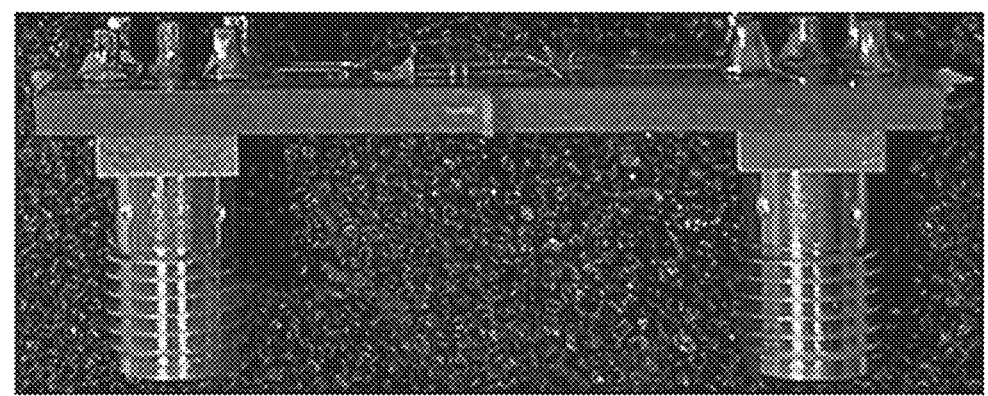
Figure 9C:
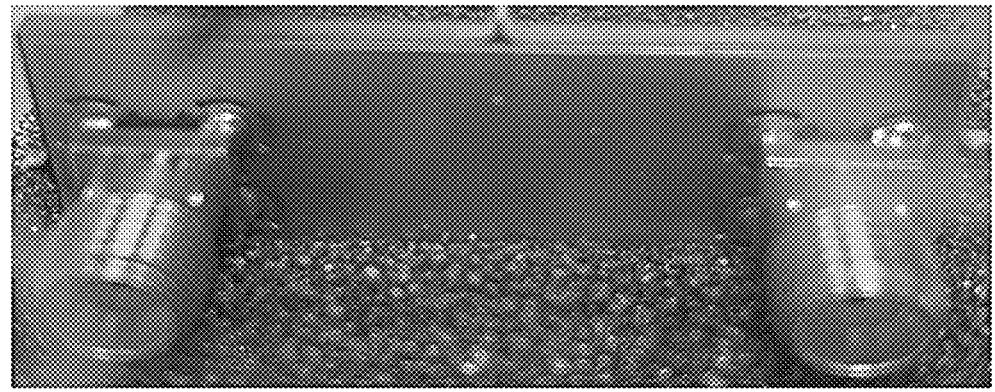

Post fabrication damage was applied by mounting the resonators 140, 142 to a custom printed circuit board ("PCB") for irradiation and simultaneous measurement of S-parameters. The resonators 140, 142 were laser diced and secured to the PCB using conductive silver paste. 99% Au 1-mil boding wires were used for wirebonding—50Ω Sub-Miniature version A ("SMA") connectors were soldered to the PCB to provide an RF cable connection. Exemplary images of PCB mounted resonators 140, 142 are provided in FIGS. 9A-9C.

Heavy ion irradiation was accomplished using 2 MeV Sit ions. Si was chemically inert with the device materials and does not result in activation (i.e., making them radioactive). Heavy ion irradiation results in ionization that decreases with depth, and vacancy production, which increases with depth, with a maximum at the Bragg peak or ion end of range ("EOR"). Frenkel Pairs and defect clusters were produced, particularly at the EOR. This atomic displacement damage creates electrical traps in electronic materials and modifies the material properties.

Transport of Ions in Matter ("TRIM") simulations were performed to estimate the vacancy production in the device. TRIM uses specific values of displacement energy for each element to determine if sufficient energy was transferred to the atom to displace it by more than one lattice site. Displacement energies used for constituent elements are provided in Table 2, below.

TABLE 2

| Al | Cr | N | Si | O |
|---|---|---|---|---|
| 25 eV | 25 eV | 28 eV | 15 eV | 28 eV |

Figure 10A:
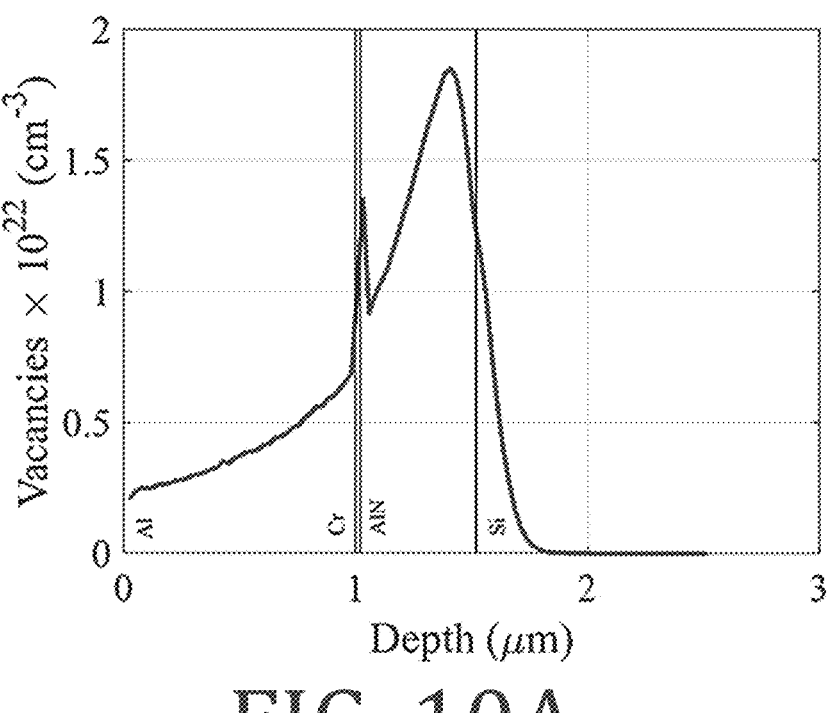
FIGS. 10A and 10B graphically illustrate the results of TRIM simulations of 2 MeV $Si^+$ ions into the resonators of FIGS. 7A and 8A, before and after irradiation, respectively.
Figure 10B:
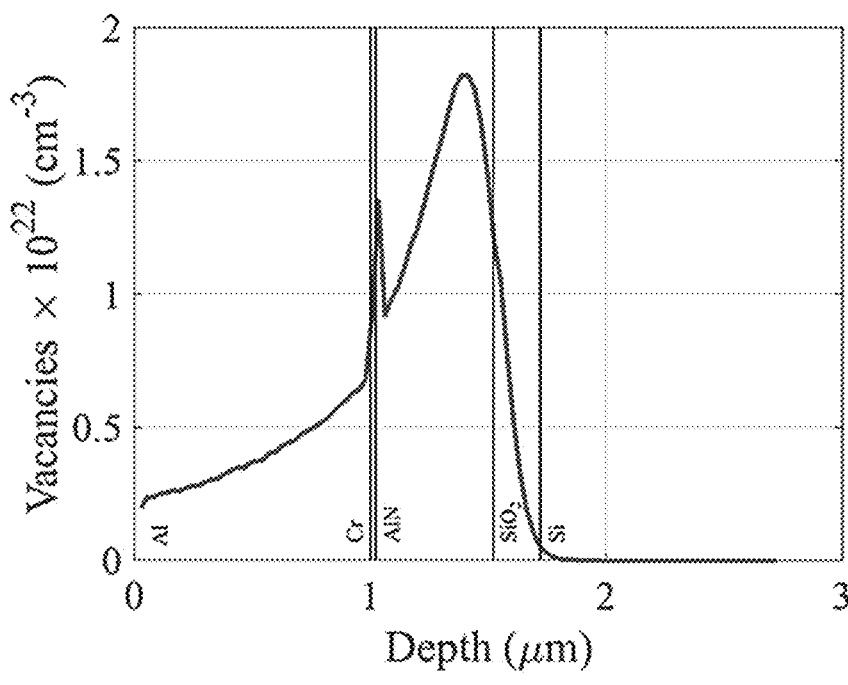

The simulation was optimized to produce maximum vacancy in the AlN layer 144, 146 while causing significant displacements in the lower $SiO_2$ 122 or Si layers 148, 150. The Ion Distribution and Quick Calculation of Damage parameters were used to estimate the damage based on the Kinchin-Pease method. For 2 MeV Sit ions, simulation results showed about 50% of dislocations in the AlN layer 144, 146 and 10% in the lower Si 148, 150 or $SiO_2$ thin film 122. Results from the TRIM simulations are presented in FIGS. 10A and 10B for resonators 140, 142, respectively.

Both resonators 140, 142, respectively were irradiated, one at a time, at the Sandia National Laboratory Ion Beam Laboratory using the HVE 6 MV tandem accelerator 90 (as diagrammatically illustrated in FIG. 4). Irradiation was performed at room temperature at an average pressure of 1 μTorr. Connections in the vacuum chamber 98 allowed for RF cables 104, 106 to be connected so that S-parameters could be recorded in situ. S-parameters were recorded by the network analyzer 102 outside the vacuum chamber 98. Short-open-load-through ("SOLT") calibration of the network analyzer 102 was performed before placing the resonators 140, 142 in the vacuum chamber 98 to remove cable and connector losses. Virgin characteristics for both devices were taken followed by irradiation up to a fluence of $5\times10^{14}$ cm$^{-2}$ at a flux of $1.9\times10^{11}$ cm$^{-2}$s$^{-1}$. A 30 min time anneal in vacuum was recorded for one of each resonators 140, 142 design after irradiation. To observe the effects of different fluxes, additional devices of the same design were irradiated with identical parameters at a higher flux of $4.7\times10^{11}$ cm$^{-2}$s$^{-1}$. Following data collection, resonator properties were extracted from the S-parameters.

Figure 11A:
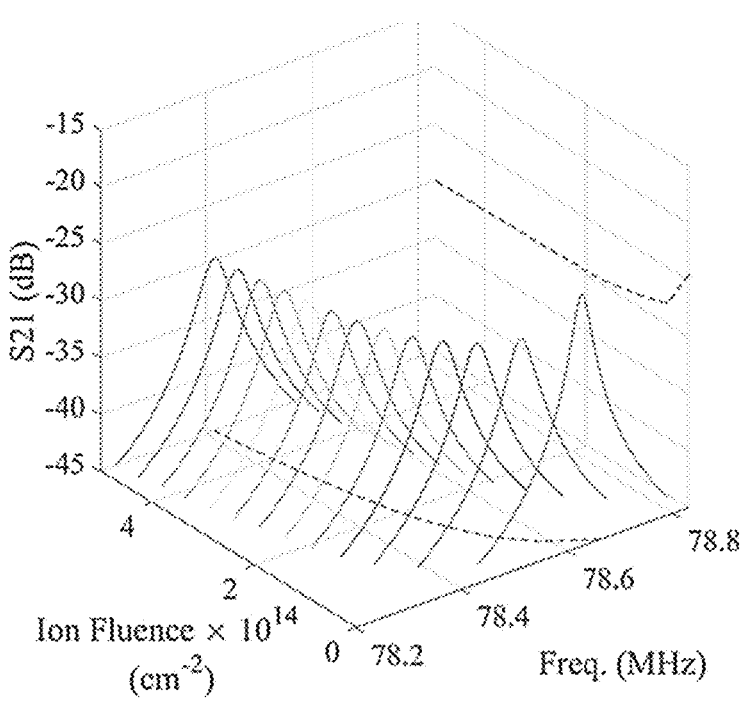
FIGS. 11A and 11B graphically illustrate the measured S21 frequency response for the resonators of FIGS. 7A and 8A, respectively.
Figure 11B:
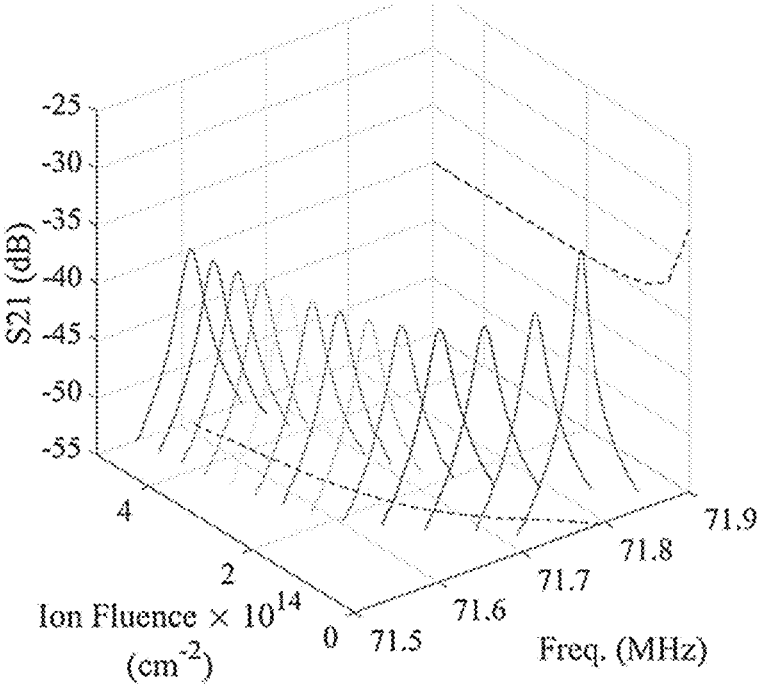
Figure 12A:
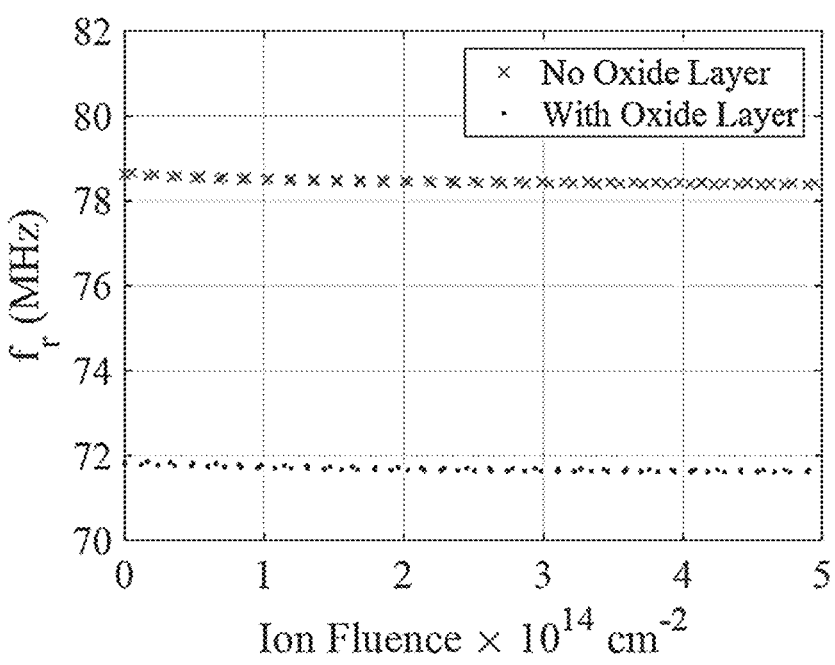
FIGS. 12A-12D graphically illustrate measured values of the fundamental frequency, the motional resistance, the quality factor, and the electromechanical coupling coefficient, respectively, for the resonators of FIGS. 7A and 8A irradiated with 2 MeV $Si^+$ ions.
Figure 12B:
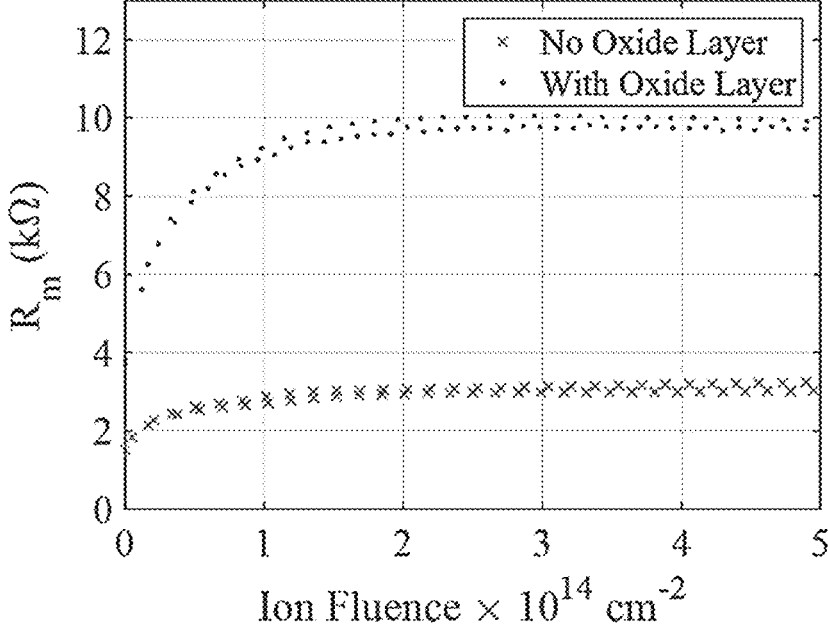
Figure 12C:
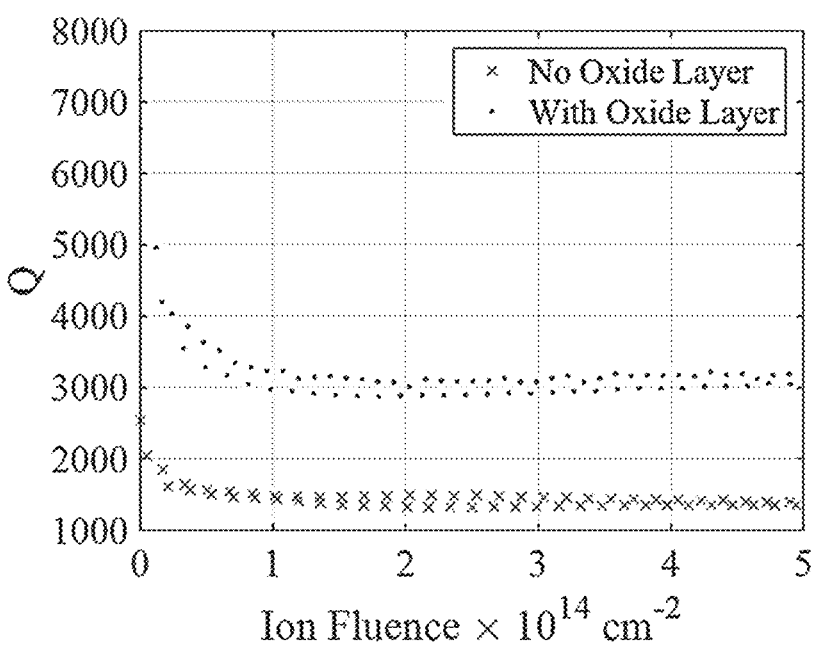
Figure 12D:
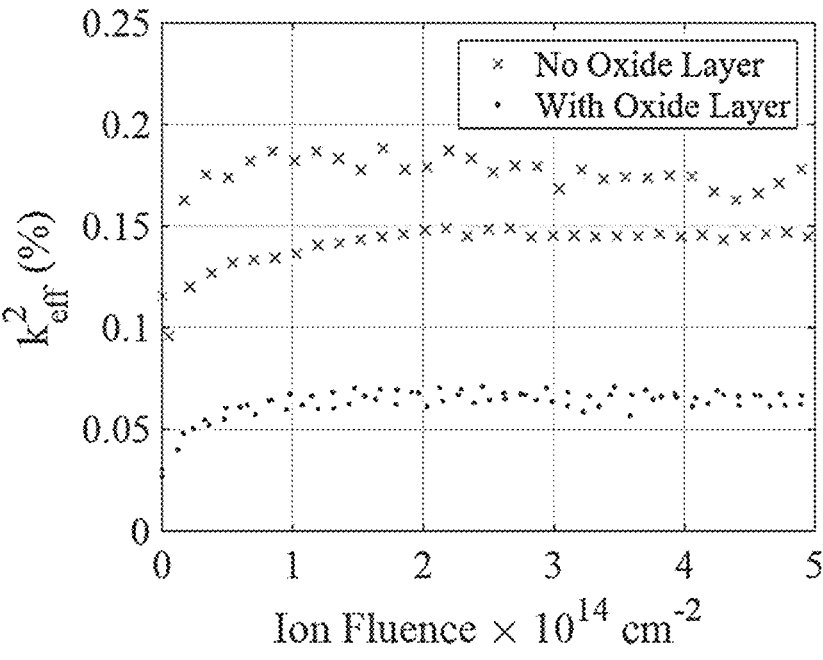
Figures 13A, 13B:
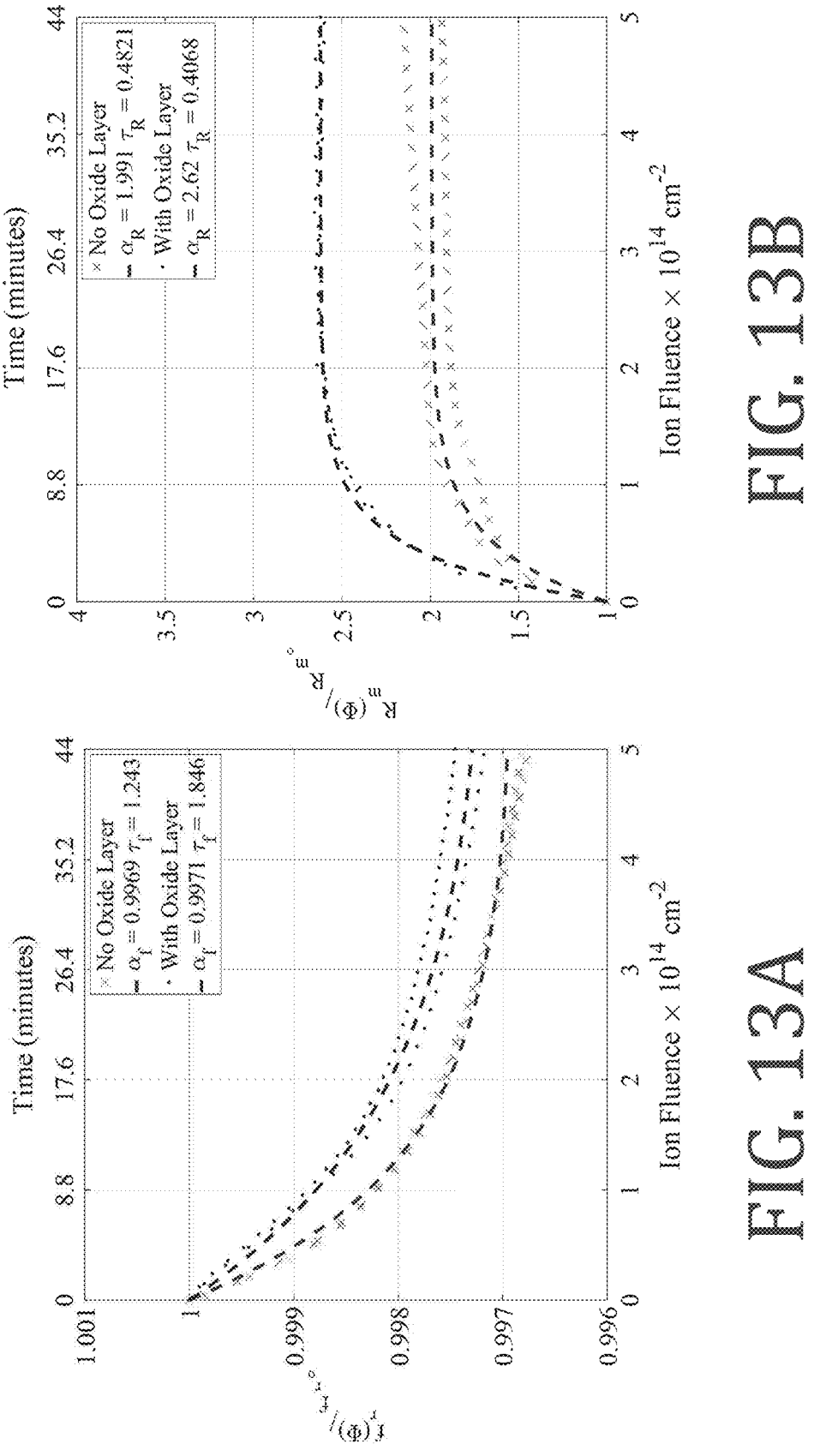
Figures 13C, 13D:
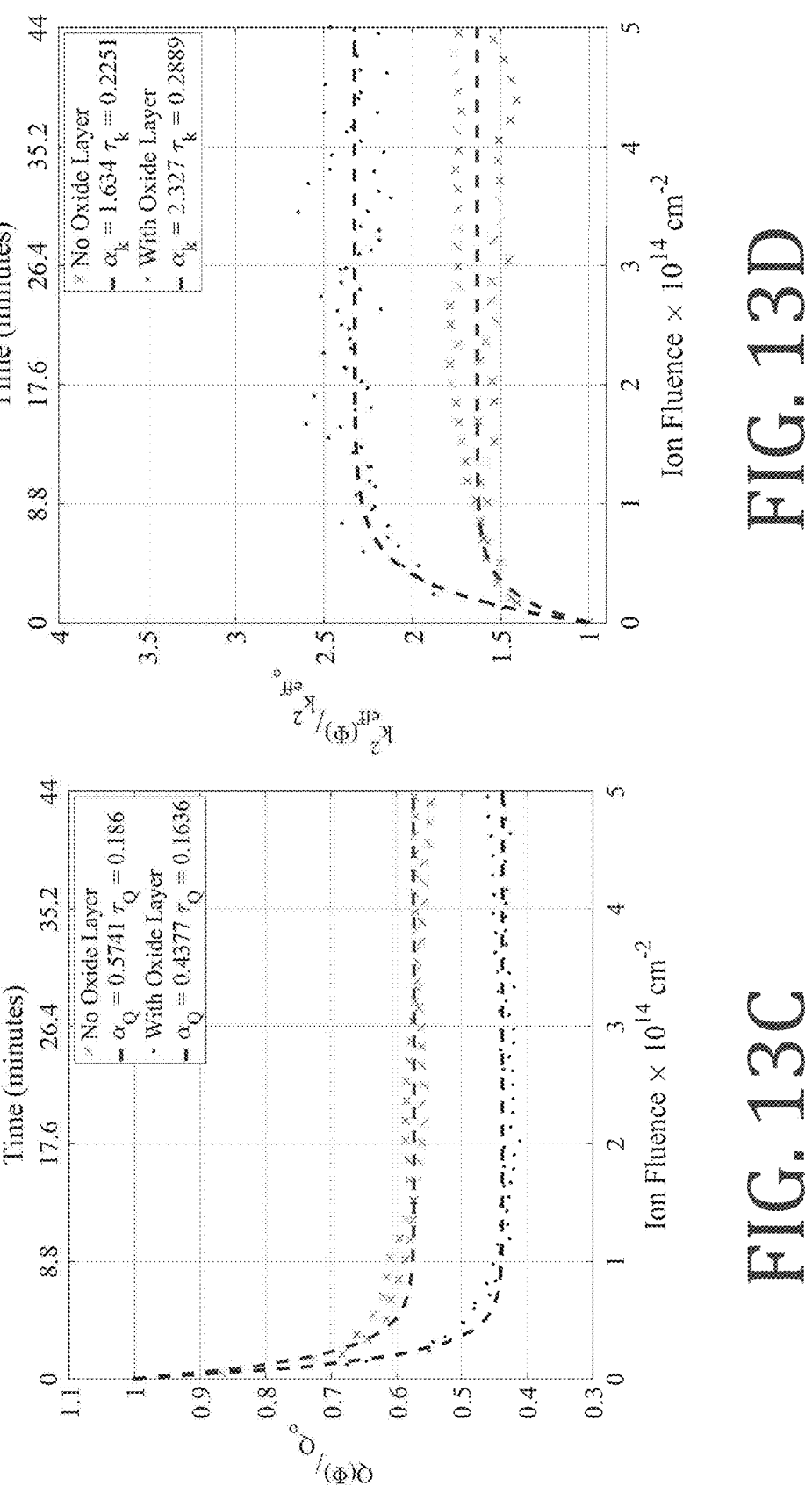
Figure 14A:
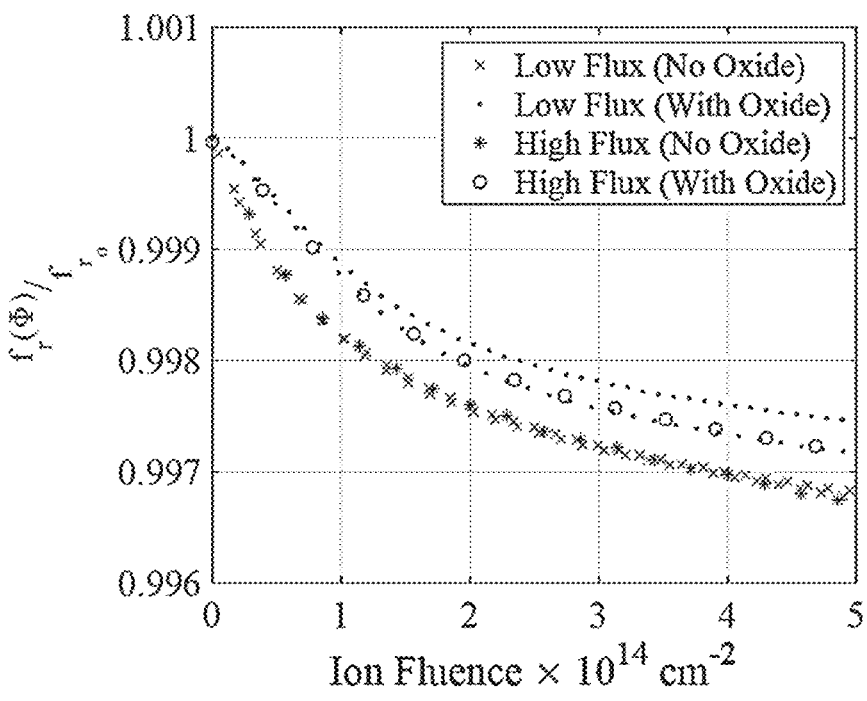
FIGS. 14A-14D graphically illustrate the measured fractional shifts for the fundamental frequency, the motional resistance, the quality factor, and the electromechanical coupling coefficient, respectively, for the resonators of FIGS. 7A and 8A exposed to low flux and high flux of 2 MeV $Si^+$ ions.
Figure 14B:
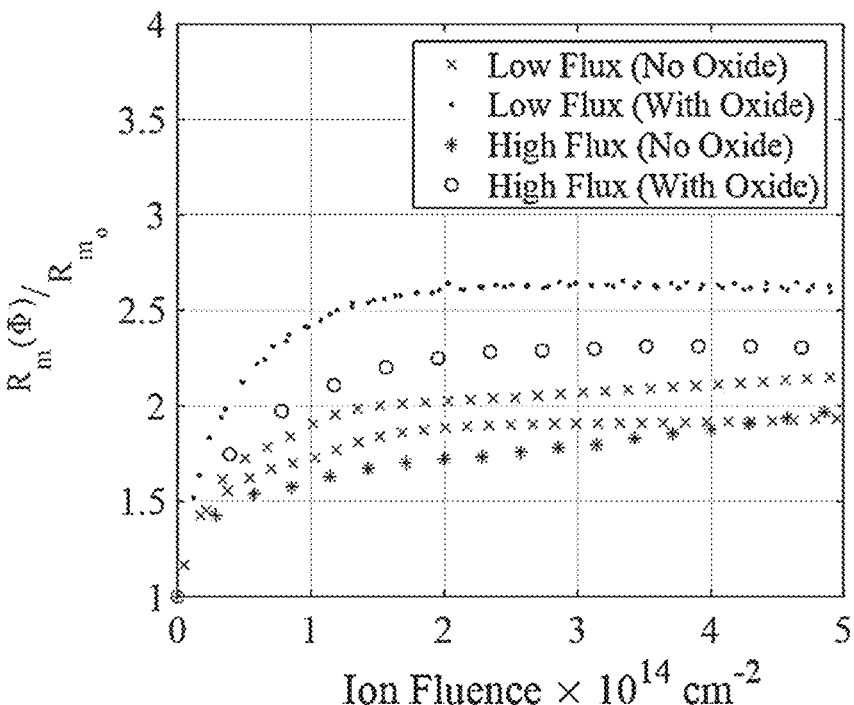
Figure 14C:
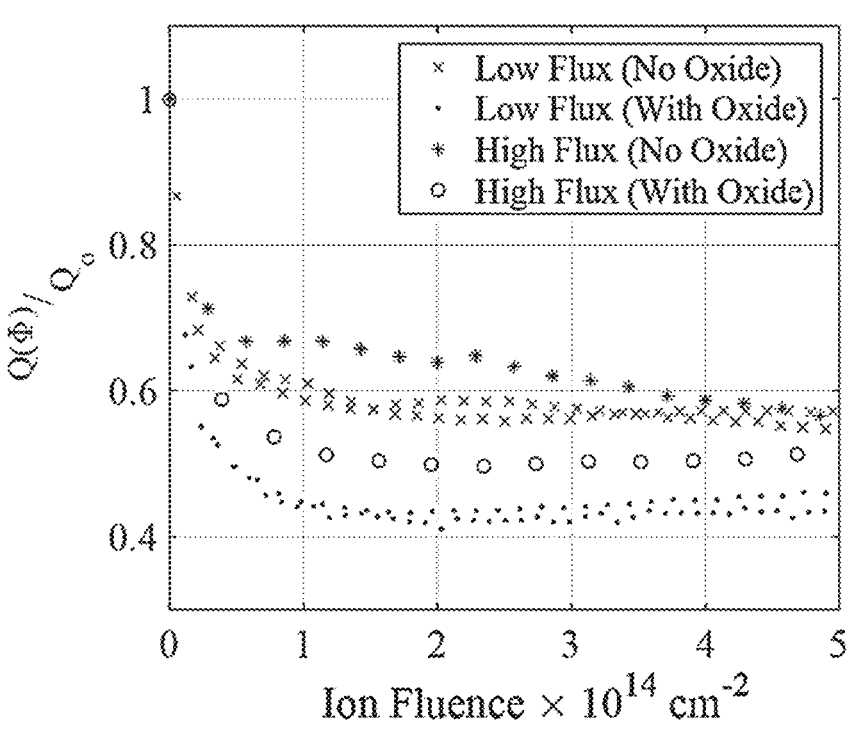
Figure 14D:
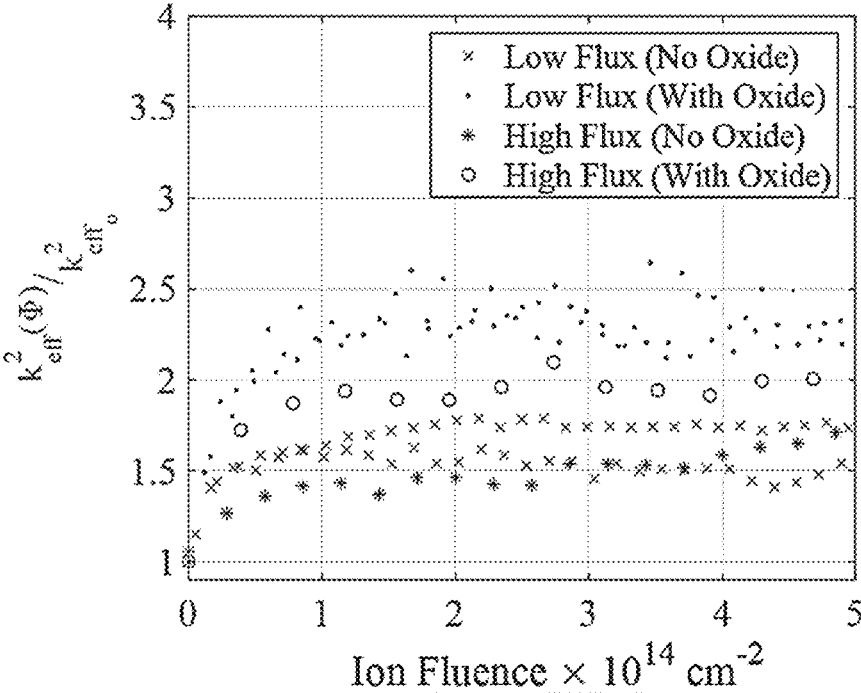

The frequency response of the six resonators at the fundamental WEM mode was recorded during ion irradiation. FIGS. 11A and 11B graphically present the S21 transmission response for resonators 140, 142 as a function of fluence, plotted from an initial zero fluence state. Dashed lines in the figures are projections of $f_r$ and IL. From this example, the decaying exponential behavior of the resonator characteristics starts to become apparent.

FIGS. 12A-12D graphically illustrate values of $f_r$, R$_m$, Q, and one port $$k_{eff}^2,$$

respectively, for the resonators 140, 142 (x's and dots, respectively) after irradiation to a fluence of $5\times10^{14}$ cm$^{-2}$ at a flux of $1.9\times10^{11}$ cm$^{-2}$s$^{-1}$. The expected decaying exponential characteristic of R$_m$, Q, and $$k_{eff}^2$$

can be seen clearly in these data.

Fractional shift of the parameters is of the form $X(\Phi)/X_0$ where $X(\Phi)$ is the measured value at fluence $\Phi$ and $X_0$ is the pre-irradiation value and are graphically illustrated in FIGS. 13A-13D. These data were fit to Equation 7 and corresponding damage coefficients are presented. The decay constant, $\tau$, was reasonably consistent across parameters—that is there was little difference in decay time between device designs. However, the magnitude of the change differed significantly. During the course of irradiation, a reduction in the fundamental resonant frequency was observed, amounting to about 0.3% across both resonators 140, 142. Resonator 140, lacking an oxide layer, exhibited a doubling of motional resistance, a decline in quality factor by more than 42%, and an increase in single port $$k_{eff}^2$$

by more than 1.6 times. Conversely, resonator 112 having the oxide film 122 demonstrated a more than 2.6 fold increment in R$_m$, while Q was reduced by more than half. Nonetheless, the $$k_{eff}^2$$

for the resonator 112 still increased by over two-fold.

Example 2

Two additional resonators (again, one of each design) 140, 142 were irradiated using the above-described procedure at a higher flux. The resonators 140, 142 were irradiated up to $5\times10^{14}$ cm$^{-2}$ at a rate of $4.7\times10^{11}$ cm$^{-2}$s$^{-1}$. The data are presented in FIGS. 14A-14D. There is little difference in the behavior of $f_r$ at the higher flux. However, the magnitude of the fractional shift is less for all other measured parameters at the higher flux, as can be seen in Table 3, below.

TABLE 3

| Parameter | | $f_r$ Low flux | $f_r$ High flux | R$_m$ (2 port) Low flux | R$_m$ (2 port) High flux | Q (2 port) Low flux | Q (2 port) High flux | $k_{eff}^2$ (1 port) Low flux | $k_{eff}^2$ (1 port) High flux |
|---|---|---|---|---|---|---|---|---|---|
| No SiO$_2$ | α | 0.9969 | 0.9968 | 1.991 | 1.851 | 0.5741 | 0.618 | 1.634 | 1.506 |
| layer | τ | 1.243 | 1.354 | 0.4821 | 0.759 | 0.186 | 0.2234 | 0.2251 | 0.2752 |
| With SiO$_2$ | α | 0.9971 | 0.997 | 2.620 | 2.294 | 0.4377 | 0.5066 | 2.327 | 1.959 |
| layer | τ | 1.846 | 1.866 | 0.4068 | 0.5188 | 0.1636 | 0.202 | 0.2889 | 0.3306 |

The α values indicate that the full fractional shift is less than that from the low flux experiments. Furthermore, the decay constant, t, is larger for the higher flux for the R$_m$, Q, and $$k_{eff}^2$$

parameters. Finally, the device with the oxide layer continued to be well described by Equation 7. The resonator 140 without the oxide layer has a rapid exponential decay up to a fluence of $0.5\times10^{14}$ cm$^{-2}$ followed by a linear decay that is attributable to the higher flux increasing the thermal energy within the device. The annealing rate increases as thermal energy is increased, as well described by the Arrhenius equation. The results observed in this experiment are similar to those conducted for polymers under irradiation at different fluxes. The magnitude of the change to many mechanical properties due to radiation to a specified dose or fluence was less at higher rates than at lower rates.

Following irradiation, by 2 MeV Sit ions at $1.9\times10^{11}$ cm$^{-2}$s$^{-1}$ up to the $5\times10^{14}$ cm$^{-2}$ total fluence, the two resonators 140, 142 (again, one of each design) were kept in the vacuum chamber 98 under vacuum at room temperature to measure recovery. The results are presented in FIGS. 15A-15D. Presented are the change in parts per million (ppm) or percent of the parameter value at the end of irradiation. In this case, recovery is also well described by the decaying exponential model: $\alpha(1-e^{-1/r})$.

The changes in the performance of resonators 140, 142 following exposure to various fluxes of silicon ion irradiation and subsequent room-temperature recovery, were quantitatively assessed. This evaluation involved measuring the fractional shifts in the resonant frequency, motional impedance, quality factor, and electromechanical coupling coefficient of the resonators. The results of these measurements are summarized in Table 4.

TABLE 4

| | Low flux $(1.9 \times 10^{11}\ cm^{-2}s^{-1})$ | | High flux $(4.7 \times 10^{11}\ cm^{-2}s^{-1})$ | | 30 min Room Temp Recovery | |
|---|---|---|---|---|---|---|
| | With Oxide | Without Oxide | With Oxide | Without Oxide | With Oxide | Without Oxide |
| $\dfrac{\Delta f}{f_0}$ | −0.27% | −0.31% | −0.28% | −0.32% | 0.324 ppm | 0.434 ppm |
| $\dfrac{\Delta R_m}{R_{m_0}}$ | 261.90% | 199.10% | 233.10% | 199.10% | −15.74% | −9.95% |
| $\dfrac{\Delta Q}{Q_0}$ | −56.23% | −42.59% | −47.40% | −42.60% | 2.84% | 1.38% |
| $\dfrac{\Delta k^2_{eff}}{k^2_{eff_0}}$ | 232.70% | 163.40% | 199.90% | 173.70% | −0.18% | −0.10% |

The thermal effects of the irradiation are decoupled from the results. It has been shown that the thermal effects on these devices are reversible and have minimal hysteresis. AlN is highly resistant to thermal spike damage, and the thermal spikes are insufficient to melt Si. The slight post-irradiation recovery shows that the thermal effects are minimal compared to the effects of atomic displacement damage.

Figure 16A:
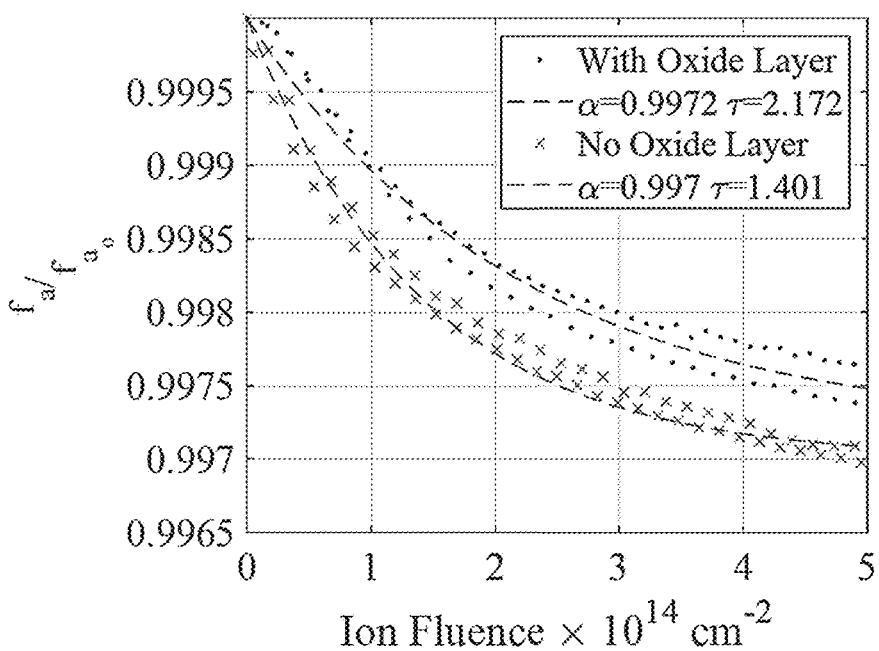
FIGS. 16A-16D graphically illustrate fractional shift in measured anti-resonance frequency, extracted fractional shift to the product of $E_{piezo}d_{31}$, extracted fractional shift to $L_m$, extracted fractional shift to $C_m$, respectively, for the resonators of FIGS. 7A and 8A.
Figure 16B:
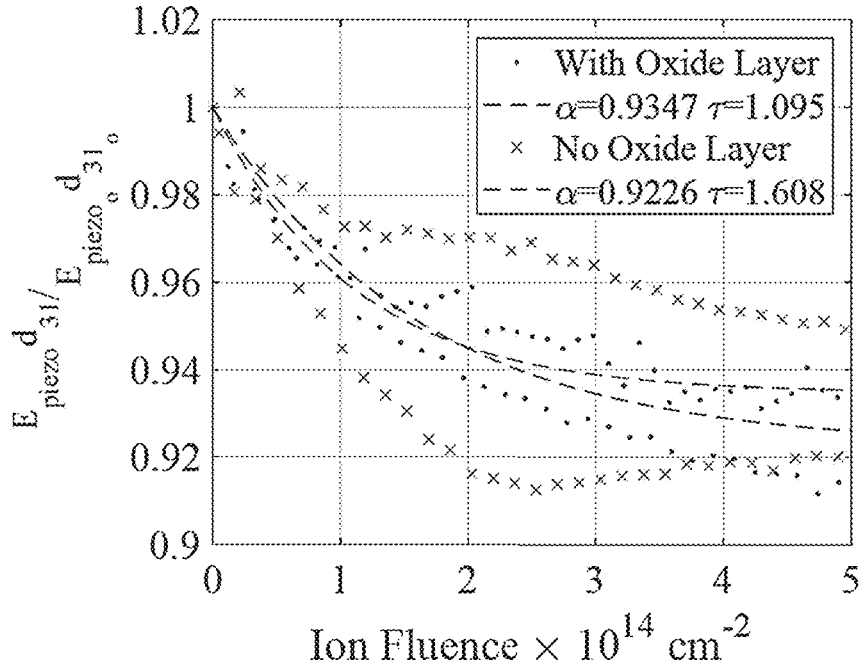
Figure 16C:
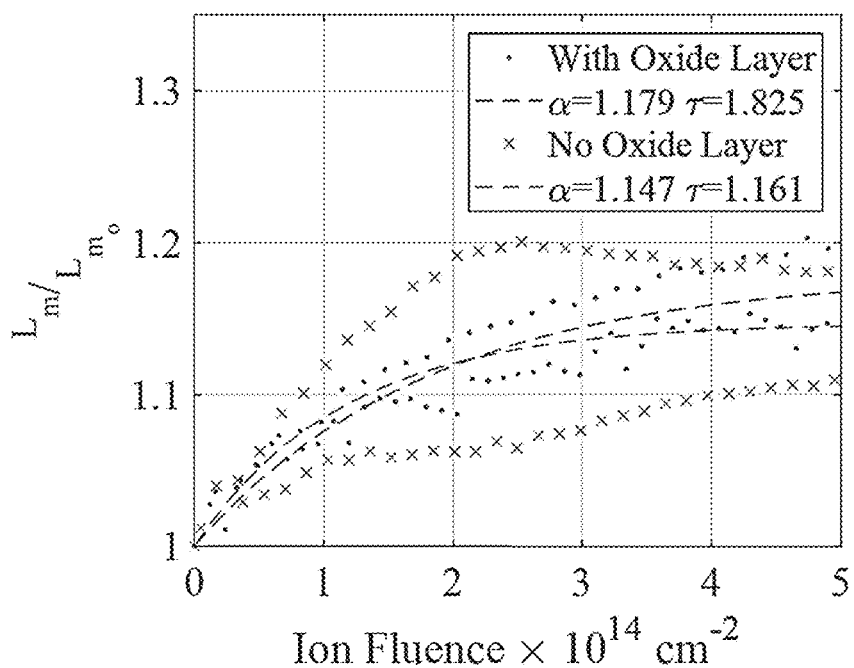
Figure 16D:
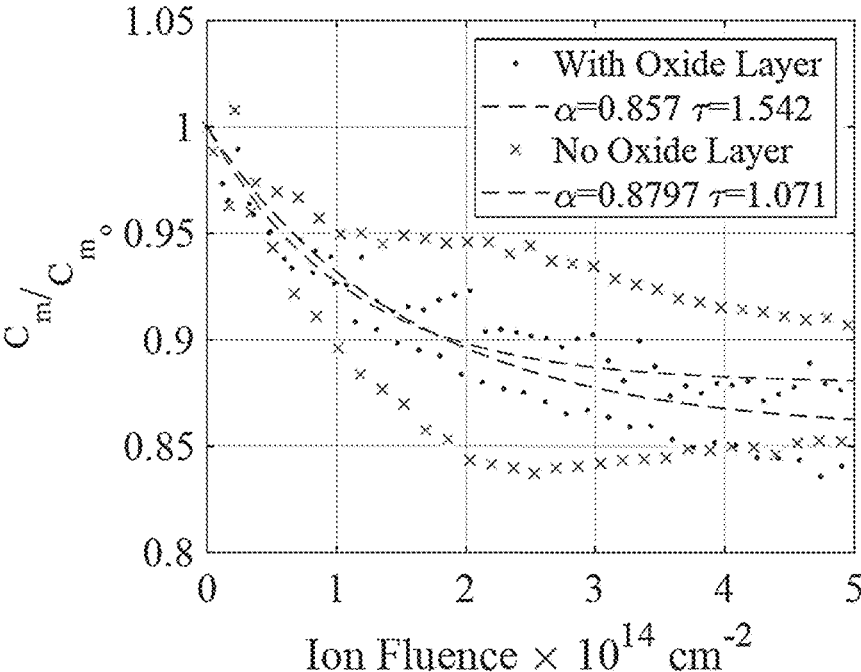

To explore the physical changes, the fractional changes to the anti-resonance frequency ($f_a$), $L_m$, $C_m$, and the product $E_{piezo}d_{31}$ during irradiation were extracted. The results are presented in FIGS. 16A-16D. For both device designs, the shift of $f_a$ was slightly slower and of less magnitude to $f_r$. Examining the product $E_{piezo}d_{31}$ in FIG. 16B illustrates that the magnitudes of the fractional shift and decay time are remarkably similar, albeit the device without the oxide layer experiences more significant variance in results. This similarity supports the TRIM simulation data presented in FIGS. 10A and 10B. The effects caused by the $Si^+$ ions in the AlN layer may be considered uniform between the two device designs. The increase in motional inductance, $L_m$, is equivalent to an increase in the effective mass of an equivalent spring-mass-damper system. The decrease to motional capacitance, $C_m$, is akin to an increase in the effective spring constant of the equivalent spring-mass-damper system.

The amorphous silicon dioxide layer experiences less disruption due to irradiation-induced atomic displacement since it is intrinsically amorphous. This characteristic bestows upon it a certain stability, leading to more consistent radiation responses in resonators that include this oxide film. In contrast, resonators without the amorphous oxide layer, which originally comprise crystalline silicon, undergo more pronounced atomic displacement or amorphization. This condition makes such devices more susceptible to variance in their radiation response.

The one port static capacitance, $C_s$, may be extracted using the following:

$$C_s \approx C_m / k^2_{eff}$$

such that the fractional change is:

$$C_s / C_{s_0} = (C_m / C_{m_0})(k^2_{eff_{f_0}} / k^2_{eff}).$$

Figure 15A:
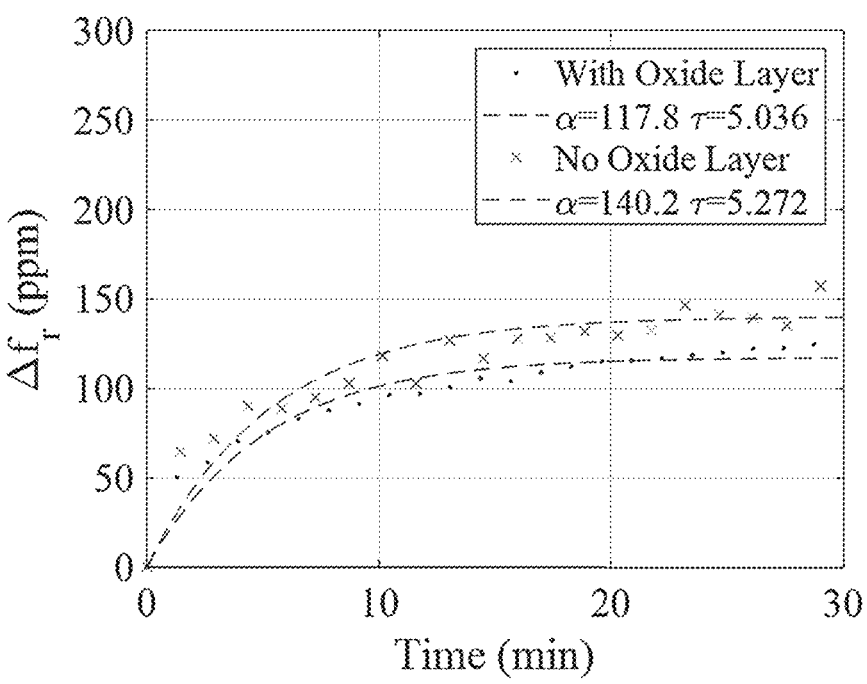
FIGS. 15A-15D graphically illustrate fractional shifts of the measured recovery of resonator parameters of the fundamental frequency, the motional resistance, the quality factor, and the electromechanical coupling coefficient, respectively, for the resonators of FIGS. 6A and 8A exposed high and low flux of 2 MeV $Si^+$ ions.
Figure 15B:
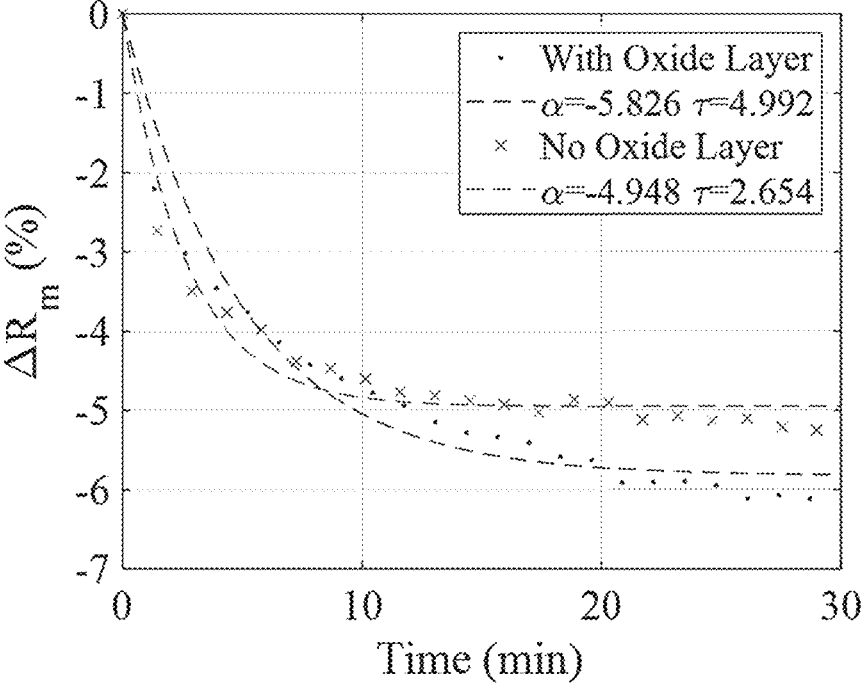
Figure 15C:
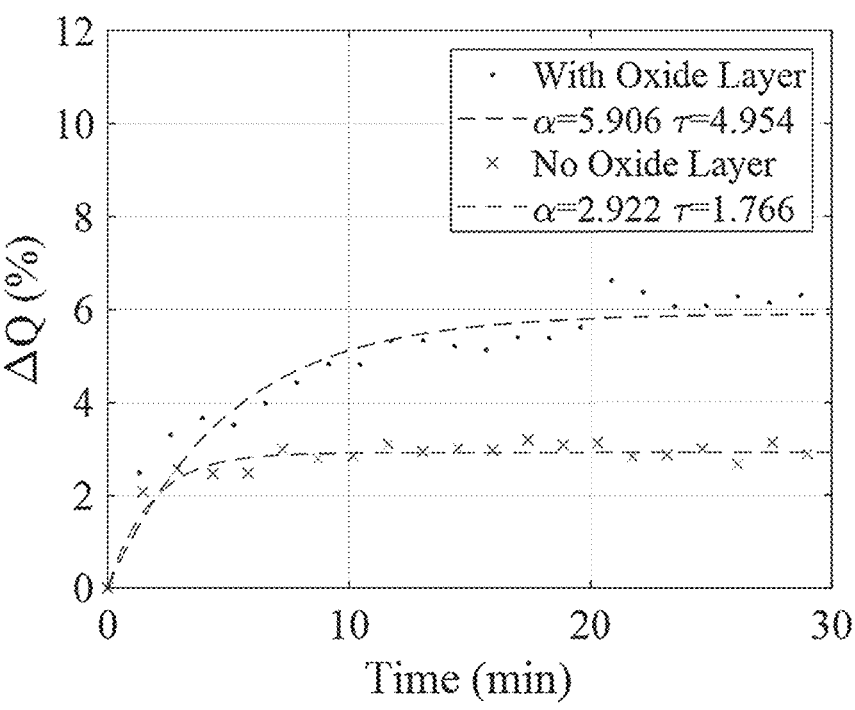
Figure 15D:
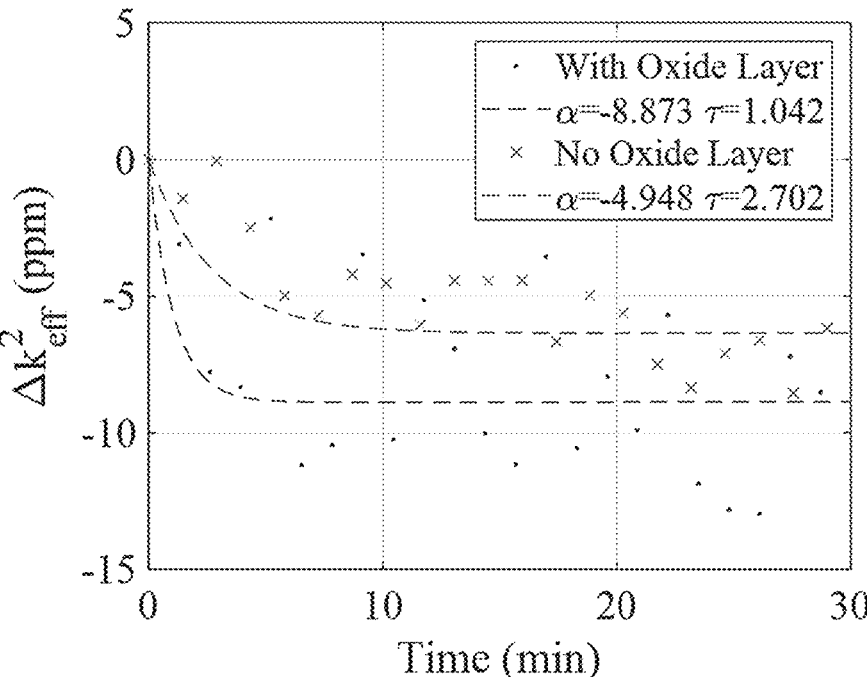

The fractional change to $C_s$ is presented in FIGS. 15A and 15B. The fractional shift to $C_s$ is quite significant compared to the other parameters, most closely resembling the fractional shift to Q. Unlike $f_r$, $E_{piezo}d_{31}$, $L_m$, or $C_m$, the shift to $C_s$ is abrupt and then remains stable. Assuming the change to the device surface area and distance between electrodes is negligible, the most prominent effect is then on the permittivity of the material between the electrodes. Creating Frenkel pairs and defect clusters in the AlN and amorphous $SiO_2$ layers decreases the permittivity constant of the dielectric layers greater than the case where no oxide layer is present. Finally, feedthrough capacitance, $C_{ft}$, represents the system's capacitance when the input frequency is far from the resonant frequency, thereby making the impedance of the series $R_m L_m C_m$ circuit infinite. During irradiation, there was a detectable change in feedthrough capacitance for the device without the oxide layer. However, the device with the oxide layer did not have a measurable change in feedthrough capacitance.

The structural composition of both resonator types was dominated by a silicon device layer of 10 μm thickness. In accordance with the TRIM simulations and material characterizations delineated, anticipate approximately half of the vacancies are expected to manifest in the AlN layer 144, 146 while about 10% are expected in the silicon or oxide layer.

These projections result in only minor fluctuations in the acoustic velocities of both types of resonators pre- and post-irradiation. As a result, only marginal shifts were recorded in the resonant frequency for both types of devices—those with and without oxide layers—as were graphically reported in FIGS. 13A-14D and summarized in Table 4.

Figure 18:
FIG. 18 is an image of an ion beam superimposed over a resonator, illustrating a location of Raman and EBSD (electron backscatter diffraction) analysis.
Figure 19:
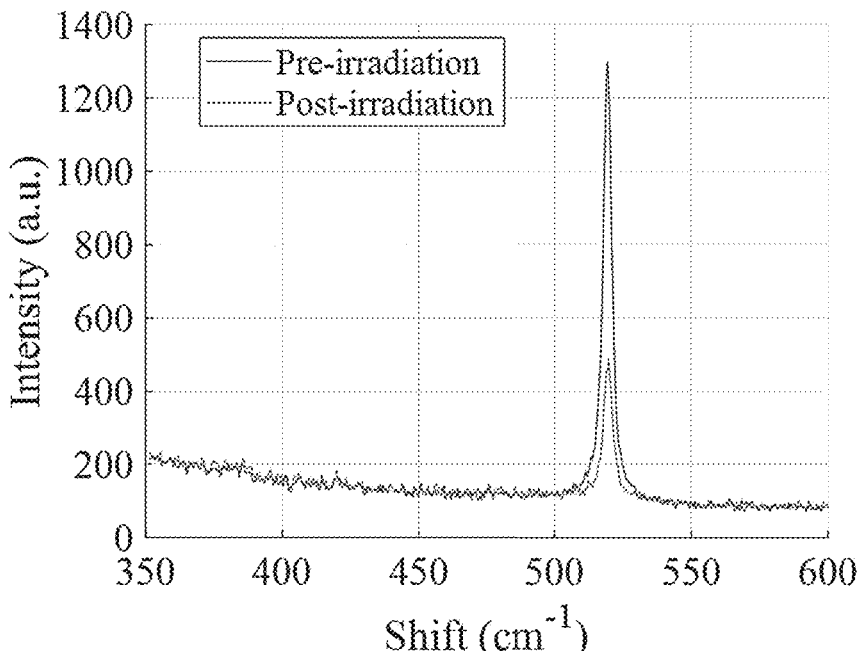
FIG. 19 is an average Raman spectra of n-Si pre- and post-irradiation.

Material characterizations, including Raman spectroscopy, Electron Backscatter Diffraction ("EBSD"), and Transmission Electron Microscopy, were performed pre- and post-irradiation. Prior to Raman and EBSD analyses, the samples were cleaned using a 30 sec acetone rinse, a 30 sec methanol rinse, and then blow-dried using nitrogen. An image of the ion beam superimposed over the target device is shown in FIG. 18. The dark areas, indicated by arrows in the figure, are n-Si exposed to the ion beam. The Raman spectra were done using a 532 nm laser. The average pre-(blue) and post-(red) irradiation spectra are shown in FIG. 19. The non-irradiated n-Si exhibited a significant peak at 521 cm$^{-1}$, which is typical of highly crystalline Si. As crystalline Si is amorphized, the 521 cm$^{-1}$ peak shrinks and a broad band forms, centered at 480 cm$^{-1}$. Post-irradiated n-Si exhibited a peak of significantly smaller intensity at 521 cm$^{-1}$, but no broad peak 480 cm$^{-1}$. Therefore, there was evidence to support the occurrence of some dislocation damage, but far from enough to consider the material near amorphous.

Figure 20:
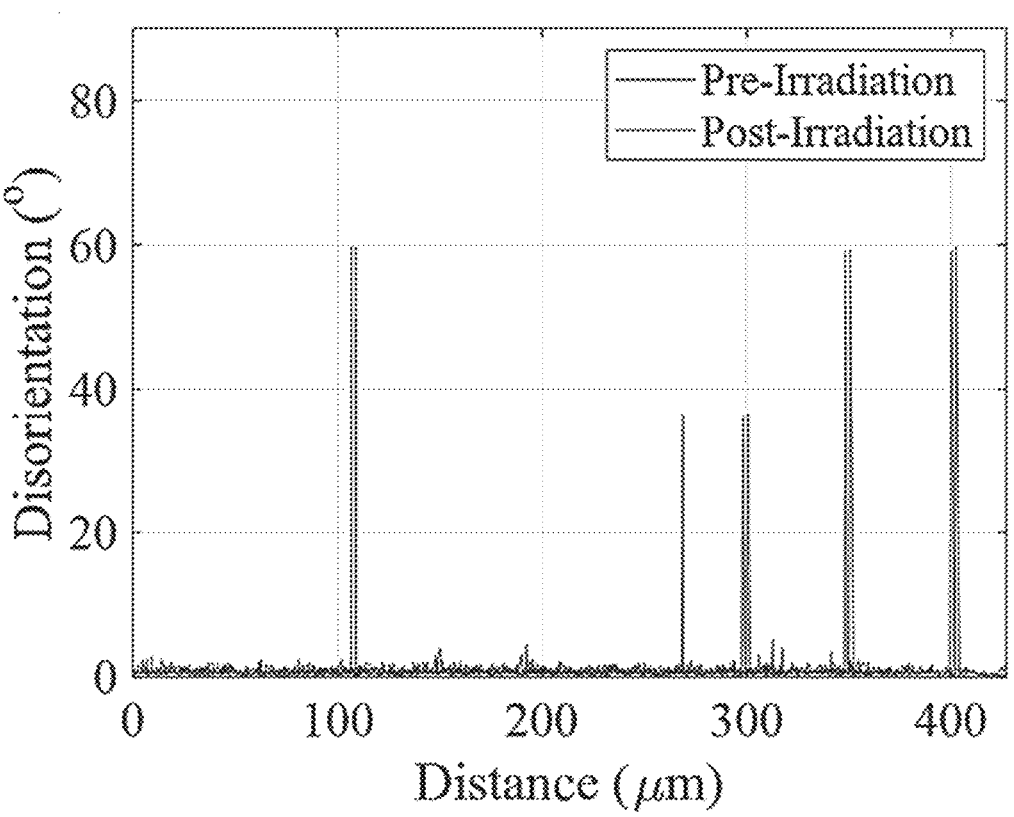
FIG. 20 is an average EBSD disorientation analysis of surface silicon pre- and post-irradiation.
Figure 21A:
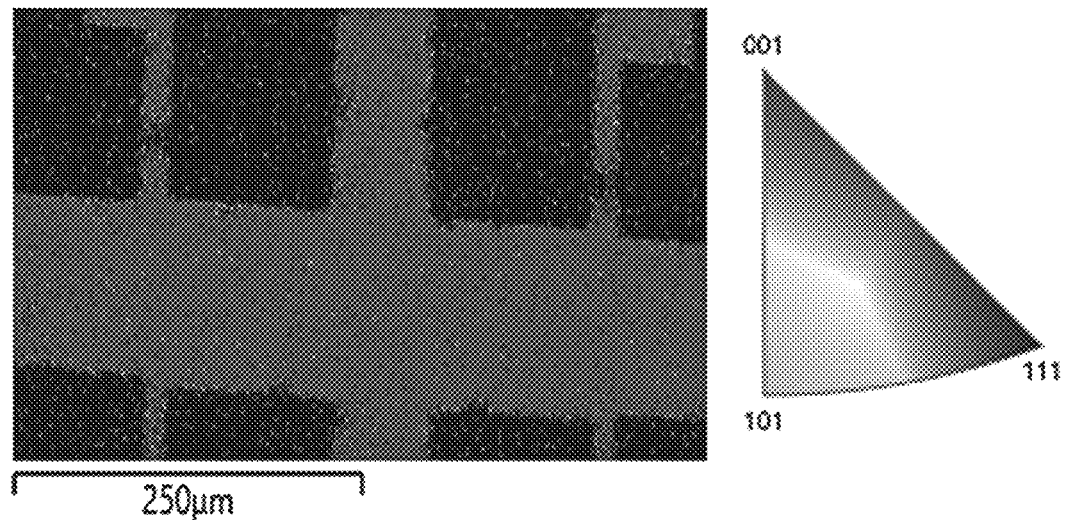
FIGS. 21A and 21B are EBSD obtained IPF-Z (incremental pole figure) maps of surface silicon pre- and post-irradiation, respectively, with surface silicon shown in red.
Figure 21B:
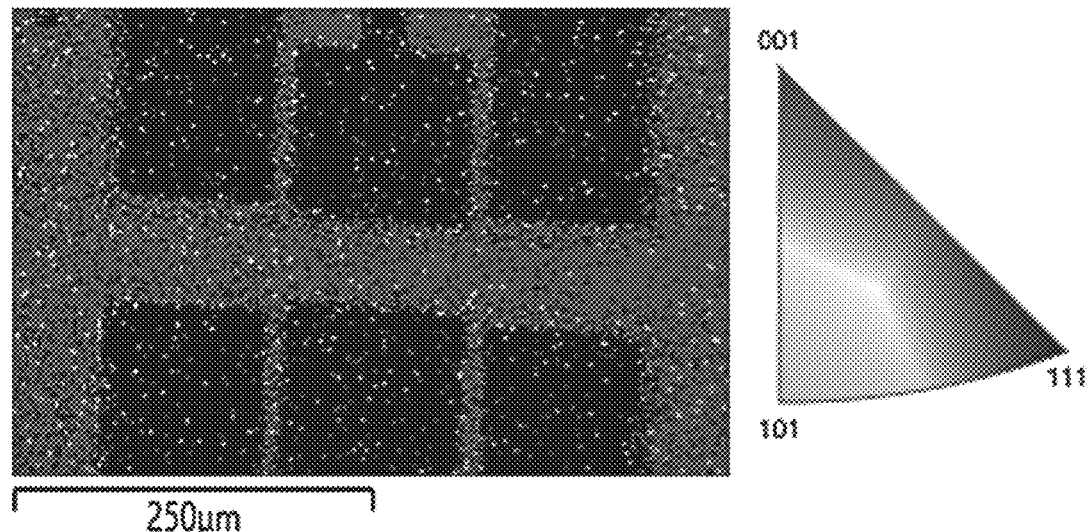

EBSD analysis provided insight into the defected near-surface of the irradiated silicon. EBSD was perforce on the exposed surface n-Si away from the resonators, indicated by black arrows in FIG. 18. EBSD was collected using an Oxford Instruments Symmetry S3 detector coupled with AZtecHKL data acquisition software. Electron beam acceleration voltage was 20 kV, probe current was 2.2 nA, working distance was 13.3 mm, and acquisition rate was approximately 920 Hz. EBSD analysis was performed using AZtecCrystal. Disorientation/texture analysis demonstrated a degree of alignment of crystal lattices detected in the sample. The incremental change plot of FIG. 20 presented the average of 6-line scans of the surface of the samples. The plot shows some evidence of crystallographic changes to the surface silicon post-irradiation. Incremental pole figures (IPF-Z) obtained from EBSD also provided awareness into the level of disorientation in the surface silicon. FIGS. 21A and 21B show the IPFs for unirradiated and irradiated samples, respectively. While some carbon contamination was still present on the post-irradiation sample after cleaning, EBSD provide some insight into the effects of the Si$^+$ ion irradiation to the surface of the n-Si substrate.

Figure 22:
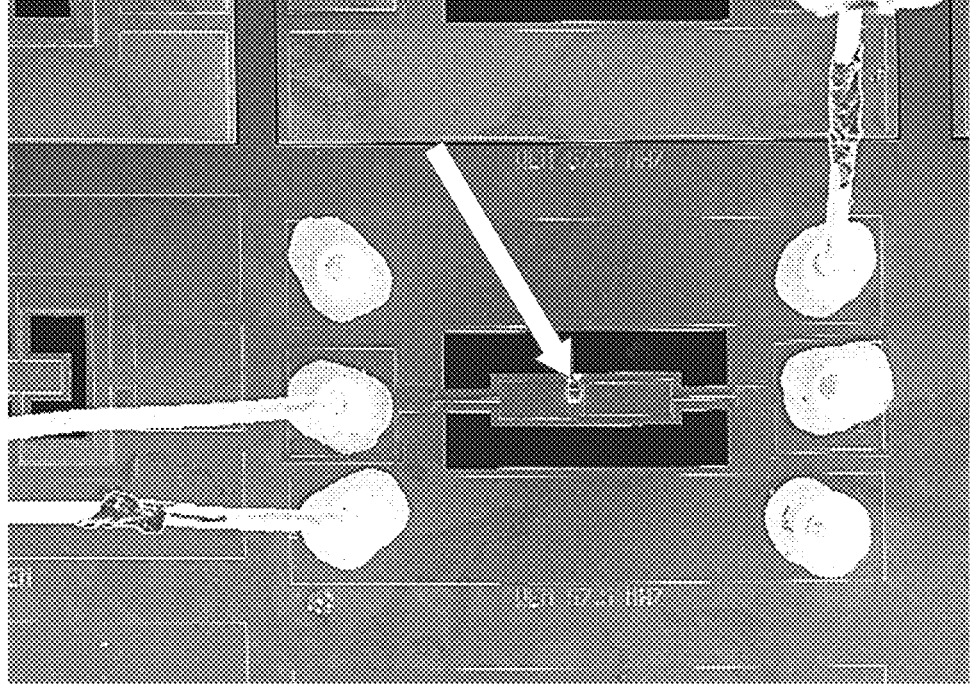
FIG. 22 is a SEM micrograph of an FIB (focused ion beam) liftout location.
Figure 23A:
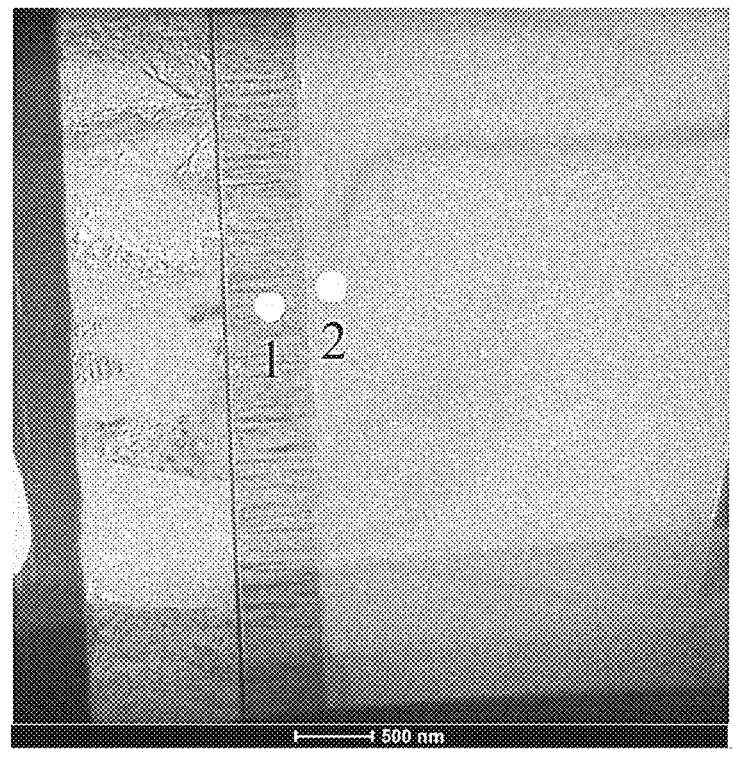
FIG. 23A is a cross-sectional image of the resonator of FIG. 7A.
Figure 24A:
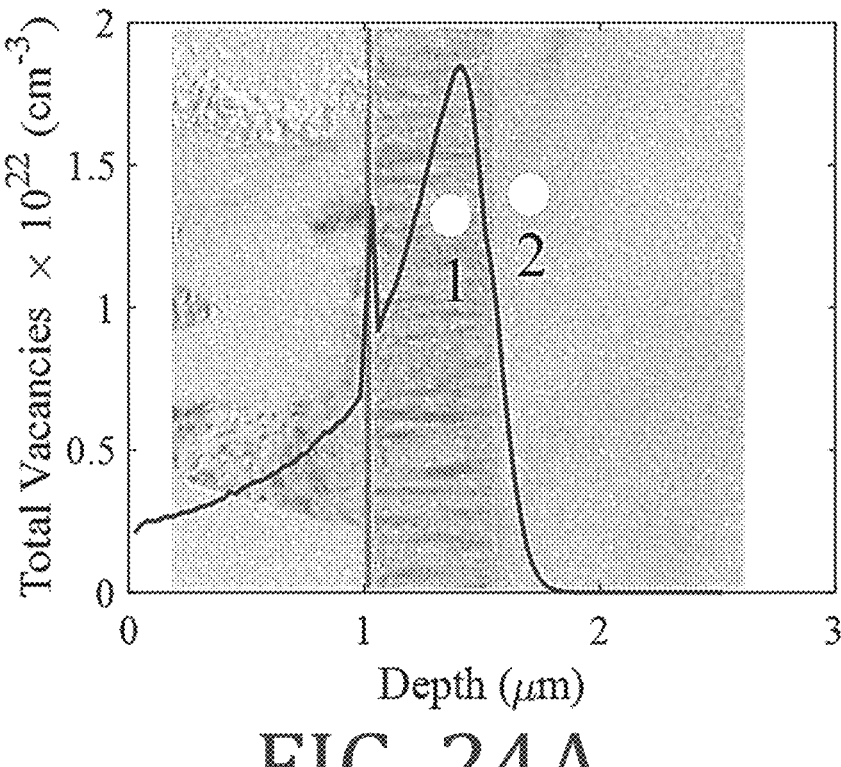
FIG. 24A is the cross-sectional image of FIG. 23A with superimposition of the TRIM simulation results thereon.
Figure 23B:
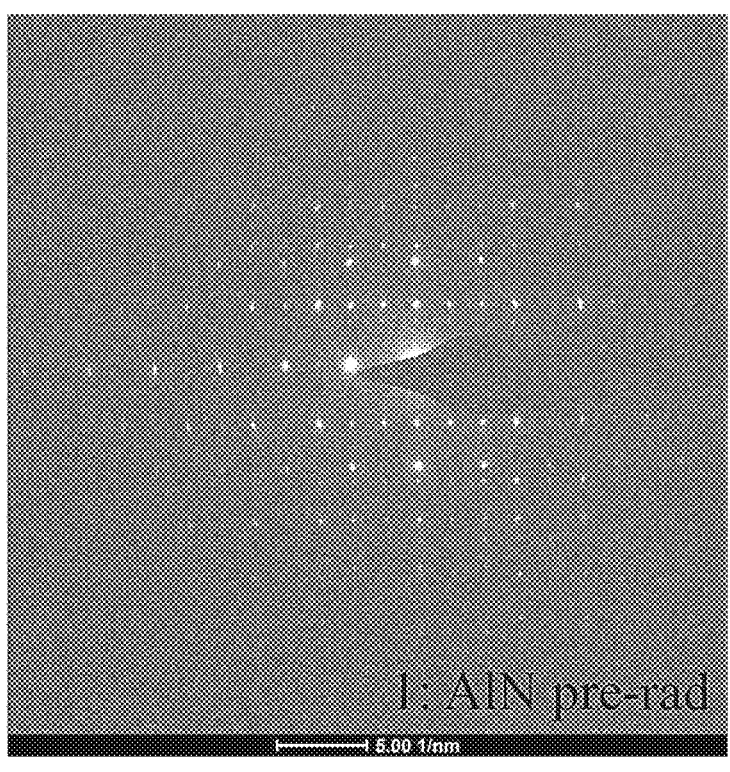
FIGS. 23B, 23C, 24B, and 24C are images of the TEM analysis of the transduction layer (FIGS. 23B and 24B) and the n-type layer (FIGS. 23C and 24C) pre-(FIGS. 23B and 23C) and post-(FIGS. 24B and 24C) irradiation.
Figure 24B:
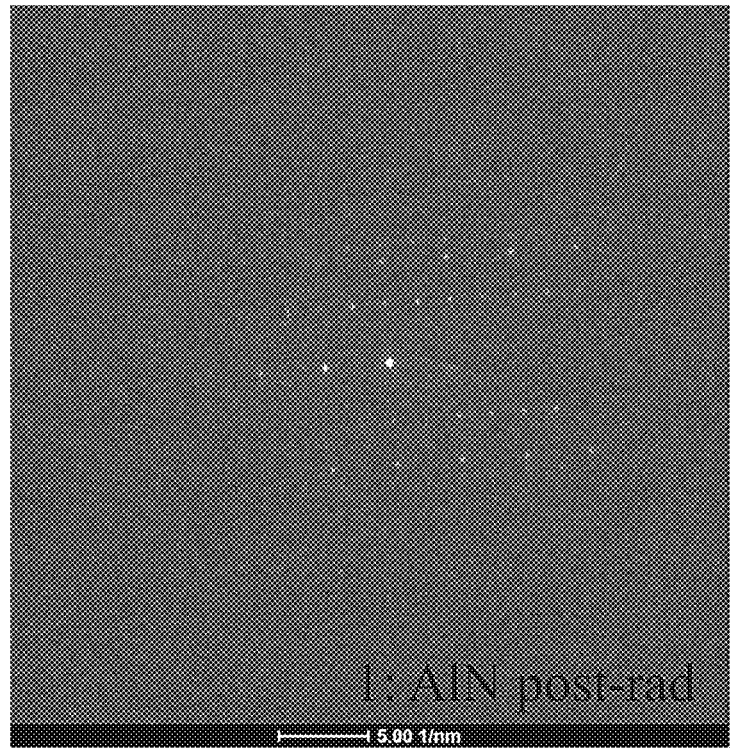
Figure 23C:
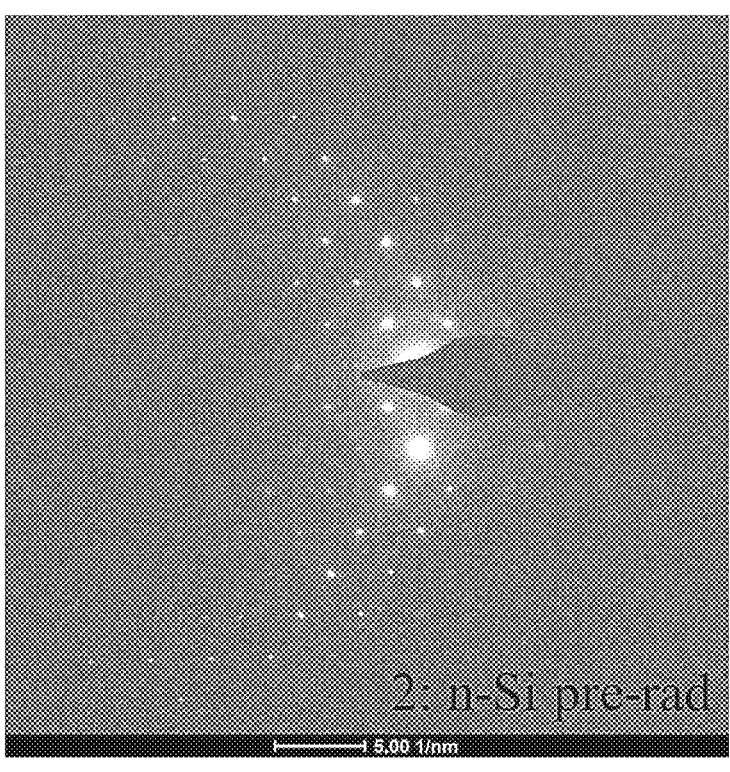
Figure 24C:
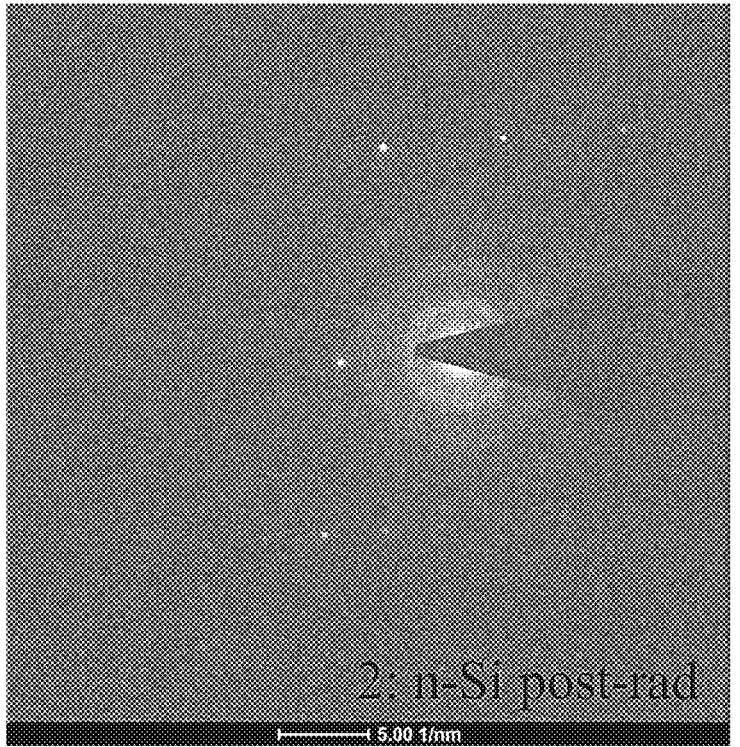
Figures 26A, 26B, 26C:
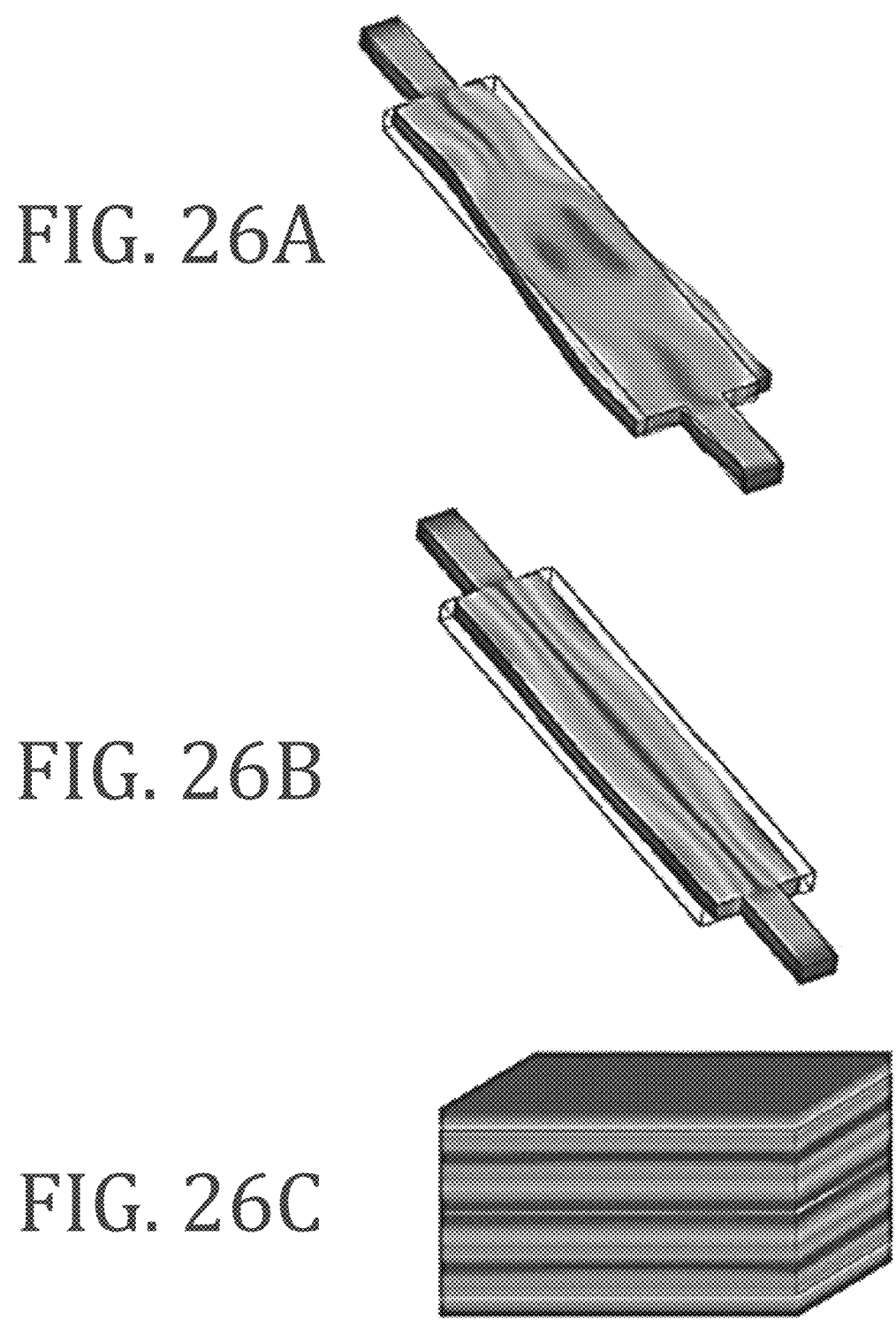
Figures 27A, 27B, 27C:
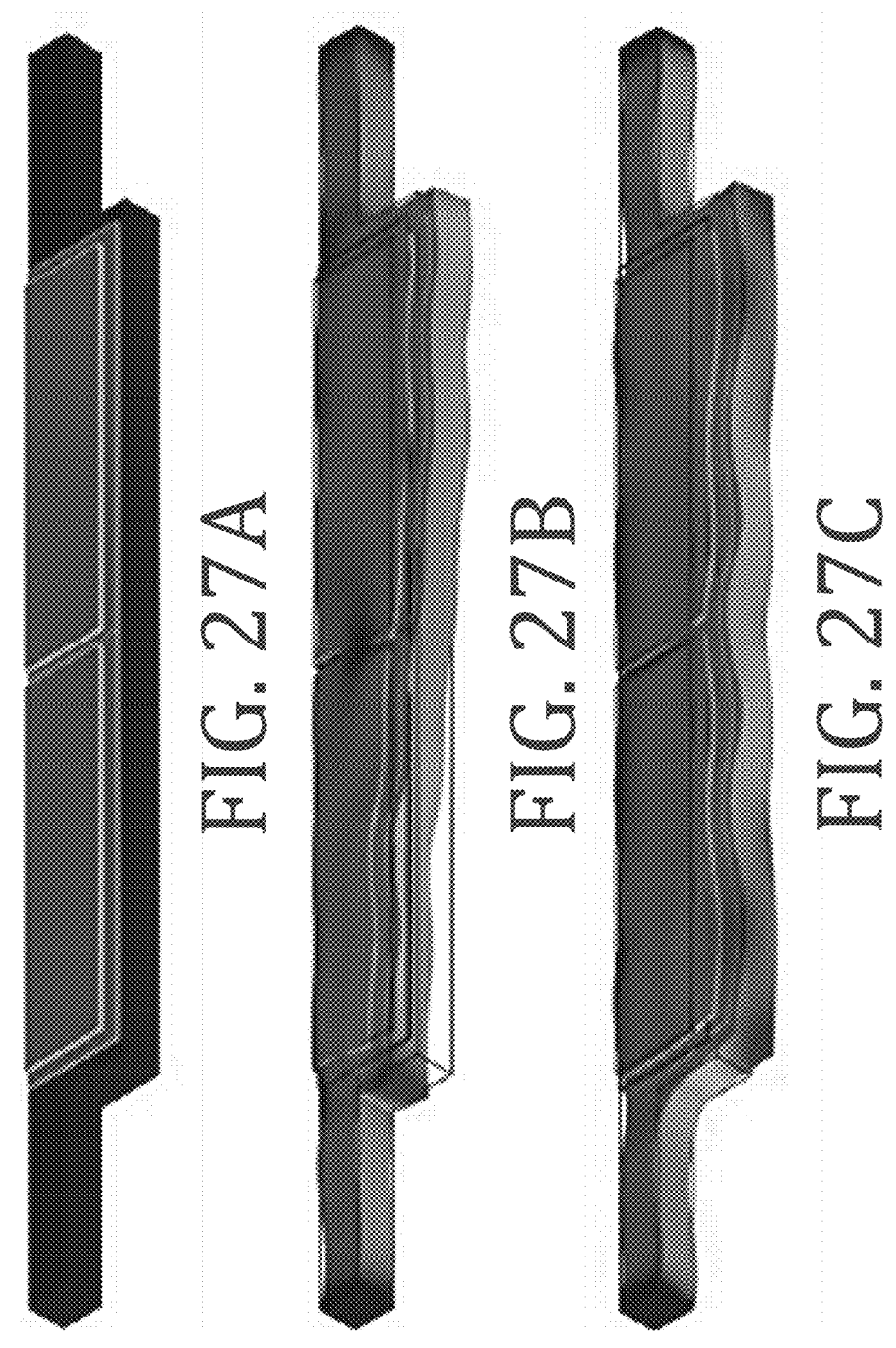
FIGS. 27A-27C illustrate three-dimensional FEA models for the resonator of FIG. 7A undeformed, for the second CM, and for the first WEM, respectively.
Figures 28A, 28B, 28C:
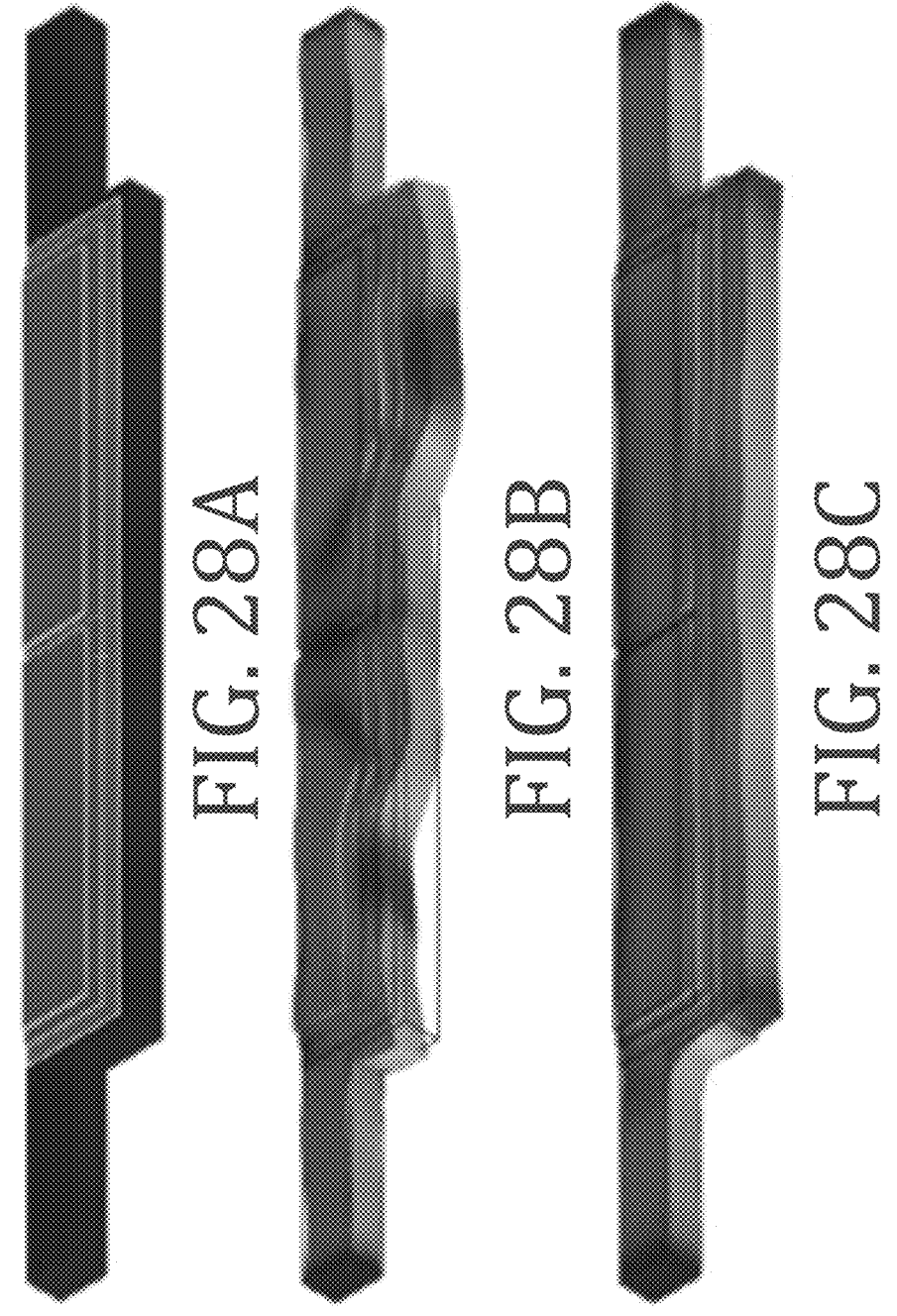
FIGS. 28A-28C illustrate three-dimensional FEA models for the resonator of FIG. 8A undeformed, for the second CM, and for the first WEM, respectively.

Transmission electron microscopy (TEM) analysis was performed on pre- and post-irradiated samples. TEM samples were made via a focused ion beam (FIB) liftout process with a Scios 2 DualBeam FIB using a Ga ion beam operated at 30 kV with final thinning at 5 kV. A SEM micrograph of the TEM liftout location is provided in FIG. 22. TEM analysis was performed with a FEI Titan ETEM G2 operated at 300 kV. An example of the analysis is provided in FIGS. 23A-24C. FIGS. 23A-23C indicate a pristine (pre-irradiation) sample; FIGS. 24A-24C indicate a post-irradiation sample. The TRIM results are superimposed on the cross-section image (FIG. 24A). The images provide an indication of a decrease in long-range order of the crystalline Si and AlN during irradiation. It should be noted that a significant amount of TEM images provided little indication of change to long-range order. Therefore, the change in defect density cause by irradiation was extremely small to be detectable via TEM in a practical sense.

These conducted examinations provide quantifiable indications of the emergence of new atomic defects, triggered by Si$^+$ ion irradiation. These defects contributed to the deterioration of the resonators' quality factors as a function of ion fluence, as shown in FIGS. 13A-14D and summarized in Table 4. Consequently, the reduction in quality factor leads to an increase in the motional resistances of the resonators. This relationship is mathematically substantiated by Equation 2.

Figures 17A, 17B:
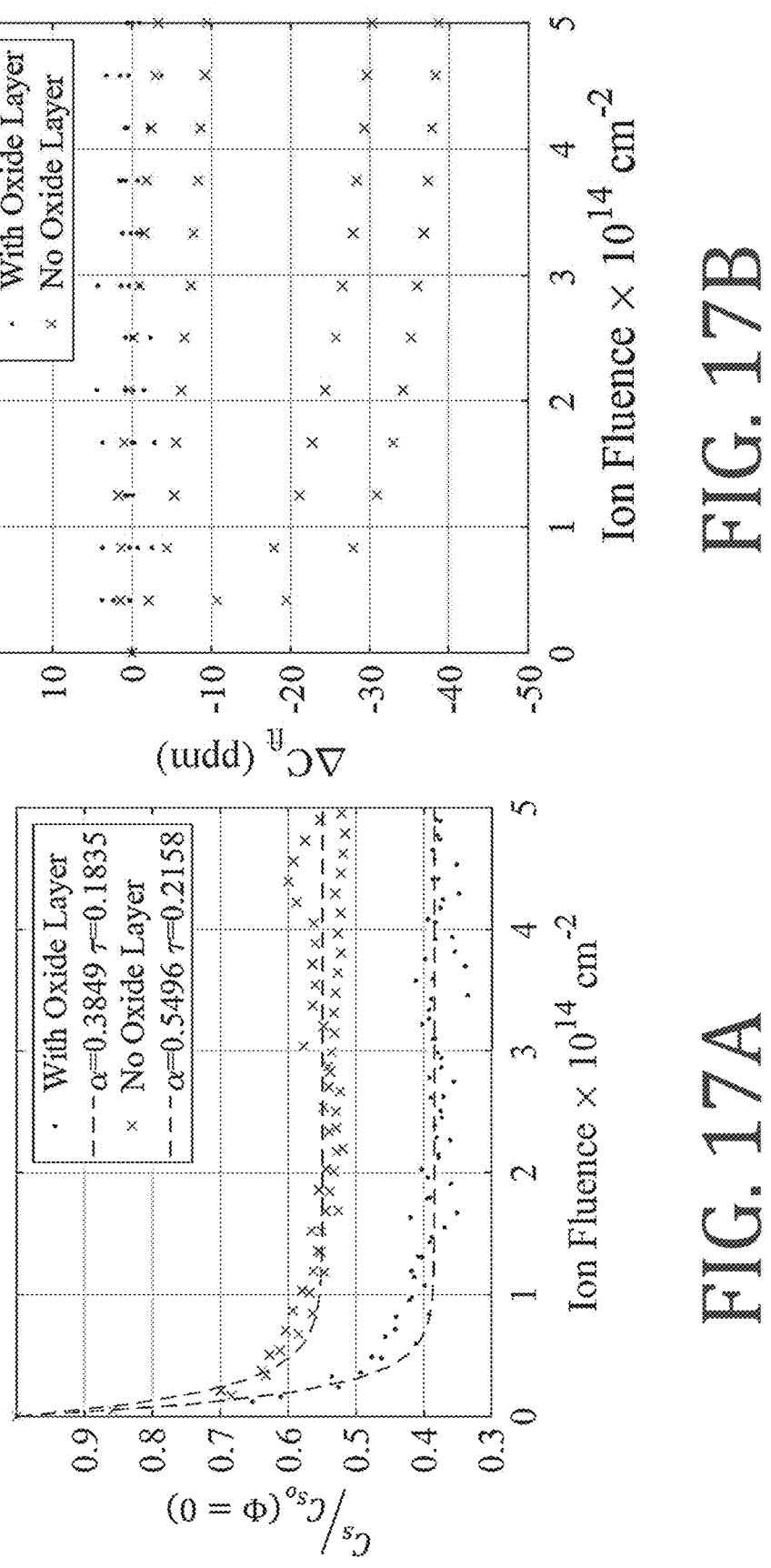
FIGS. 17A and 17B graphically illustrate fractional shift in measured static capacitance and measured feedthrough capacitance, respectively, for the resonators of FIGS. 7A and 8A.

The impact of Sit ion irradiation extended beyond altering the motional impedances of the resonators; it also affected the inherent static electrical capacitances of these resonators, as demonstrated in FIGS. 17A and 17B. The static capacitance, $C_s$, was inversely proportional to the resonator's electromechanical coupling coefficient. Consequently, a decrease in the static capacitances of the resonators leads to an increase in their electromechanical coupling coefficients.

Overall, the first order differential equation presented in Equation 7 was suitable to describe the change in device behavior due to irradiation. With the exception of $$k_{eff}^2,$$

the decaying exponential fit the data exceptionally well with $R^2$ values better than 0.9. Furthermore, Equation 7 prove adequate at capturing rebound behavior. Analytical analysis supports the conclusion that the change to $f_r$ was predominantly due to changes in the atomic structure caused by Si$^+$ ion irradiation. The implantation of Si$^+$ ions in the dielectric layers altered the effective permittivity of the dielectric layer. Post-irradiation effects were detected via Raman spectroscopy, EBSD, and TEM.

Example 3

Using the same resonators 140, 142, the influence of thin oxide film on TCF (temperature coefficient frequency), Q, motional resistance ($R_m$), and $$k_{eff}^2$$

was determined. The resonators were driven in different BAW modes by applying an RF signal across the top and bottom electrodes thereby activating the $d_{31}$ or $d_{33}$ vibrational modes in the AlN. The specific BAW vibrations investigated in this work are the first WEM, second contour mode (CM), and high overtone TM. The first WEM and second CM vibrations are in-plane and the high overtone TM vibrations are out of the plane. The frequency equation for rectangular plate CM vibrations is given by the transcendental equation:

$$\frac{\cot\left(\alpha\frac{W}{2}\right)}{\cot\left(\beta\frac{W}{2}\right)} = \frac{-2\alpha\beta k^2(1-\mu)}{(\beta^2-k^2)(\alpha^2+\mu k^2)} \quad \text{Equation 13}$$

where $$\alpha^2 = \frac{(1-\mu)\theta^2}{2} - k^2 \quad \text{Equation 14}$$
$$\beta^2 = \theta^2 - k^2$$

19

-continued $$\theta^2 = \frac{2\rho_{eq}\omega^2(1 + \mu_{eq})}{E_{eq}} \qquad \text{Equation 15}$$

$$k = \frac{\pi}{L}$$

and $E_{eq}$, $\rho_{eq}$, and $\mu_{eq}$ are the equivalent Young's modulus, equivalent alent density, and equivalent Poisson's ratio of the material stack suspended in the resonator, respectively. W and L are the width and length of the resonator, respectively, and $\omega$ is the angular frequency. In the case where L>>W, the solution to the resonator CM converges to such that the resonance frequency ($f_r$) can be approximated by:

$$f_r = \frac{\kappa}{2W}\sqrt{\frac{E_{eq}}{\rho_{eq}}} \qquad \text{Equation 16}$$

where $\kappa$ is a dimensionless constant that is dependent upon the mode shape. When $\kappa$ is equal to n, Equation 14 predicts the resonant frequency for the $n^{th}$ WEM vibration. The same approximation may be made for the $n^{th}$ TM vibration by replacing W with thickness, t. Qualitative illustrations of the vibrational modes are presented in FIGS. 23A-24C.

FEA (finite elemental analysis) simulations were accomplished with Ansys Mechanical to predict the resonant frequency and mode shapes using the material properties presented in Table 5. The BAW vibrational modes and their corresponding resonant frequencies are presented in Table 6.

TABLE 5

| Layer | Density (kg m$^{-3}$) | Young's modulus (GPa) | Acoustic Velocity (m s$^{-1}$) |
|---|---|---|---|
| Al | 2700 | 69 | 5055 |
| AlN | 3260 | 325 | 9984 |
| SiO2 | 2465 | 70 | 5325 |
| Si | 2330 | 166 | 8440 |

TABLE 6

| Mode | $f_r$ No Oxide Layer | $f_r$ With Oxide Layer |
|---|---|---|
| $2^{nd}$ CM | 77.08 MHz | 70.68 MHz |
| $1^{st}$ WEM | 78.68 MHz | 72.23 MHz |
| TM$_{-9.65\ GHz}$ | 9.61 GHz | 9.72 MHz |
| TM$_{-10.0\ GHz}$ | 9.98 GHz | 10.04 GHz |
| TM$_{-10.35\ GHz}$ | 10.33 GHz | 10.40 GHz |

Figure 29:
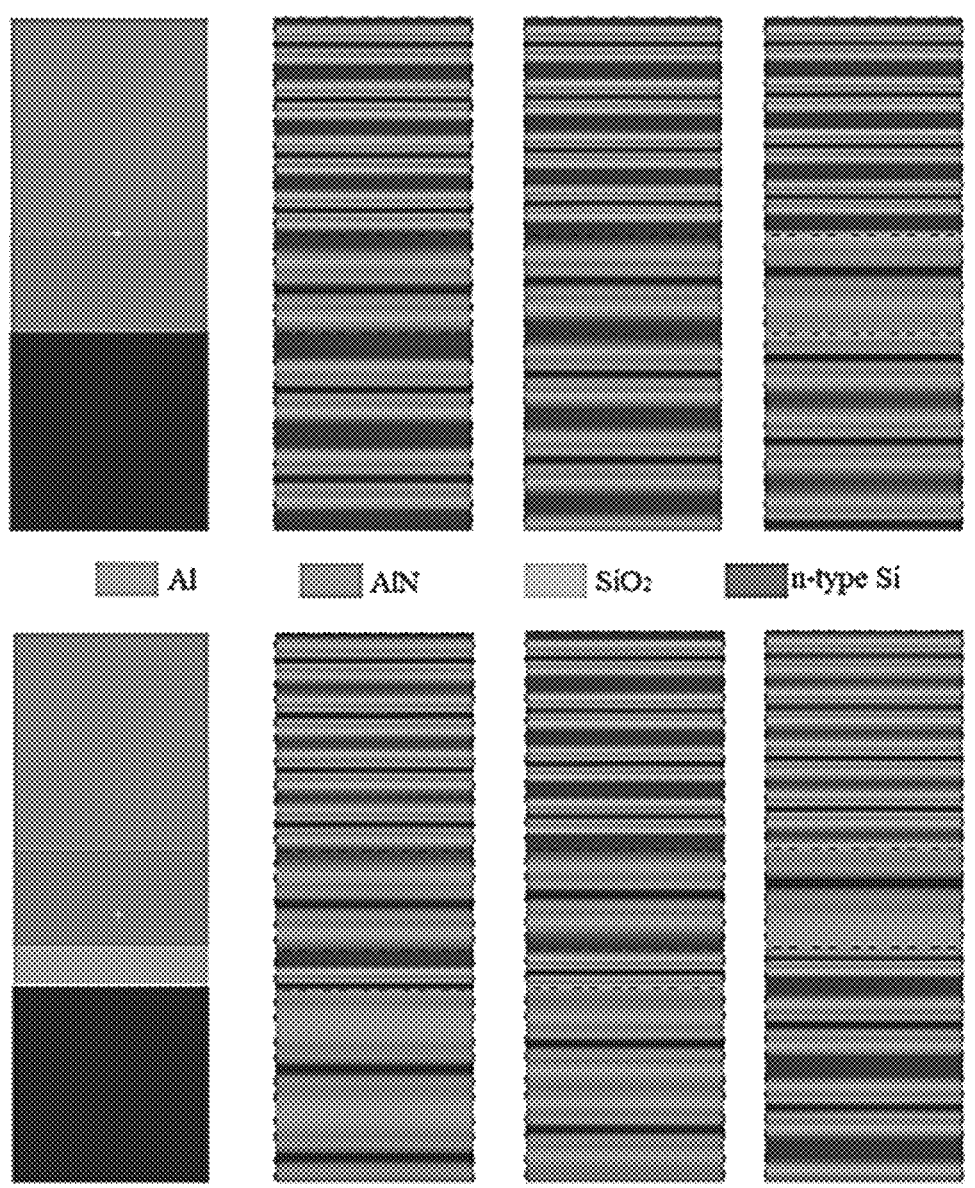
FIG. 29 illustrates two-dimensional FEA models and deformed shapes for high overtone TM vibrations operating in the SHF spectrum; wherein the top row includes models for the resonator of FIG. 7A, and the bottom row includes models for the resonator of FIG. 8A.

To predict the behavior of the second CM and first WEM vibrations, three-dimensional models are used. The three-dimensional models are bisected along the longitudinal line of symmetry for computing efficiency. Frictionless boundary conditions were assigned at the bisection, and fixed boundary conditions were assigned to the ends of the anchors. Illustrations of the three-dimensional FEA models are presented in FIGS. 27A-28C. A two-dimensional FEA model was used to predict the behavior of high overtone TM vibrations. The model represented a cross sectional cut of the rectangular resonator and both ends were constrained by frictionless boundary conditions. Illustrations of the two-dimensional FEA models are presented in FIG. 29. Harmonic analysis was performed and S-parameters are extracted from the calculated stress on the AlN geometry. S21 obtained from FEA results for the second CM and first

20

Figure 30A:
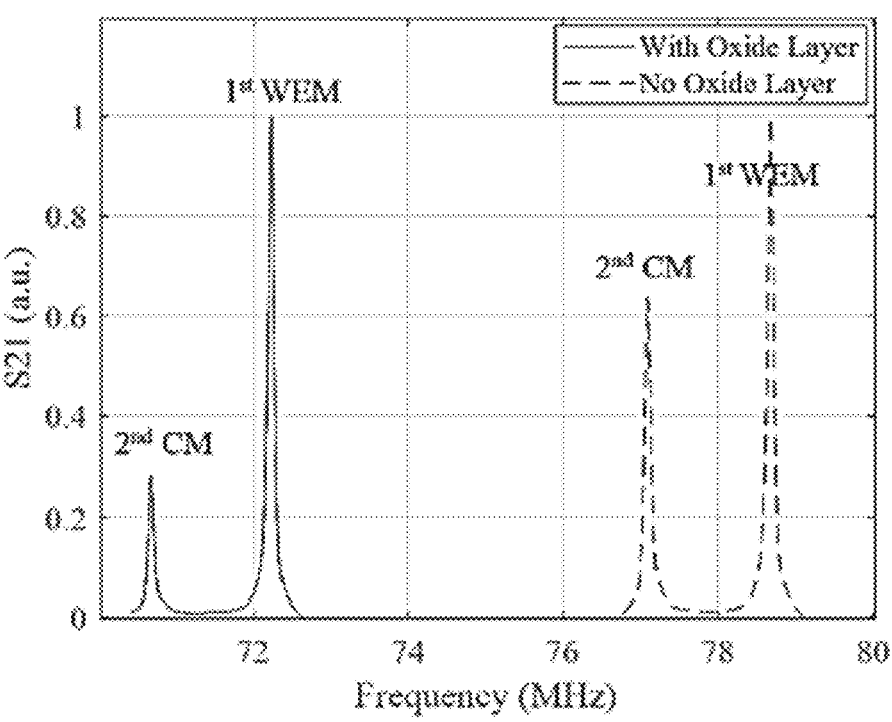
FIGS. 30A and 30B graphically illustrate harmonic response results obtained from Ansys Mechanical for the second CM and first WEM vibrations and the high overtone TM vibrations, respectively.
Figure 30B:
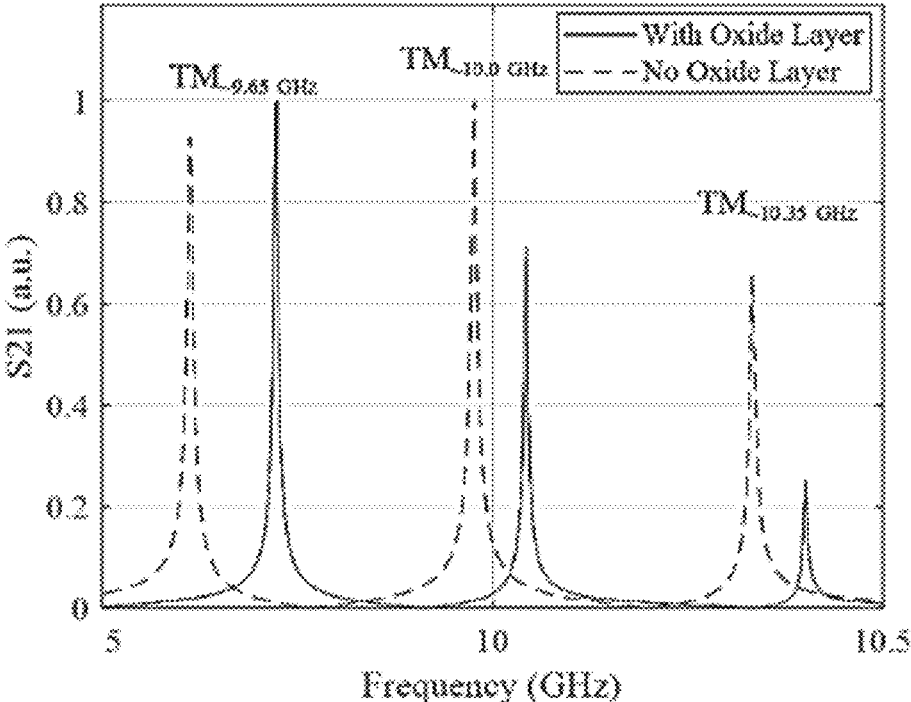

WEM are graphically illustrated in FIG. 30A while the three high overtone TM vibrations operating in the SHF spectrum are graphically illustrated in FIG. 30B.

Figure 31:
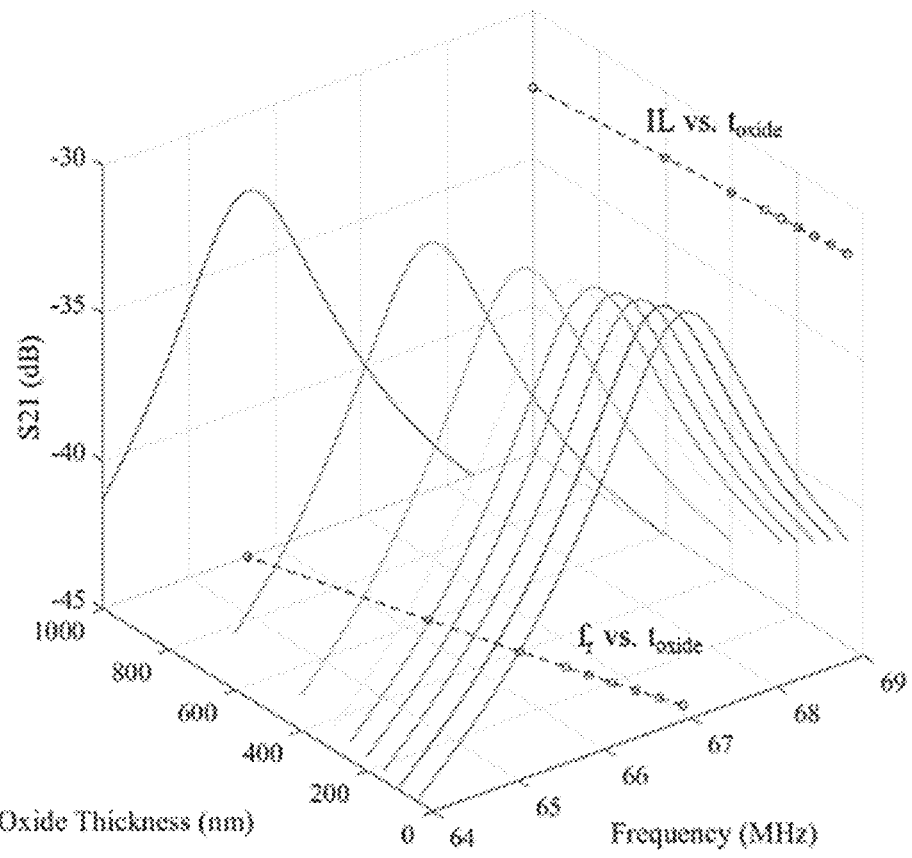
FIG. 31 graphically illustrates the results of a FEA parametric study of the harmonic response as a function of oxide layer thickness, showing an $f_r$ and IL linear decrease with increasing oxide layer thickness.

Referring now to FIG. 31, the effects of thickness of the second dielectric layer may be determined using FEA mechanical simulation. In the case of the AlN-on-SiO$_2$ BAW resonator operating in the width extensional mode, $f_r$ and $I_L$ decreased linearly with increasing oxide layer thickness. The parametric study was performed using ANSYS Mechanical and did not include dielectric or piezoelectric loss effects.

Example 4

Two-port scattering parameters (S-parameters) of the resonators operating in the different modes were measured using a system similar to the one illustrated in FIG. 5, i.e., under vacuum using a Lake Shore cryogenic probe station. An Agilent/Keysight N5222A PMA microwave network analyzer was used to record the S-parameters. The two-port S-parameters were recorded in 10° C. increments from −200° C. to +200° C. at 1.0 (±0.3) μTorr. The network analyzer RF input power was 0 dBm. Two-port short-open-load-through calibration was accomplished to correct line and probe errors. Three randomly selected AlN-on-SiO$_2$ resonators and three AlN-on-Si resonators were measured to capture variance.

S-parameter data was post-processed to measure $f_r$, Q, motional resistance (R$_m$), and one port effective electromechanical factor $$\left(k_{eff}^2\right).$$

Q was measured using:

$$Q = \frac{f_r}{BW_{3dB}} \qquad \text{Equation 17}$$

where BW$_{3\ dB}$ is the bandwidth at 3 dB less than the peak. Rm and done port $$k_{eff}^2$$

were calculated using Equation 18, below, while was calculated using Equation 8.

$$R_m = 2Z_0\left(10^{\frac{IL}{20}} - 1\right) \qquad \text{Equation 18}$$

where Z$_0$ is the termination impedance and IL is the insertion loss at the resonance frequency. The TCF was calculated using:

$$TCF = \frac{1}{f_4}\frac{\partial f_r}{\partial T} \qquad \text{Equation 19}$$

where T is temperature, and the units of TCF are presented as ppm° C.$^{-1}$.

Figure 32A:
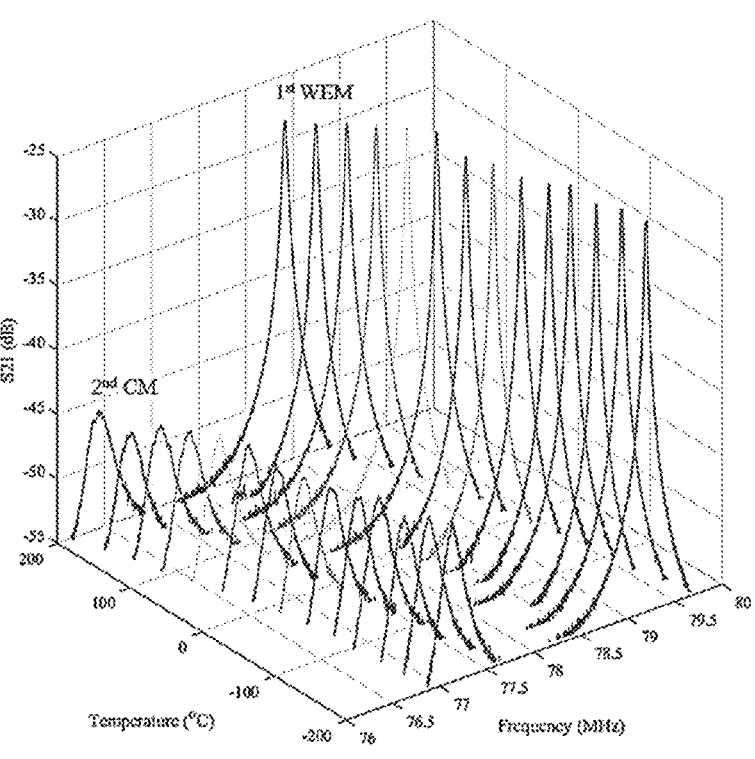
FIGS. 32A and 32B graphically illustrate measured VHF frequency response for the resonators of FIGS. 7A and 8A, respectively.
Figure 32B:
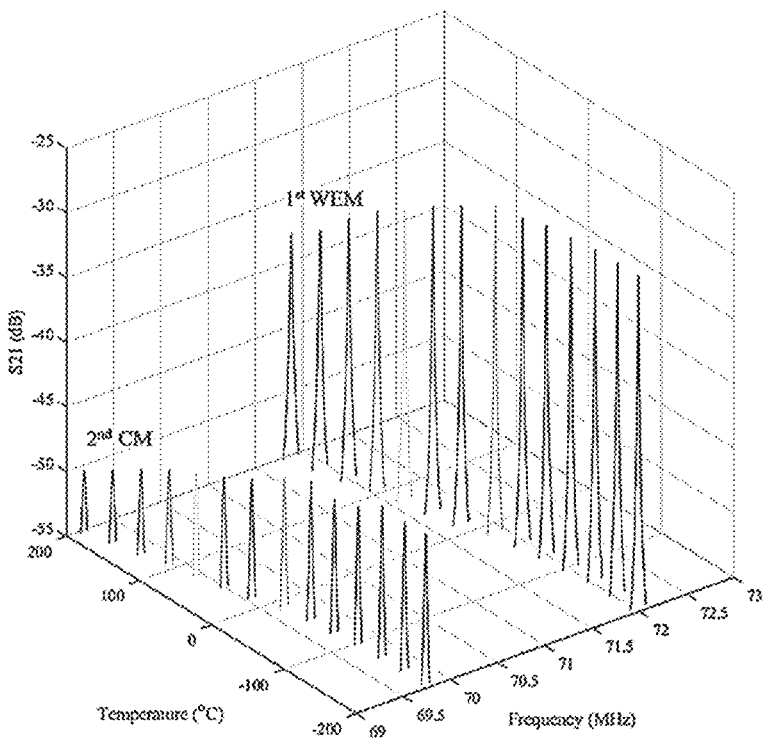
Figure 33A:
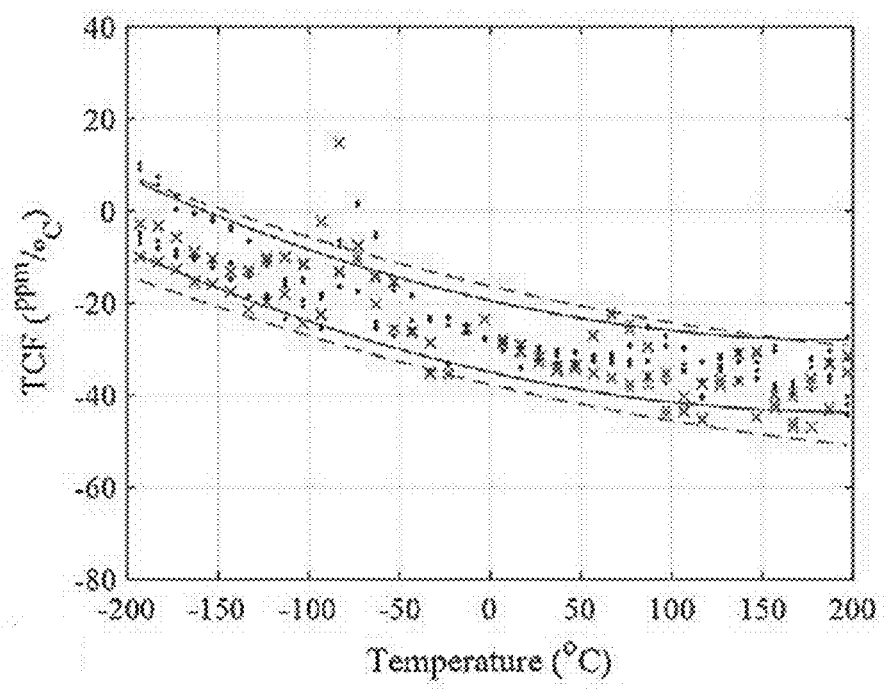
FIGS. 33A-33D graphically illustrate the TCF, Rm, Q, and $$k_{eff}^2,$$
Figure 33B:
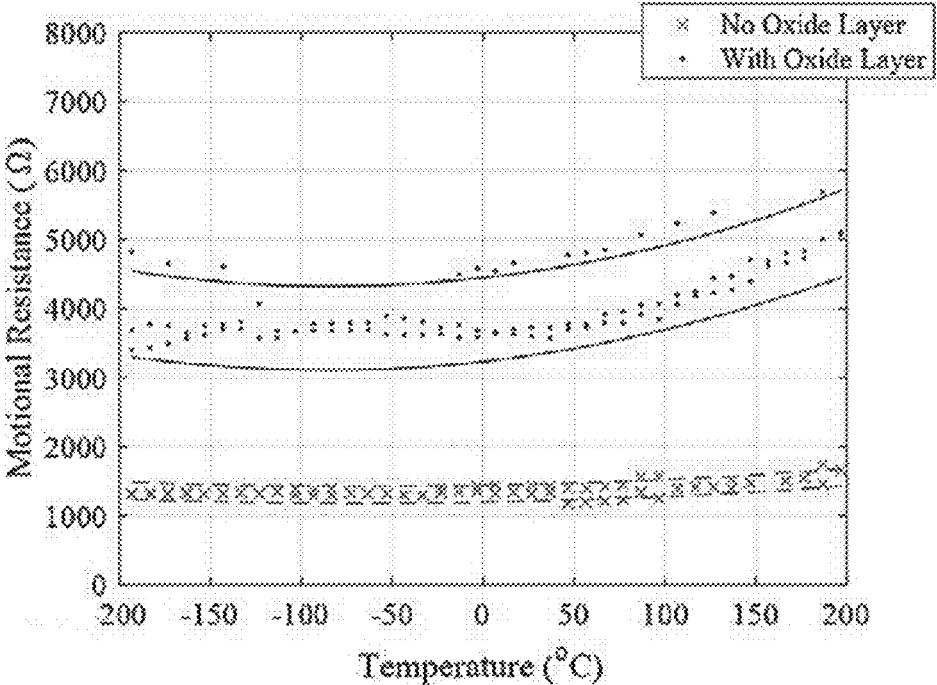
Figure 33C:
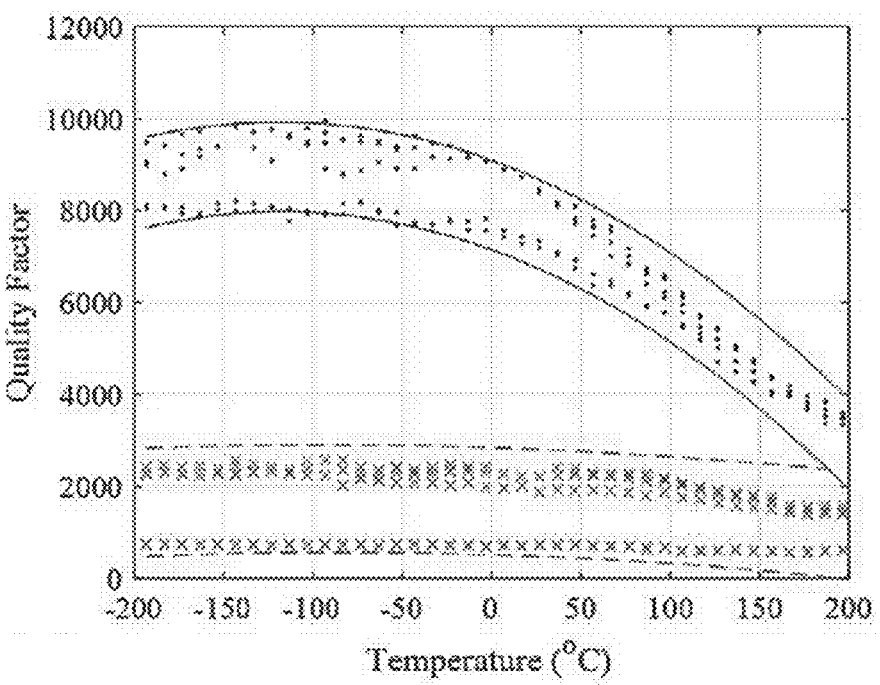
Figure 33D:
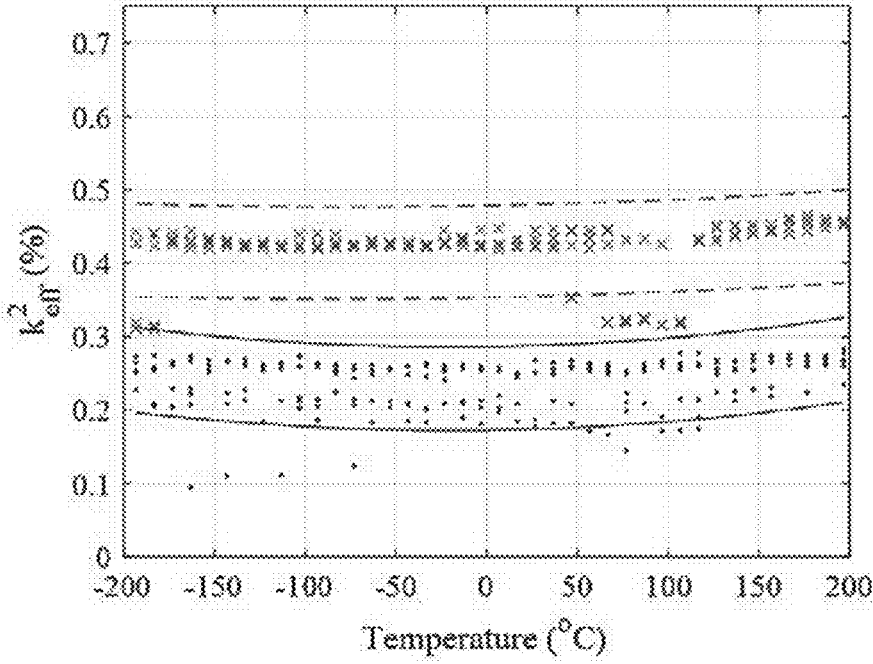
Figure 34A:
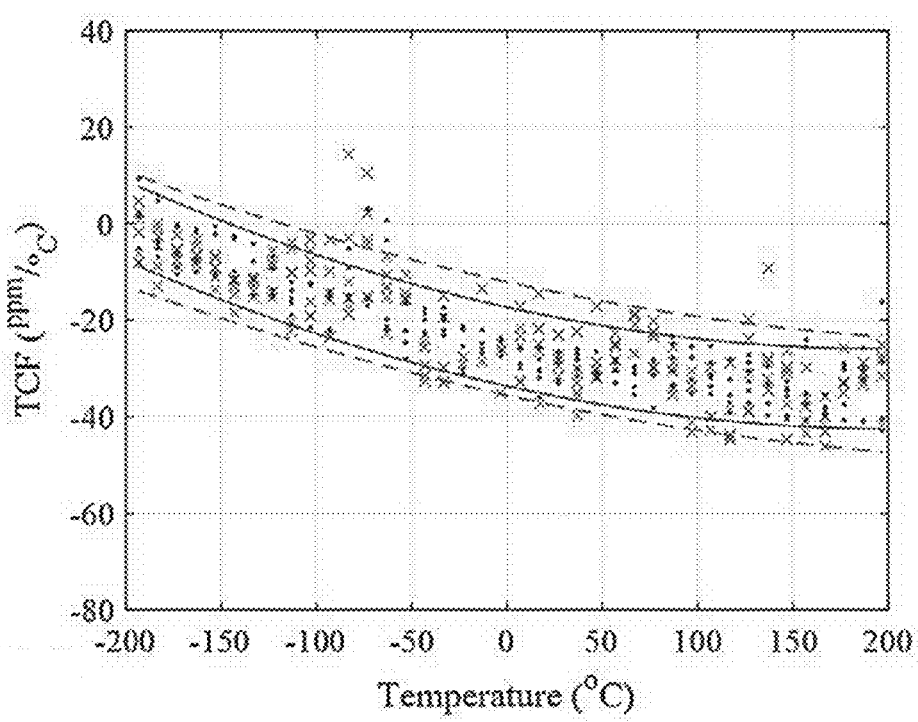
Figure 34B:
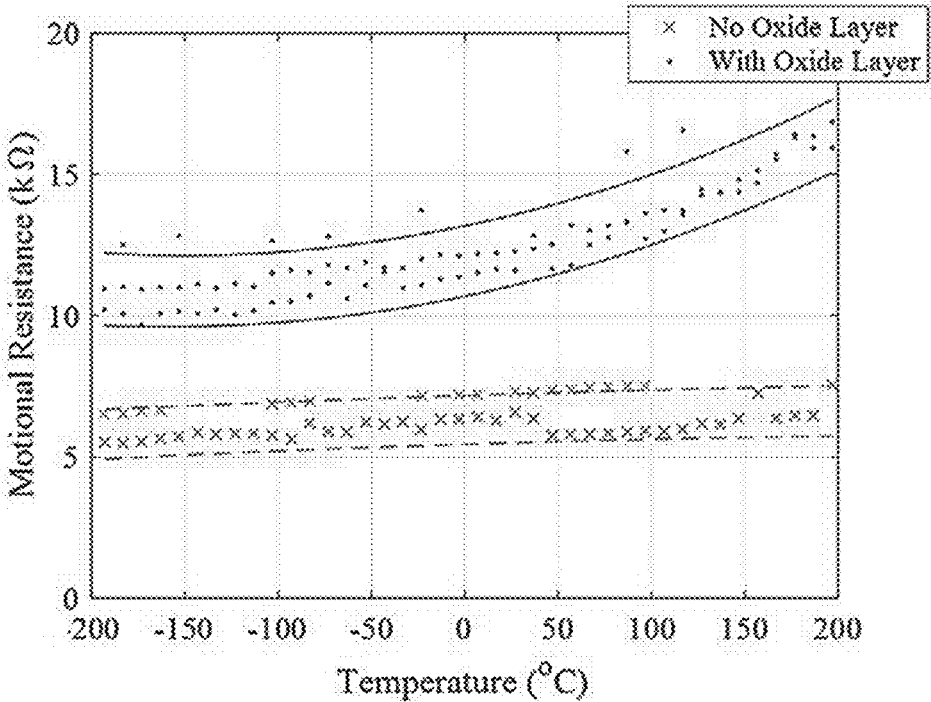
Figure 34C:
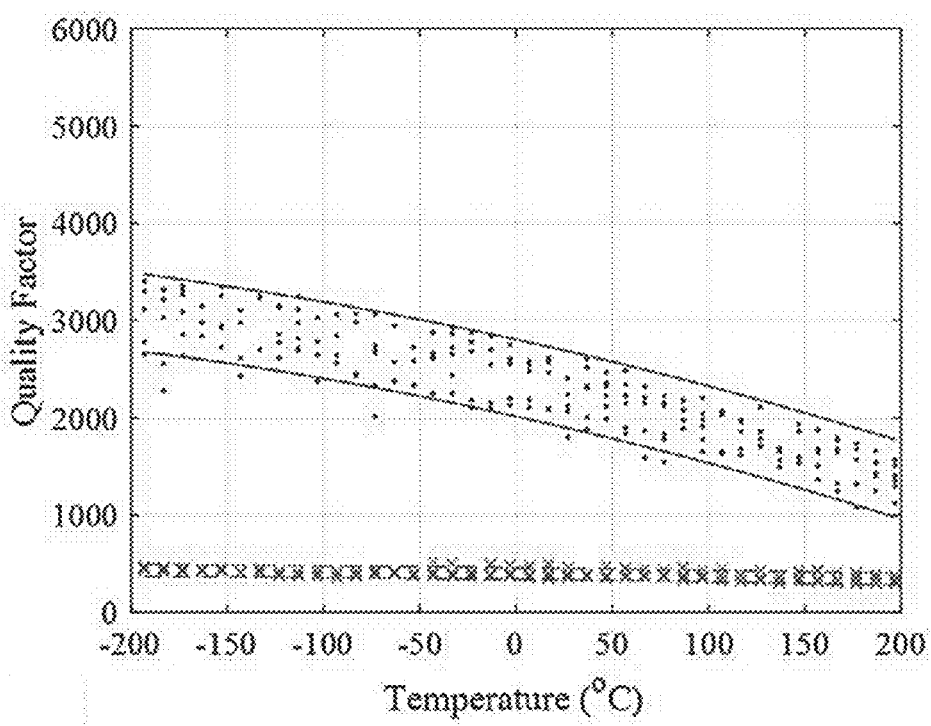
Figure 34D:
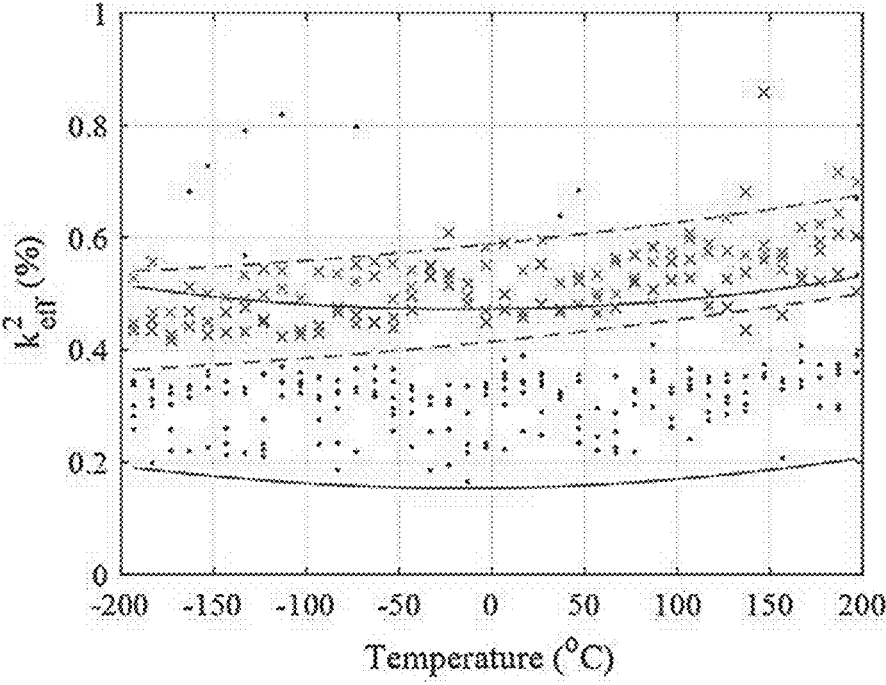

S-parameters were then experimentally measured for VHF resonant modes of the rectangular flat plate from −200° C. to +200° C. at 1.0 (±0.3) µTorr. Mode shapes and resonant frequencies were predicted using FEA harmonic analysis. The FEA harmonic analysis of the VHF regime is presented in FIGS. 30A and 30B. Extensional and contour modes are dominant in the VHF regime. Illustrations of the second CM and first WEM are provided in FIGS. 25A-26C. As a general trend, $R_m$ for the first WEM was greater than that of the second CM. In both modes $f_r$ and Q decrease and $R_m$ increases as temperature increases. Q values of the resonator with the oxide layer are consistently greater than those of the device without the oxide layer, even at high temperatures. An example of the enhanced Q, the shift in frequency, and peak broadening with increasing temperature are clearly illustrated in FIGS. 32A and 32B.

The TCF, $R_m$, Q, and one port $$k_{eff}^2$$

for the first WEM vibrations from −200° C. to +200° C. are presented in FIGS. 33A-33D, respectively. TCF at room temperatures are −29.8±1.0 ppm° $C.^{-1}$ for the baseline resonator (no $SiO_2$ layer) and −31.2±2.0 ppm° $C.^{-1}$ for the resonator with the $SiO_2$ layer. TCF was not significantly different between the two designs across all evaluated temperatures. The $SiO_2$ layer increases $R_m$ by ≈2.3 kΩ and decreases $$k_{eff}^2$$

by 0.2% at room temperature; however, adding the oxide layer increases Q by up to 7000 points in some cases. At room temperature, Q for the baseline resonator is 1410±810 and 8040±800 for the resonator with the $SiO_2$ layer. The addition of the oxide layer increased Q by 5.7 times. Statistical analysis shows the difference in Q is significant within a 90% confidence interval (α=0.1) up to +180° C. Quality factors over 10,000 are achieved at cryogenic temperatures.

Results for the second CM are presented in FIGS. 34A-34D. Baseline TCF at room temperature is −26.4±1.2 ppm° $C.^{-1}$ and −28.4±1.4 ppm° $C.^{-1}$ for the device with the oxide layer. Overall, there are no significant differences in TCF behavior. Similar to the first WEM vibration, $R_m$ is roughly doubled by adding the $SiO_2$ layer. The effective electromechanical coupling of the device with the $SiO_2$ layer is consistently below the baseline device, but the difference does not exceed the 90% confidence interval threshold of statistical significance. At room temperature, baseline Q is 412±61. Adding the oxide layer increases Q to 2400±250, 5.8 times greater than baseline. Statistical analysis demonstrates the Q enhancement is significant within a 90% confidence interval across the entire evaluated temperature range.

S-parameters were experimentally measured for SHF resonant modes of the rectangular flat plate from −200° C. to +200° C. at 1.0 (±0.3) µTorr. Mode shape and resonant frequencies were predicted using FEA harmonic analysis. The FEA harmonic analysis of the SHF regime is presented in FIG. 30B. In the SHF regime, the higher-order CM and WEM vibrational modes have completely decayed, and the resonance is dominated by TM vibrations. The measured high overtone TM vibrations were between 9.5 GHz to 10.5 GHz. Illustrations of the high overtone TM shapes are provided in FIG. 29. As a general trend, $f_r$ and Q decreased with increasing temperature. Unlike the VHF vibrational modes, $R_m$ decreases with increasing temperature in the SHF thickness mode vibrational regime; however, the noise floor also increased because the RF signal at SHF easily leaks via the feedthrough capacitance, causing the entire noise floor to go up. Some Q enhancement is still present, although less apparent from a qualitative perspective than the VHF vibrational modes. Notably, a high frequency "ringing" was present in this frequency range across all measured devices. The ringing was more prevalent at lower temperatures. The magnitude of the ringing is much smaller for the resonator with the $SiO_2$ layer than the device without the oxide layer. A deeper study into the reduction of the ringing in the device with an oxide layer is beyond the scope of this paper; however, it merits further investigation. The frequency shift and spurious mode damping are clearly illustrated in the example presented in FIGS. 35A and 35B.

TCF, $R_m$, Q, and one port $$k_{eff}^2$$

were measured for the high overtone TM vibrations from −200° C. to +200° C. and 1 µTorr. These correspond to about 9.65 GHz, 10.0 GHz, and 10.35 GHz resonant frequencies, respectively. Measured values for TCF, $R_m$, Q, and $$k_{eff}^2$$

at are presented in FIGS. 36A-38D for the 9.65 GHz, 10.0 GHz, and 10.35 GHz vibrations, respectively. Across all three modes, the average TCF at room temperature was −34.0±3.1 ppm° $C.^{-1}$ for the baseline device and −37.9 ppm° $C.^{-1}$±4.4 for the device with the added $SiO_2$ layer. Similar to the first WEM and second CM vibrations, the addition of the oxide layer increased $R_m$, with the average baseline at 5.2±0.1 kΩ and average $R_m$ for the device with the oxide layer at 7.3±0.1 kΩ at room temperature. At low temperatures, some Q enhancement was observed. Devices with an oxide layer exhibited Q as high as 700 at temperatures less than −100° C. At similar temperatures, the highest demonstrated Q for devices without the oxide layer was 350.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A method of enhancing an electromechanical coupling coefficient of a microelectromechanical ("MEMS") device, the method comprising:

applying heavy particle ion radiation to the MEMS device at a fluence of at least $1×10^{14}$ $cm^{-2}$ which can cause an increase in $k^2_e$ff of at least 5%.

2. The method of claim 1, wherein the fluence is less than $5{\times}10^{14}$ cm$^{-2}$.

3. The method of claim 1, wherein the heavy particle ion radiation includes silicon ions, argon ions, helium ions, carbon ions, and neon ions.

4. The method of claim 3, wherein an energy of the silicon ions is 2 MeV.

5. The method of claim 1, wherein the MEMS device includes a substrate, a transduction layer on the substrate, a conductive layer on the transduction layer, and, optionally, a semiconductor layer between the substrate and the transduction layer.

6. The method of claim 5, wherein at least 50% of dislocations created by the applied heavy particle ion radiation are located in the transduction layer of the MEMS device.

7. The method of claim 6, wherein the dislocations are electron-hole pairs.

8. A bandpass filter comprising:
   a plurality of MEMS devices fabricated in accordance with the method of claim 1, wherein the MEMS of the plurality are electronically or mechanically coupled.

9. The bandpass filter of claim 8, wherein the plurality of MEMS devices includes a first MEMS device in series with a second MEMS device.

10. The bandpass filter of claim 9, further comprising:
   a third MEMS device operably coupled to the first and second MEMS devices as a shunt resonator.

11. The bandpass filter of claim 10, further comprising:
   a substrate bias electrode.

\* \* \* \* \*